United States Patent
Yamazaki et al.

(10) Patent No.: US 7,141,821 B1
(45) Date of Patent: Nov. 28, 2006

(54) SEMICONDUCTOR DEVICE HAVING AN IMPURITY GRADIENT IN THE IMPURITY REGIONS AND METHOD OF MANUFACTURE

(75) Inventors: Shunpei Yamazaki, Tokyo (JP); Hisashi Ohtani, Kanagawa (JP); Toshiji Hamatani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/436,984

(22) Filed: Nov. 9, 1999

(30) Foreign Application Priority Data

Nov. 10, 1998 (JP) ............................................. 10-319671
Nov. 10, 1998 (JP) ............................................. 10-336562

(51) Int. Cl.
*H01L 27/108* (2006.01)
*H01L 23/48* (2006.01)

(52) U.S. Cl. ....................... 257/69; 257/351; 257/390; 257/776

(58) Field of Classification Search ................ 438/199, 438/238, 154; 257/50, 69, 204, 347, 351, 257/776, 773, 401, 390
See application file for complete search history.

(56) References Cited

U.S. PATENT DOCUMENTS

| 3,933,529 A | | 1/1976 | Goser |
| 4,357,557 A | | 11/1982 | Inohara et al. |
| 4,658,496 A | | 4/1987 | Beinvogl et al. |
| 4,753,896 A | * | 6/1988 | Matloubian ................. 438/149 |
| 5,028,564 A | * | 7/1991 | Chang et al. ............... 438/412 |

(Continued)

FOREIGN PATENT DOCUMENTS

| JP | 03-25632 | 11/1991 |
| JP | 04-369271 | 12/1992 |
| JP | 05-102483 | 4/1993 |
| JP | 7-130652 | 5/1995 |
| JP | 8-78329 | 3/1996 |
| JP | 09-116167 | 5/1997 |
| JP | 10-092576 | 4/1998 |
| JP | 10-135468 | 5/1998 |
| JP | 10-135469 | 5/1998 |
| JP | 10-247735 | 9/1998 |
| JP | 10-270363 | 10/1998 |
| JP | 10-294280 | 11/1998 |
| JP | 11-191628 | 7/1999 |
| JP | 11-345767 | 12/1999 |
| JP | 11-354442 | 12/1999 |
| WO | WO 90/13148 | 11/1990 |

OTHER PUBLICATIONS

Ryuichi Shimokawa et al., Characterization of High–Efficiency Cast–Si Solar Cell Wafers by MBIC Measurement, Japanese Journal of Applied Physics, vol. 27, No. 5, May, 1988, pp. 751–758.

Mutsuko Hatano et al., A Novel Self–Aligned Gate–Overlapped LDD Poly–Si TFT with High Reliability and Performance, IEDM Technical Digest, 1997, pp. 523–526.

(Continued)

*Primary Examiner*—W. David Coleman
(74) *Attorney, Agent, or Firm*—Nixon Peabody LLP; Jeffery L. Costellia

(57) ABSTRACT

The active layer of an n-channel TFT is formed with a channel forming region, a first impurity region, a second impurity region and a third impurity region. In this case, the concentration of the impurities in each of the impurity regions is made higher as the region is remote from the channel forming region. Further, the first impurity region is disposed so as to overlap a side wall, and the side wall is caused to function as an electrode to thereby attain a substantial gate overlap structure. By adopting the structure, a semiconductor device of high reliability can be manufactured.

63 Claims, 30 Drawing Sheets

U.S. PATENT DOCUMENTS

| | | | |
|---|---|---|---|
| 5,072,263 A | | 12/1991 | Watanabe et al. |
| 5,107,175 A | | 4/1992 | Hirano et al. |
| 5,124,204 A | | 6/1992 | Yamashita et al. |
| 5,189,405 A | | 2/1993 | Yamashita et al. |
| 5,247,190 A | | 9/1993 | Friend et al. |
| 5,254,490 A | | 10/1993 | Kondo |
| 5,323,042 A | | 6/1994 | Matsumoto |
| 5,358,879 A | | 10/1994 | Brady et al. |
| 5,399,502 A | | 3/1995 | Friend et al. |
| 5,401,982 A | | 3/1995 | King et al. |
| 5,405,791 A | | 4/1995 | Ahmad et al. |
| 5,412,493 A | | 5/1995 | Kunii et al. |
| 5,518,940 A | * | 5/1996 | Hodate et al. ............... 204/485 |
| 5,576,556 A | | 11/1996 | Takemura et al. |
| 5,593,907 A | | 1/1997 | Anjum et al. |
| 5,594,569 A | | 1/1997 | Konuma et al. |
| 5,612,234 A | | 3/1997 | Ha |
| 5,620,905 A | | 4/1997 | Konuma et al. |
| 5,643,826 A | | 7/1997 | Ohtani et al. |
| 5,686,360 A | | 11/1997 | Harvey, III et al. |
| 5,693,956 A | | 12/1997 | Shi et al. |
| 5,693,959 A | | 12/1997 | Inoue et al. |
| 5,710,606 A | | 1/1998 | Nakajima et al. |
| 5,719,065 A | | 2/1998 | Takemura et al. |
| 5,719,588 A | | 2/1998 | Johnson |
| 5,736,414 A | | 4/1998 | Yamaguchi |
| 5,757,126 A | | 5/1998 | Harvey, III et al. |
| 5,771,562 A | | 6/1998 | Harvey, III et al. |
| 5,786,620 A | | 7/1998 | Richards, Jr. et al. |
| 5,789,762 A | | 8/1998 | Koyama et al. |
| 5,801,416 A | | 9/1998 | Choi et al. |
| 5,811,177 A | | 9/1998 | Shi et al. |
| 5,821,688 A | * | 10/1998 | Shanks et al. ............... 257/347 |
| 5,827,747 A | | 10/1998 | Wang et al. |
| 5,869,929 A | | 2/1999 | Eida et al. |
| 5,912,492 A | | 6/1999 | Chang et al. |
| 5,914,498 A | | 6/1999 | Suzawa et al. |
| 5,923,962 A | | 7/1999 | Ohtani et al. |
| 5,926,735 A | | 7/1999 | Yamazaki et al. |
| 5,929,483 A | | 7/1999 | Kim et al. |
| 5,952,778 A | | 9/1999 | Haskal et al. |
| 5,956,588 A | | 9/1999 | Choi et al. |
| 5,959,313 A | | 9/1999 | Yamazaki et al. |
| 5,962,962 A | | 10/1999 | Fujita et al. |
| 5,965,919 A | | 10/1999 | Yoo |
| 5,990,542 A | | 11/1999 | Yamazaki |
| 6,008,869 A | | 12/1999 | Oana et al. |
| 6,078,060 A | * | 6/2000 | Shibuya et al. ............... 257/66 |
| 6,114,183 A | | 9/2000 | Hamada et al. |
| 6,114,715 A | | 9/2000 | Hamada |
| 6,140,667 A | | 10/2000 | Yamazaki et al. |
| 6,146,225 A | | 11/2000 | Sheats et al. |
| 6,150,187 A | | 11/2000 | Zyung et al. |
| 6,165,824 A | | 12/2000 | Takano et al. |
| 6,166,396 A | | 12/2000 | Yamazaki |
| 6,166,414 A | | 12/2000 | Miyazaki et al. |
| 6,180,957 B1 | | 1/2001 | Miyasaka et al. |
| 6,198,133 B1 | * | 3/2001 | Yamazaki et al. .......... 257/347 |
| 6,198,217 B1 | | 3/2001 | Suzuki et al. |
| 6,198,220 B1 | | 3/2001 | Jones et al. |
| 6,200,836 B1 | | 3/2001 | Yoo |
| 6,207,519 B1 | | 3/2001 | Kim et al. |
| 6,215,155 B1 | * | 4/2001 | Wollesen .................... 257/351 |
| 6,239,470 B1 | | 5/2001 | Yamazaki |
| 6,268,071 B1 | | 7/2001 | Yasukawa et al. |
| 6,274,887 B1 | * | 8/2001 | Yamazaki et al. ............ 257/75 |
| 6,280,559 B1 | | 8/2001 | Terada et al. |
| 6,281,552 B1 | | 8/2001 | Kawasaki et al. |
| 6,285,042 B1 | | 9/2001 | Ohtani et al. |
| 6,288,413 B1 | * | 9/2001 | Kamiura et al. .............. 257/66 |
| 6,330,044 B1 | | 12/2001 | Murade |
| 6,335,541 B1 | | 1/2002 | Ohtani et al. |
| 6,348,368 B1 | | 2/2002 | Yamazaki et al. |
| 6,348,382 B1 | | 2/2002 | Su et al. |
| 6,365,917 B1 | | 4/2002 | Yamazaki |
| 6,365,933 B1 | | 4/2002 | Yamazaki et al. |
| 6,380,558 B1 | | 4/2002 | Yamazaki et al. |
| 6,413,645 B1 | | 7/2002 | Graff et al. |
| 6,420,200 B1 | | 7/2002 | Yamazaki et al. |
| 6,432,561 B1 | | 8/2002 | Yamazaki |
| 6,433,487 B1 | | 8/2002 | Yamazaki |
| 6,440,877 B1 | | 8/2002 | Yamazaki et al. |
| 6,441,468 B1 | | 8/2002 | Yamazaki |
| 6,447,867 B1 | | 9/2002 | Kominami et al. |
| 6,469,317 B1 | | 10/2002 | Yamazaki et al. |
| 6,501,098 B1 | | 12/2002 | Yamazaki |
| 6,524,895 B1 | | 2/2003 | Yamazaki et al. |
| 6,555,969 B1 | | 4/2003 | Yamazaki |
| 6,590,230 B1 | | 7/2003 | Yamazaki et al. |
| 6,605,826 B1 | | 8/2003 | Yamazaki et al. |
| 6,617,644 B1 | | 9/2003 | Yamazaki et al. |
| 6,645,826 B1 | | 11/2003 | Yamazaki et al. |
| 6,784,037 B1 | | 8/2004 | Yamazaki et al. |
| 2002/0125817 A1 | | 9/2002 | Yamazaki et al. |
| 2003/0138985 A1 | | 7/2003 | Rhodes |

OTHER PUBLICATIONS

Hermann Schenk et al., "Polymers for Light Emitting Diodes", Euro–Dispaly 1999 Proceedings, pp. 33–37.
U.S. appl. No. 09/924,846, filed date Aug. 9, 2001.
U.S. appl. No. 09/432,662, filed date Nov. 3, 1999.
U.S. appl. No. 09/435,154, filed date Nov. 8, 1999.
Yoshida et al., 33.2: A Full–Color Thresholdes Antiferroelectric LCD Exhibiting Wide Viewing Angle with Fast Response Time, SID 97 DIGEST: SID International Symposium Digest of Technical Papers, Jan. 1, 1997, pp. 841–844.
H. Furue et al., P–78: Characteristics and Driving Scheme of Polymer–Stabilized Monostable FLCD Exhibiting Fast Response Time and High Contrast Ratio with Gray–Scale Capability, SID International Symposium Digest of Technical Papers, Jan. 1, 1998, pp. 782–785.
Inui et al., Thresholdless Antiferroelectricity In Liquid Crystals and Its Application to Displays, Journal of Materials Chemistry, Jan. 1, 1996, pp. 671–673, vol. 6, No. 4.
Ekisho, Time Divided Full Color LCD by Ferroelectri Liquid Crystal, Jul. 25, 1999, pp. 190–194, vol. 3, No. 3.
Terada et al., Half–V Switching Mode FLCD, Proceedings of the 46th Applied Physics Association Lectures, Mar. 1, 1999, p. 1316, vol. 28p–V–8.
Webster's II New Riverside University Dictionary, p. 839.

* cited by examiner pixel TFT portion | capacitance portion pixel TFT portion | capacitance portion pixel TFT portion | capacitance portion

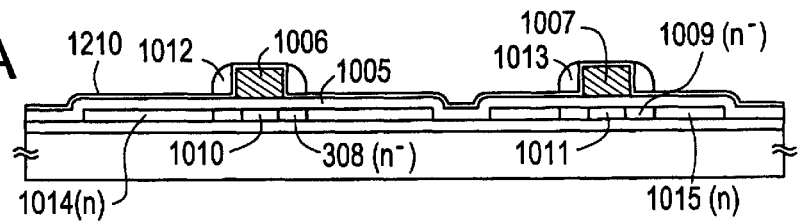
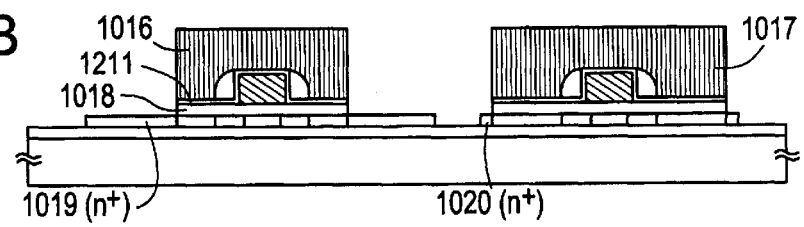
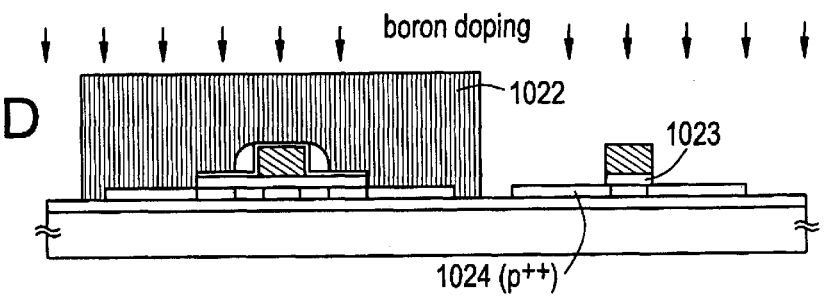
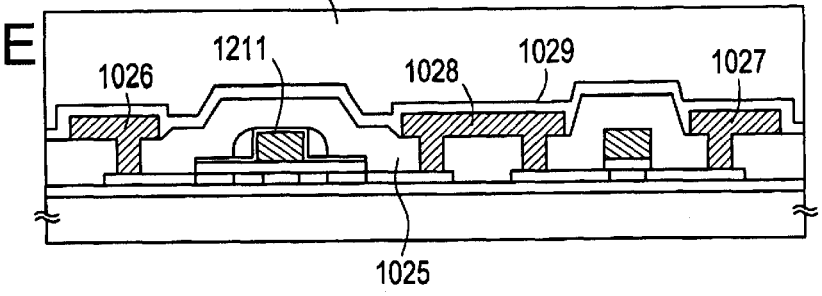

pixel TFT portion | capacitance portion pixel TFT portion | capacitance portion 3201  3202

SEMICONDUCTOR DEVICE HAVING AN IMPURITY GRADIENT IN THE IMPURITY REGIONS AND METHOD OF MANUFACTURE

BACKGROUND OF THE INVENTION

1. Field of the Invention

The present invention concerns a semiconductor device having a circuit constituted with thin film transistors (hereinafter referred to as a TFT). It relates to a constitution of an electro-optic device typically represented by a liquid crystal display panel, and an electronic equipment having such an electro-optic device mounted as a part thereon. The semiconductor device used in the present specification generally means all devices that can operate by utilizing semiconductor characteristics, and electro-optical devices, semiconductor circuits and electronic equipments are also included in the semiconductor device.

2. Description of the Related Art

In recent years, an active matrix type liquid crystal display device having circuits constituted with TFTs utilizing polysilicon films has been noted. In the device, electric fields applied to liquid crystals are controlled in a matrix form by a plurality of pixels disposed in a matrix to attain highly fine image display.

The active matrix type liquid crystal display device described above has pixels by the number of 1,000,000 or more as the resolution becomes higher as an XGA and an SXGA. Then, driver circuits for driving all of them is extremely complicated and formed with many TFTs.

Since the specification required for the actual liquid crystal display device (also referred to as liquid crystal panel) is stringent and it is necessary to ensure high reliability both for pixels and drivers in order to operate all the pixels normally. Particularly, if abnormality should occur in the driver circuit, a failure referred to as a line defect in which all pixels in one row (or in one column) are put to disorder.

By the way, it is considered that a TFT utilizing a polysilicon film has not yet been comparable with an MOSFET (transistor formed on a single crystal semiconductor substrate) used for LSIs in view of the reliability, and it has become considered that an LSI circuit can not be formed easily with TFTs unless the drawback point described above can be overcome.

The present applicant considers that the MOSFET has three advantageous features in view of the reliability and assumes the reason as below. FIG. 2A is a schematic view of an MOSFET, in which are shown a drain region 201 formed on a single crystal silicon substrate, an LDD (Lightly Doped Drain) region 202, a field insulation film 203 and a gate insulation film 205 just below a gate wiring 204.

This constitution provides three advantageous features in view of the reliability. The first advantageous feature is presence of a gradient in the impurity concentration from the LDD region 202 to the drain region 201. As shown in FIG. 2B, the impurity concentration increases gradually from the LDD region 202 to the drain region 201 in the existent MOSFET. It is considered that the gradient has an effect of improving the reliability.

The second advantageous feature is that the LDD region 202 and the gate wiring 204 overlap with each other. As the structure, a GOLD (gate-drain overlapped LDD) or an LATID (large-tilt-angle implanted drain) is known. This constitution can decrease the impurity concentration in the LDD region 202 and an electric field moderating effect is increased to improve the hot carrier resistance.

The third advantageous feature is that there is a certain distance between the LDD region 202 and the gate wiring 204. This is because the field insulation film 203 is formed in a state creeping just below the gate wiring. That is, since the thickness of the gate insulation film is increased only in the overlapped portion, an effective electric field moderation can be expected.

As described above, the existent MOSFET has several advantageous features over the TFT and, as a result, has high reliability.

Furthermore, it has also been attempted to apply the advantage of the MOSFET described above to the TFT. For example, the GOLD structure is attained by using a side wall formed with silicon in "M. Hatano, H. Akimoto, and T. Sakai, IEDM 97 TECHNICAL DIGEST, pp. 523–526, 1997".

However, the structure disclosed in this article has a problem that an off current (current flowing in an off state of a TFT) increases compared with the usual LDD structure, which necessitates a countermeasure therefor.

As described above, the present applicant considers that structural problems in the TFT give an undesired effect on the reliability (particularly, the hot carrier resistance) when comparing the TFT with the MOSFET.

SUMMARY OF THE INVENTION

This invention concerns a technique for overcoming such problems and it is an object of the invention to provide a TFT having a reliability equal with or superior to that of an MOSFET.

It is another object of this invention to realize a highly reliable semiconductor device having a semiconductor circuit which is constituted with such TFTs.

The invention disclosed in this specification provides a semiconductor device having a CMOS circuit comprising an NTFT and a PTFT each having an active layer, an insulation film in contact with the active layer and a wiring in contact with the insulation film, wherein only the NTFT has a side wall on a side of the wiring, the active layer of the NTFT includes a channel forming region and at least three kinds of impurity regions each containing an element belonging to the group 15 at a different concentration, the impurity region in contact with the channel forming region among the three kinds of impurity regions overlaps by way of the insulation film with the side wall, the active layer of the PTFT includes a channel forming region and two kinds of impurity regions each containing an element belonging to the group 13 at an identical concentration, and a catalyst element used for crystallization of the active layer of the NTFT and the active layer of the PTFT is present at the concentration of $1\times10^{17}$ to $1\times10^{20}$ atoms/$cm^3$ in the impurity region most remote from the channel forming region of the NTFT and in the impurity region most remote from the channel forming region of the PTFT.

Another invention provides a semiconductor device having a CMOS circuit comprising an NTFT and a PTFT each having an active layer, an insulation film in contact with the active layer and a wiring in contact with the insulation film, wherein only the NTFT has a side wall on a side of the wiring, the
active layer of the NTFT has a structure in which a
channel forming region, a first impurity region, a
second impurity region and a third impurity region are
arranged in this order, each of the first impurity region, the second impurity
region and the third impurity region contains an element belonging to the group 15 at a different
concentration, the first impurity region overlaps by way of the insulation
film with the side wall, the active layer of the PTFT has a structure in which a
channel forming region, a fourth impurity region and a
fifth impurity region are arranged in this order, each of the fourth impurity region and the fifth impurity
region contains an element belonging to the group 13 at
an identical concentration and a catalyst element used for crystallization of the active
layer of the NTFT and the active layer of the PTFT is
present at a concentration of from $1\times10^{17}$ to $1\times10^{20}$
atoms/cm$^3$ in the third impurity region and the fifth
impurity region.

A further invention provides a semiconductor device
having a CMOS circuit comprising an NTFT and a PTFT
each having an active layer, an insulation film in contact
with the active layer and wirings in contact with the insulation film, wherein only the NTFT has a side wall on a side of the wiring, the active layer of the NTFT contains a channel forming
region and at least three kinds of impurity regions each
containing an element belonging to the group 15 at a
different concentration, the concentration of the element belonging to the group
15 is higher as the distance from the channel forming
region is greater in the three kinds of impurity regions, the active layer of the PTFT includes a channel forming
region and two kinds of impurity regions containing an
element belonging to the group 13 at an identical
concentration, and a catalyst element used for crystallization of the active
layer of the NTFT and the active layer of the PTFT is
present at a concentration of $1\times10^{17}$ to $1\times10^{20}$ atoms/
cm$^3$ in the impurity region most remote from the
channel forming region of the NTFT and in the impurity region most remote from the channel forming
region of the PTFT.

A further invention provides a semiconductor device
having a CMOS circuit a CMOS circuit comprising an
NTFT and a PTFT each having an active layer, an insulation
film in contact with the active layer and wirings in contact
with the insulation film, wherein only the NTFT has a side wall on a side of the wiring, the active layer of the NTFT has a structure in which a
channel forming region, a first impurity region, a
second impurity region and a third impurity region are
arranged in this order, each of the first impurity region, the second impurity
region and the third impurity region contains identical
impurities at a different concentration, the concentration of the impurities become higher in the
order of the first impurity region, the second impurity
region and the third impurity region, the active layer of the PTFT has a structure in which a
channel forming region, a fourth impurity region and a
fifth impurity region are arranged in this order, each of the fourth impurity region and the fifth impurity
region contains an element belonging to the group 13 at
an identical concentration, and a catalyst element used for crystallization of the active
layer of the NTFT and the active layer of the PTFT is
present at a concentration of $1\times10^{17}$ to $1\times10^{20}$ atoms/
cm$^3$ in the third impurity region and the fifth impurity
region.

The present invention has a prominent feature in the
structure of the active layer (particularly, in a case of an
n-channel. TFT) and, accordingly, has a feature also in the
manufacturing method thereof.

The invention relating to the manufacturing method for
practicing this invention comprises:

a first step of forming a semiconductor film containing
crystals on a substrate having an insulation surface by
using a catalyst element, a second step of patterning the semiconductor film containing the crystals thereby forming a first active layer
and a second active layer, a third step of forming an insulation film on the first active
layer and the second active layer, a fourth step of forming wirings over the first active layer
and the second active layer, a fifth step of adding an element belonging to the group
15 to the first active layer and the second active layer
using the wirings as a mask, a sixth step of forming a side wall on a side of at least one
of the wirings, a seventh step of adding an element belonging to the
group 15 to the first active layer and the second active
layer using the wirings and the side wall as a mask, an eighth step of forming a resist mask over the first active
layer and adding an element belonging to the group 13
to the second active layer, a ninth step of forming a resist mask over the first active
layer and the second active layer and adding an element
belonging to the group 15 to a portion of the first active
layer and a portion of the second active layer, a tenth step of forming a silicon nitride film, and an eleventh step of moving (gettering) the catalyst element to a portion of the first active layer and to a
portion of the second active layer by a heat treatment.

A further invention has a constitution comprising a first step of forming an active layer containing a catalyst
element for promoting the crystallization on a substrate
having an insulation surface, a second step of forming a first insulation film on the
active layer, a third step of forming a wiring on the first insulation film, a fourth step of adding an element belonging to the group
15 to the active layer using the wiring as a mask, a fifth step of forming a side wall on a side of the wiring, a sixth step of adding an element belonging to the group
15 to the active layer using the wiring and the side wall
as a mask, a seventh step of removing a portion of the first insulation
film thereby exposing a portion of the active layer
formed in the sixth step, an eighth step of adding an element belonging to the
group 15 to the active layer exposed in the seventh step, a ninth step of forming a second insulation film in contact
with an upper portion of the wiring, and a tenth step of applying a heat treatment for decreasing the concentration of the catalyst element in the active layer.

A further invention has a constitution comprising a first step of forming on a substrate having an insulation surface a first active layer and a second active layer containing a catalyst element for promoting crystallization, a second step of forming a first insulation film on the first active layer and the second active layer, a third step of forming wirings over the first active layer and the second active layer, a fourth step of adding an element belonging to the group 15 to the first active layer and the second active layer using the wirings as a mask, a fifth step of forming a side wall on a side of at least one of the wirings, a sixth step of adding an element belonging to the group 15 to the first active layer and the second active layer using the wirings and the side wall as a mask, a seventh step of selectively removing a portion of the first insulation film thereby exposing a portion of the first active layer and a portion of the second active layer formed in the sixth step, an eighth step of adding an element belonging to the group 15 to the first active layer and the second active layer exposed in the seventh step, a ninth step of forming a second insulation film in adjacent with an upper portion of the wirings, a tenth step of applying a heat treatment for decreasing the concentration of the catalyst element in the first active layer and the second active layer, an eleventh step of selectively removing the second insulation film thereby exposing a portion of the second active layer formed in the tenth step, a twelfth step of removing the portion of second active layer exposed in the eleventh step, a thirteenth step of selectively removing the insulation film thereby exposing a portion of the second active layer, and a fourteenth step of adding an element belonging to the group 13 to the second active layer exposed in the thirteenth step.

BRIEF DESCRIPTION OF THE DRAWINGS

FIGS. 22A to 22E are views showing steps of manufacturing a CMOS circuit;

PREFERRED EMBODIMENT OF THE INVENTION

Figure 1:
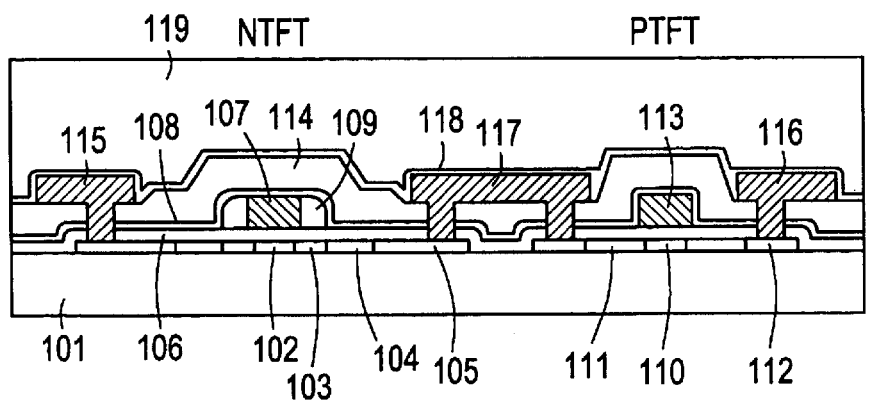
FIG. 1 is a view showing a cross section of a CMOS circuit.

The present invention is to be explained by way of a preferred embodiment with reference to FIG. 1.

Figure 11:
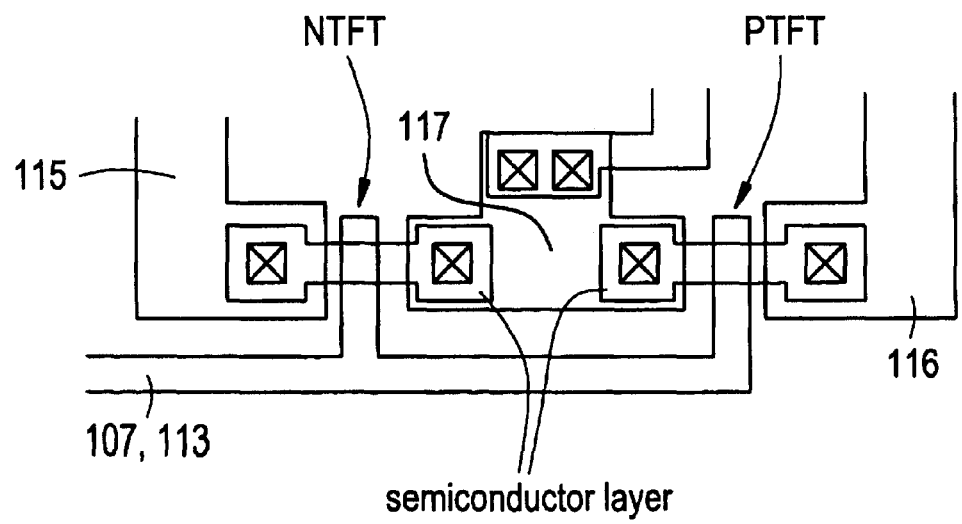
FIG. 11 is a top view showing the CMOS circuit.

FIG. 1 shows a cross sectional view and FIG. 11 shows a top view.

In FIG. 1, a substrate 101 has an insulation surface. The substrate usable herein can include, for example, a glass substrate provided with a silicon oxide film, a quartz substrate, a stainless steel substrate, a metal substrate, a ceramic substrate or a silicon substrate.

The feature of this invention resides in a constitution of an active layer in an n-channel TFT (hereinafter referred to as NTFT). The active layer of NTFT is formed including a channel forming region 102, a pair of first impurity regions 103, a pair of second impurity regions 104 and a pair of third impurity regions 105. The impurity added to each of the impurity regions is an element belonging to the group 15 (typically phosphorus or arsenic).

In this embodiment, the channel forming region 102 (also region 110) is an intrinsic semiconductor layer or a semiconductor layer to which boron is added at a concentration of $1 \times 10^{16} - 5 \times 10^{18}$ atoms/cm$^3$. Boron is an impurity for controlling a threshold voltage or preventing punch-through, which may be replaced with other element so long as it can provide a similar effect. Also in this case, other element is added at a concentration about equal with that for boron.

As the semiconductor layer in this invention, not only a semiconductor layer comprising silicon as a main ingredient such as a silicon layer or a silicon germanium layer but also a compound semiconductor layer such as gallium arsenide or single germanium layer may also be used. Further, this invention is applicable also to TFT using an amorphous semiconductor (amorphous silicon) for the active layer or to TFT using a semiconductor containing crystals (single crystal semiconductor thin film, polycrystal semiconductor thin film, micro-crystal semiconductor thin film).

Further, the first impurity region 103 in NTFT has a length of 0.1 to 1 μm (typically from 0.1 to 0.5 μm, preferably, 0.1 to 0.2 μm), and contains an element belonging to the group 15 (typically phosphorus) at a concentration of $1 \times 10^{15}$ to $1 \times 10^{17}$ atoms/cm$^3$ (typically, $5 \times 10^{15}$ to $5 \times 10^{16}$ atoms/cm$^3$, preferably, $1 \times 10^{16}$ to $2 \times 10^{16}$ atoms/cm$^3$). The impurity concentration is represented in this embodiment as "n$^-$". The n$^-$ region is referred to as the first impurity region in this specification.

In the present specification, "impurity" is used for the element belonging to the group 13 or the group 15 unless otherwise specified. While the size (area) for each of the impurity regions changes in the course of the manufacturing process, it is explained in the present specification with the same reference numeral unless the concentration changes even if the area changes.

The second impurity region has a length of 0.5 to 2 μm (typically, from 1 to 1.5 μm) and contains an element belonging to the group 15 at a concentration of $1 \times 10^{16}$ to $1 \times 10^{19}$ atoms/cm$^3$ (typically, from $1 \times 10^{17}$ to $5 \times 10^{18}$ atoms/cm$^3$, preferably, $5 \times 10^{17}$ to $1 \times 10^{18}$ atoms/cm$^3$). The concentration of the impurities contained in the second impurity region may be controlled such that it is 5 to 10 times the concentration of the impurities contained in the first impurity region. The impurity concentration in this embodiment is represented by "n". The n region is referred to as the second impurity region in present specification.

Further, the third impurity region 105 has a length from 2 to 20 μm (typically, 3 to 10 μm), and contains an element belonging to the group 15 at a concentration from $1 \times 10^{19}$ to $1 \times 10^{21}$ atoms/cm$^3$ (typically at $1 \times 10^{20}$ to $5 \times 10^{20}$ atoms/cm$^3$). The third impurity region 105 forms a source region or a drain region for electrically connecting the source wiring or drain wiring with TFT. The impurity concentration in this case is represented as "n$^+$". The n$^+$ region is referred to as the third impurity region in the present specification.

Further, in this invention, the third impurity region 105 plays an extremely important role for gettering the catalyst element used for the crystallization out of the inside of the channel forming region 102. The effect is to be explained simply.

In this invention, a catalyst element (typically nickel) is used for promoting crystallization of the amorphous semiconductor film. However, since nickel is a metal element, it may cause leak current if it may remain as it is in the channel forming region. That is, it is desirable to dispose a step for removing the catalyst element from the channel forming region after using the catalyst element.

This invention has a feature in using an element belonging to the group 15 (preferably phosphorus) present in the source region and the drain region for removing the catalyst element. That is, after forming the source region and the drain region (third impurity region 105), a heat treatment is conducted thereby nickel remaining in the channel forming region is gettered to the third impurity region 105. Thus, the catalyst element used for the crystallization can be removed from the channel forming region 102.

Accordingly, the gettered catalyst element is collected in the third impurity region and peasant at a high concentration. As a result of the study made by the present applicant by SIMS (secondary ion mass spectroscopy), it has been found that the catalyst element is present at a concentration of $1 \times 10^{18} - 1 \times 10^{21}$ atoms/cm$^3$ (typically, $5 \times 10^{18} - 5 \times 10^{19}$ atoms/cm$^3$). However, since it may suffice that the third impurity region 105 has a function as the electrode, there is no particular problems even if the catalyst element is present in a great amount.

On the other hand, the concentration of the catalyst element in the channel forming region 102 is drastically reduced (or removed) due to the gettering effect. It can be seen from the result of SIMS study by the applicant that the concentration of the catalyst element in a titanium forming region 102 can be reduced to $2 \times 10^{17}$ atoms/cm$^3$ or less (typically, $1 \times 10^{14} - 5 \times 10^{16}$ atoms/cm$^3$). As described above, it is also a feature of this invention in that the concentration of the catalyst element shows a large difference depending on the position (difference by about 100 to 1000 times) even within the identical active layer.

As described above, the active layer of NTFT of this invention has a feature in containing at least three kinds of impurity regions each containing an identical impurity at a different concentration, finally, in addition to the channel forming region. With such a structure, it is impossible to obtain a constitution in which the concentration of the impurity (element belonging to the group 15) increases gradually as the region is remote from the channel forming region 102 in the order of the first impurity region 103, the second impurity region 104 and the third impurity region 105.

What is intended by the present applicant is to attain the concentration gradient found at the LDD portion in MOSFET in the existent example as described above by forming a plurality of impurity regions intentionally. Accordingly, three or more impurity regions may be present.

A gate insulation layer 106 is formed on the thus formed active layer. Further, a gate wiring 107 is disposed on the gate insulation film 106. As the material for the gate wiring 107, it can be used a layer of a material such as tantalum (Ta), tantalum nitride (TaN), titanium (Ti), chromium (Cr), tungsten (W), tungsten nitride (WN), molybdenum (Mo), silicon (Si), aluminum (Al) or copper (Cu), or a laminate structure in combination of them.

Typical examples of the laminate structure can include a laminate structure of Ta/Al, Ta/TaN, Ti/Al, Cu/W, Al/W, W/WN or W/Mo. A structure provided with a metal silicide may also be employed (specifically, a structure comprising a combination of conductive silicon with a metal silicide such as $Si/WSi_x$, $Si/TiSi_x$, $Si/CoSi_x$ or $Si/MoSi_x$.

When a side wall comprising silicon is formed, it is preferred that a material having a higher selectivity to silicon in an etching appears on the upper surface of the laminate structure. This is for preventing the gate wiring from etching upon forming the side wall. Otherwise, it is necessary to protect the upper surface with a protection film as a stopper upon forming the side wall.

Further, a structure not disposing the side wall to PTFT is effective in the CMOS circuit of this invention as will be described later. Accordingly, since a step of removing only the side wall subsequently is included, it is necessary to select such a material that the gate wirings is not etched upon removing the side wall. In this regard, since the structure of the article described in the prior art is in direct contact between the silicon gate and the side wall, the CMOS circuit of this invention can not be obtained if the structure of the article is used as it is.

Further, upon heat treatment in the gettering step described above, it is necessary to take care for the heat resistance of the gate wiring 107 (or 113). If the gate wiring includes the metal having a low melting point such as aluminum, the temperature for heat treatment is restricted. Further, since tantalum is easily oxidized, it is necessary to provide a protection film such as a silicon nitride film, so as to protect tantalum from exposure to the heat treatment atmosphere.

A silicon nitride film 108 shown in FIG. 1 is a protection layer disposed for this purpose. It is effective to add a slight amount of boron to the silicon nitride film 108. This can improve the heat conductivity and provide a heat dissipating effect.

A side wall 109 is disposed on the side face of the gate wiring 107. In this invention, a layer mainly composed of silicon (specifically, a silicon layer or a silicon germanium layer) is used for the side wall 109. It is particularly desirable to use an intrinsic silicon layer. Of course it may be of amorphous, crystalline or micro-crystallite material.

In this invention; the side wall 109 and the first impurity region 103 overlap, and the side wall 109 is located over the first impurity regions 103 with the insulation film 106 interposed therebetween. Such a structure can provide a merit like that in the GOLD structure or the LATID structure in the MOSFET.

For attaining such a structure, it is necessary that a voltage is applied by the side wall 109 to the first impurity region 103. When the side wall is formed of an intrinsic silicon layer, since a leak current occurs to some extent although the resistance value is high, it can provide a merit of not forming voltage residue due to capacitance accumulated in the side wall portion.

Further, in the case of the TFT, since the thickness of the active layer is as thin as 20 to 50 nm, a depletion layer completely prevails as far as the bottom of the active layer during operation to form a fully depletion type (FD type). An electric field is formed in a direction less forming hot carriers by arranging the FD type TFT as a gate overlap type. On the contrary, if a usual offset structure is adopted in the FD type TFT, an electric field may possibly be formed in the direction of promoting the injection of hot carriers.

With a structure as described above NTFT of this invention can provide a high reliability equal with or superior to that in MOSFET. Further, the same effect as that of the gate overlap structure can be obtained by applying a gate voltage to the first impurity region 103 using the side wall 109.

Then, a structure in which an impurity concentration is increased gradually from the channel forming region 102 to the source region (or the drain region) 105 can be attained by arranging the first impurity region 103, the second impurity region 104 and the third impurity region 105. This can effectively suppress the off current of TFT.

Figure 2A:
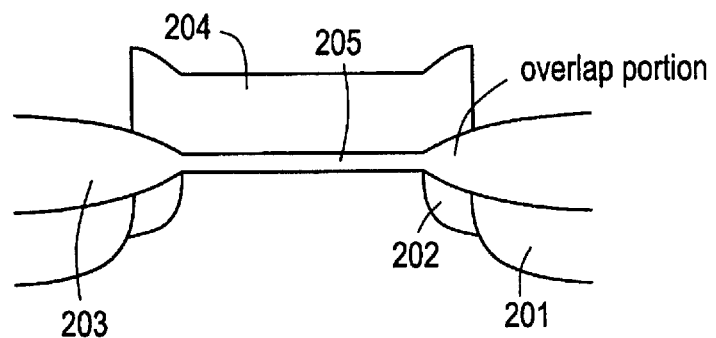
FIGS. 2A and 2B are a view showing a cross sectional structure of MOSFET and a graph showing a gradient of the impurity concentration in the MOSFET, respectively.
Figure 2B:
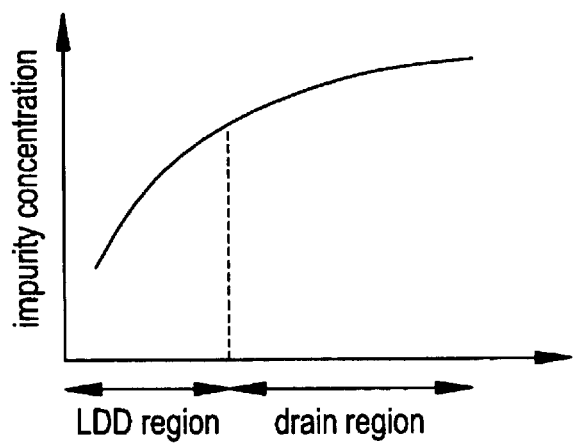

Further, since the impurity region 104 is disposed at a distance from the gate voltage, an electric field moderating effect can be obtained like that in the overlap portion of MOSFET shown in FIG. 2A. Further, since hot carriers generated in the first impurity region 103 are injected to the side wall 109 just above, a trap level is not formed just above the channel forming region 102.

NTFT of this invention has been described above. In the structure of the p-channel TFT (hereinafter referred to as PTFT) the LDD region or the off set region is not disposed basically. While a structure of disposing the LDD region or the off set region may also be adopted, since the PTFT has a high reliability by its nature, it is preferred to increase an on current and make a balance of characteristics with NTFT. The balance of characteristics is particularly important when the invention is applied to the CMOS circuit as shown in FIG. 1.

In FIG. 1, the active layer of the PTFT comprises a channel forming region 110, a fourth impurity region 111 and a fifth impurity region 112. In the specification, the fourth impurity region 111 and the fifth impurity region 112 are separated for the simplicity of explanation, but both of the regions actually function as the source region or the drain region of PTFT.

In this case, an element selected from the group 13 (typically, boron) is added at a concentration of $5\times10^{20}$–$5\times10^{21}$ atoms/cm$^3$ to the fourth impurity region 111. The impurity concentration is represented as "p$^{++}$" (in the specification, the p$^{++}$ region is referred to as a fourth impurity region).

Further, an element selected from the group 13 is present also in the fifth impurity region at the same concentration as that in the fourth impurity region 111. Further, an element selected from the group 15 is present in this region at the same concentration as that in the third impurity region 105. Therefore, the fifth impurity region 112 is represented as "n$^+$, p$^{++}$" region (in the specification, the n$^+$, p$^{++}$ region is referred to as a fifth impurity region). However, since the element belonging to the group 13 is added more than the element belonging to the group 15, it still shows the p type.

That is, since not only the element belonging to the group 13 but also the element belonging to the group 15 are contained at a high concentration in the fifth impurity region 112, it provides a sufficient gettering effect. Accordingly, a catalyst element use for the crystallization is present also in the fifth impurity region 112 at a concentration of $1\times10^{18}$–$1\times10^{21}$ atoms/cm$^3$ (typically, $5\times10^{18}$–$5\times10^{19}$ atoms/cm$^3$). Of course, the concentration of the catalyst element contained in the channel forming region 110 is $\frac{1}{100}$ to $\frac{1}{1000}$ times the concentration in the fifth impurity region 112 and the concentration is $2\times10^{17}$ atoms/cm$^3$ or less (typically, $1\times10^{14}$–$5\times10^{16}$ atoms/cm$^3$).

Also one of the features of the CMOS circuit according to this invention is the presence of the side wall 109 in NTFT but the side wall is removed and not remained in PTFT. This is for making NTFT as a gate overlap structure and making PTFT as a structure with neither LDD nor offset structure.

After forming NTFT and PTFT as described above, they are covered with a first interlayer insulation film 114, and source wirings 115, 116 and the drain wiring 117 are disposed. In the structure shown in FIG. 1, a silicon nitride layer 118 is formed as a protection film after disposing the wirings to enhance the passivation effect. Then, a second interlayer insulation film 119 made of a resin material is disposed on the silicon nitride layer 118. The material is not necessarily the resin material but use of the resin material is effective in view of ensuring the flatness.

While explanations have been made to an example of a CMOS circuit comprising a complimentary combination of NTFT and PTFT, it is also possible to apply this invention to an NMOS circuit using NTFT or a pixel TFT formed with NTFT. It is of course possible to apply this invention to a further complicated semiconductor circuit having the CMOS circuit as a basic unit.

Further, one of most important features of this invention is that the LDD region of NTFT is provided at a multistage such that the impurity concentration is higher as the region is remote from the channel forming region and that the catalyst element (element used for the crystallization) in the channel forming region is lowered to such a level as not impairing the electric characteristics of TFT.

Accordingly, so long as the above-mentioned constitution is included, there is no restriction for TFT structure and this invention is applicable both to the top gate structure (typically planar structure) and to the bottom gate structure (typically inverted stagger structure).

The following is an advantage of the NTFT structure of this invention.

NTFT according to this invention has a structural feature in providing a plurality of LDD regions such as a first impurity region (first LDD region) and a second impurity region (second LDD region), and the gate electrode and one of the LDD regions overlap.

Figure 32A:
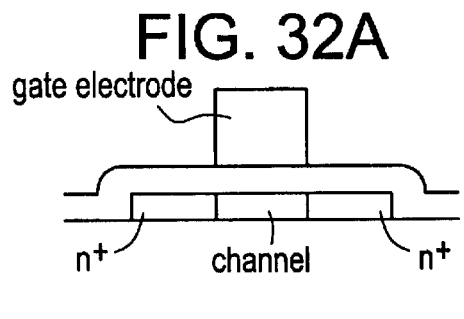
FIGS. 32A to 32H are views for comparing various types of TFT structures.
Figure 32B:
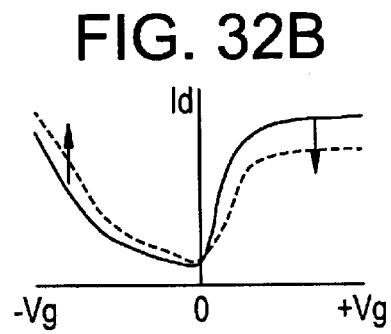
Figure 32C:
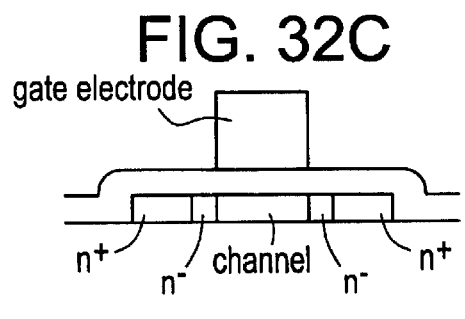
Figure 32D:
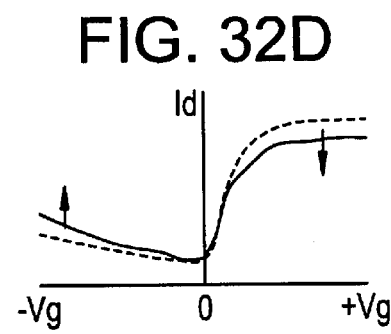
Figure 32E:
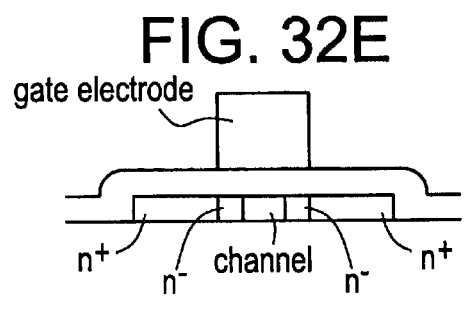
Figure 32F:
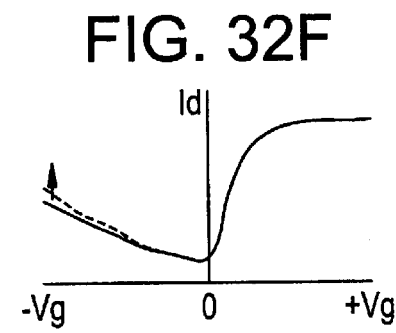
Figure 32G:
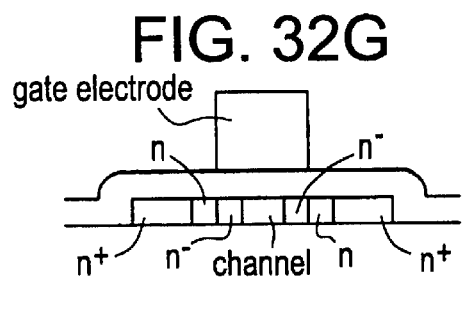
Figure 32H:
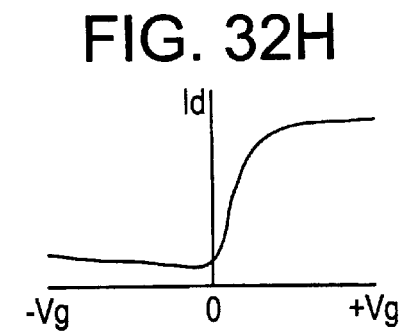

Now, the superiority of this invention is to be explained in comparison with existent structures. FIGS. 32A and 32B show NTFT with no LDD structure and electric characteristics thereof (gate voltage Vg to drain current Id characteristic). In the same manner; FIGS. 32C and 32D show a usual LDD structure, FIGS. 32E and 32F show a so-called GOLD structure and FIGS. 32G and 32H show NTFT of this invention.

In the drawings, "n+" represents a source region or a drain region, "channel" shows a channel forming region, "n−" represents an LDD region and "n" represents a second LDD region. Further, "Id" is a drain current and "Vg" is a gate voltage.

As shown in FIGS. 32A and 32B, if the LDD structure is not present, an off current is high and on current (a drain current when TFT is in an on state) or off current tends to be degraded.

Then, in the case of the LDD structure, the off current is considerably restricted and degradation can be suppressed both for the on current and the off current. However, degradation of the on current can not completely be suppressed (FIGS. 32C and 32D).

Then, in the structure in which the LDD region and the gate region overlap (FIGS. 32E and 32F), this structure attaches an importance to the suppression of the degradation of the on current in the existent LDD structure.

In this case while degradation of the on current can be suppressed sufficiently, it involves the problem that the off current is somewhat higher than that in the usual LDD structure. The article described as the prior art adopts the structure, and this invention recognizes the problem that the off current is high and aims at a structure for overcoming the problem.

In the structure of this invention, as shown in FIGS. 32G and 32H, an inner LDD region (on the side nearer to the channel forming region) is overlapped with the gate electrode, while the outer LDD region is not overlapped with the gate electrode. Use of the structure enables to decrease the off current while keeping the effect of suppressing the degradation of the on current as it is.

The present applicant assumes the reason why the off current increases in the case of the structure shown in FIGS. 32E and 32F, as below. The explanation will be made with reference to FIGS. 33A and 33B.

When the NTFT is in an off state, a negative voltage such as minus several tens volt is applied to the gate electrode 41. If a positive voltage such as plus several tens volt should apply to the drain region 42 in this state, an extremely large electric field is formed at the drain side end of the gate insulation film 43.

Figure 33A:
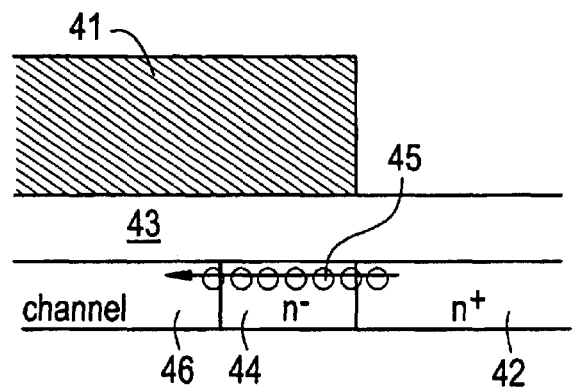
FIGS. 33A and 33B are views showing a cross section of n-channel TFT and an energy band in the n-channel TFT (off state), respectively.
Figure 33B:
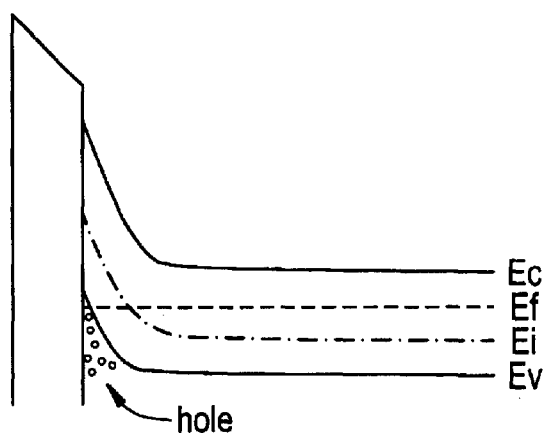

In this instance, as shown in FIG. 33A, positive holes 45 are induced in the LDD region 44. The energy band in this case is shown in FIG. 33B. That is, a current path with minority carriers is formed connecting the drain region 42, the LDD region 44 and the channel forming region 46. It is considered that the current path results in increase of the off current.

The applicant considers that a separate resistance body, that is, a second LDD region has to be disposed at a position not overlapping with the gate electrode in order to interrupt the current path described above at the midway. The applicant has reached the structure of this invention in this way.

Explanations will be made more in details for the constitution of the invention described previously with reference to the following examples.

EXAMPLE 1

In this example, a method of manufacturing the CMOS circuit shown in FIG. 1 is to be explained with reference to FIGS. 3A to 3D and FIGS. 4A to 4D.

At first, an underlying film comprising a silicon oxide film 302 is formed to 200 nm thickness on a glass substrate 301. The underlying film may be a laminated film comprising a silicon nitride film and a silicon oxide film, or consisting of only a silicon nitride film. A plasma CVD method, a thermal CVD method or a sputtering method may be used for the method of forming the film. It is effective to add boron to the silicon nitride film for improving the heat dissipating effect.

Then, an amorphous silicon film of 50 nm thickness is formed on the silicon oxide film 302 by a plasma CVD method, a heat CVD method or a sputtering method. Then, the amorphous silicon film is crystallized by using the technique described in Japanese Patent Laid-Open No. 7-130652 (1995) to form a semiconductor film containing crystals. The Japanese Patent corresponds to a U.S. Pat. No. 5,642,826. The steps are to be explained with reference to FIGS. 5A and 5B.

Figure 5A:
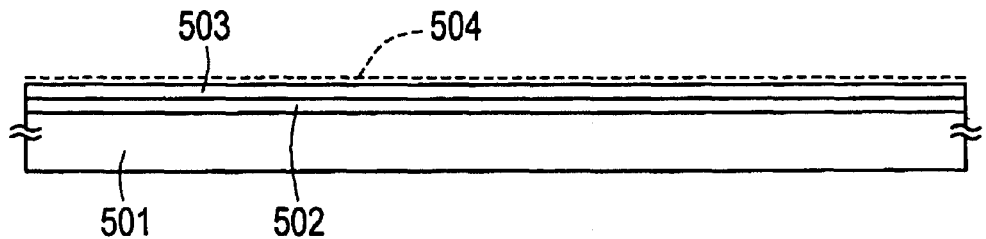
FIGS. 5A and 5B are views showing steps of manufacturing a crystalline silicon film.

At first, silicon oxide film 502 is disposed as an underlying film on a glass substrate 501, on which an amorphous silicon film 503 is formed. In this example, the silicon oxide film 502 and the amorphous silicon film 503 are formed continuously by a sputtering method. Then, a nickel-containing layer 504 is formed by coating a nickel acetate solution containing 10 ppm of nickel on the weight basis (FIG. 5A).

In addition to nickel (Ni), one or a plurality kinds of elements selected from germanium (Ge), iron (Fe), palladium (Pd), tin (Sn), lead (Pb), cobalt (Co), platinum (Pt), copper (Cu), gold (Au), and silicon (Si) may also be used.

Figure 5B:
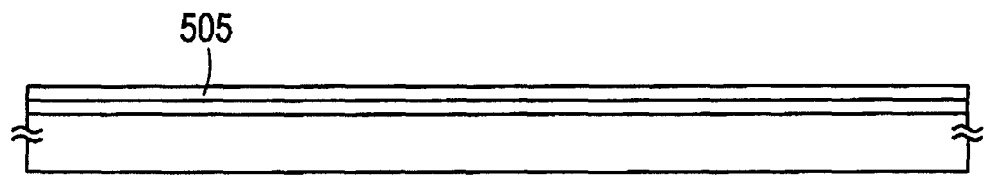

Then, after a hydrogen-releasing step at 500° C. for one hour, a heat treatment is applied at 500 to 650° C. for 4 to 24 hours (at 550° C. for 14 hours in this example), to form a polysilicon film 505. The thus obtained polysilicon film 505 has been known to have excellent crystallinity (FIG. 5B).

However, nickel used for the crystallization is present at a high concentration in the inside of the polysilicon film 505. As a result of SIMS measurement conducted by the present applicant, it is found that nickel is present at a concentration of $1 \times 10^{18} - 1 \times 10^{19}$ atoms/cm$^3$. Since nickel may be silicided easily within the channel forming region, it may be a worry that the channel forming region comprising nickel silicide functions as a current path of low resistance (path for the leak current).

The present applicant examined electrical characteristics of the actual TFT and confirmed that the nickel at such a concentration gives no remarkable undesired effects on the electrical characteristics of the TFT. However, so long as it has a possibility of giving undesired effects, it may be desirable that nickel be removed at least from the channel forming region. The gettering step adopted for this purpose is to be explained later.

Figure 3A:
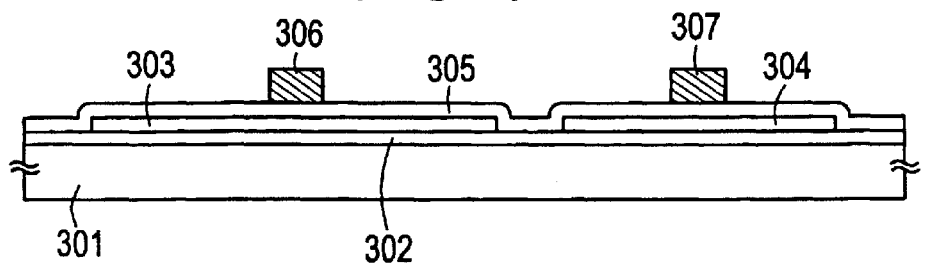
FIGS. 3A to 3D are views showing steps of manufacturing a CMOS circuit.

After thus forming the polysilicon film 505, patterning is applied in an island shape to form active layers 303, 304 as shown in FIG. 3A.

After forming the polysilicon film 505, an excimer laser beam, a YAG laser beam, a second harmonic of the YAG laser beam, a third harmonic of the YAG laser beam and a fourth harmonic of the YAG laser beam may be irradiated to improve the crystallinity. Alternatively, it may be irradiated after forming the active layers 303, 304. Since known techniques can be used for the irradiation step of the above mentioned laser beam, detailed explanations therefor all omitted.

Then, a gate insulation film 305 comprising silicon oxynitride (represented by SiO$_x$N$_y$) is formed covering the active layers 303, 304, on which gate wirings (including gate electrode) 306, 307 of a laminate structure comprising tantalum and tantalum nitride are formed (FIG. 3A).

The thickness of the gate insulation film 305 is 120 nm. In addition to the silicon oxynitride film, a silicon oxide film or a laminate structure of a silicon oxide film and a silicon nitride film may also be used. Further, while other metals may also be used for the gate wirings 306, 307, a material with a high etching selective ratio relative to silicon is desired in view of subsequent steps.

When the state in FIG. 3A is thus obtained, first phosphorus doping step (phosphorus addition step) is conducted. Since phosphorus is added through the gate insulation film 305, an acceleration voltage is set somewhat higher at 80 kev. Further, the thus formed first impurity regions 308, 309 are controlled such that the length (width) is 0.5 µm and the phosphorus concentration is $1 \times 10^{17}$ atoms/cm$^3$. Arsenic could be used instead of phosphorus.

Figure 3B:
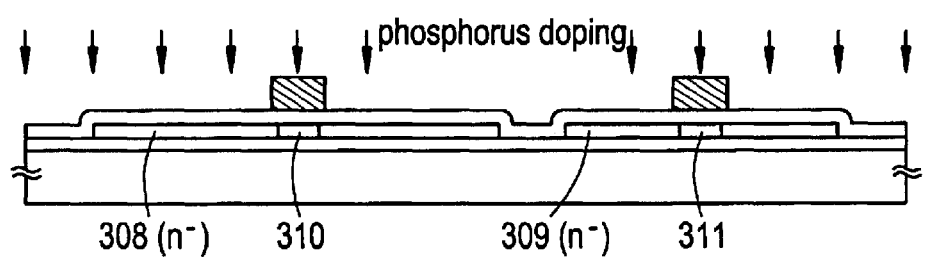

Further, the first impurity regions 308, 309 are formed in self-alignment using the gate wirings 306, 307 as a mask, by which an intrinsic polysilicon layer is left just below the gate wiring 306, 307 to form channel forming regions 310, 311. However, since a portion of phosphorus is added actually while creeping to the inside of the gate wiring slightly, an overlapping structure of the gate wiring 306 and the first impurity region 308 is obtained and an overlapping structure of the gate wiring 307 and the first impurity region 309 is obtained (FIG. 3B).

Then, an amorphous silicon layer is formed to a thickness of 0.1 to 1 µm (typically, 0.2 to 0.3 µm) so as to cover the gate wirings 306, 307, to form side walls 312, 313 by anisotropic etching using a gas containing chlorine. The width for the side walls 312, 313 (thickness viewed from the side of the gate wirings) is 0.2 µm (FIG. 3C).

In this example, since an amorphous silicon layer with no addition of impurities is used, a side wall comprising an intrinsic silicon layer (undoped silicon layer) is formed.

Figure 3C:
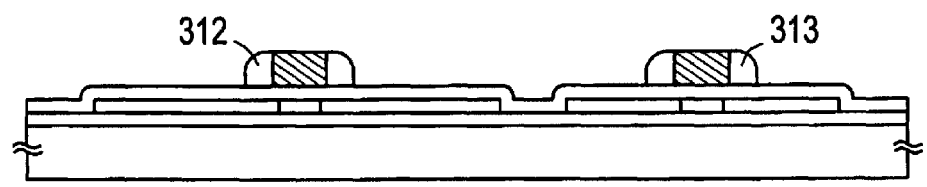

After obtaining a state shown in FIG. 3C, a second phosphorus doping step is conducted. Also in this case, the acceleration voltage is set to 80 KeV in the same manner as the first step. Further, the amount of dose is controlled such that phosphorus is contained at a concentration of $1 \times 10^{18}$ atoms/cm$^3$ to second impurity regions 314, 315 formed in this step.

In the phosphorus doping step shown in FIG. 3D, the first impurity regions 308, 309 are left only just below the side walls 312, 313. That is, the first impurity region 103 shown in FIG. 1 is defined in this step. The first impurity region 308 functions as a first LDD region of the NTFT.

Figure 3D:
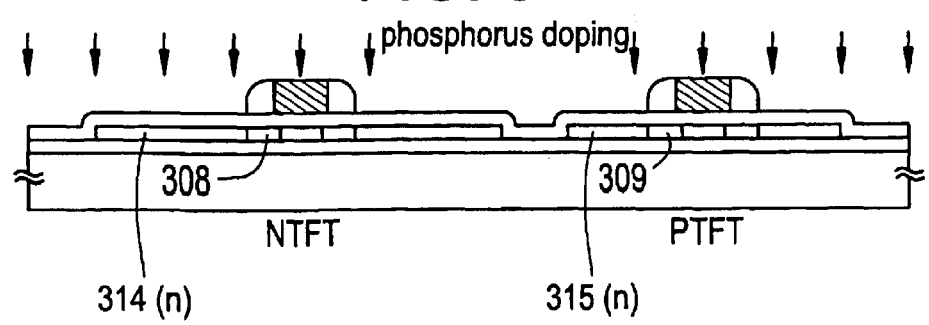

Further, in the step shown in FIG. 3D, phosphorus is added also to the side walls 312, 313. Since the acceleration voltage is high, phosphorus is actually distributed in a state where the tail of the concentration profile of the phosphorus prevailed as far as the inside of the side wall. The resistance value of the side wall can be controlled by phosphorus but, if the concentration distribution of phosphorus scatters extremely, it may possibly fractures the gate voltage to be applied on the first impurity region 308 on every elements, so that a precise control is necessary upon doping.

Figure 4A:
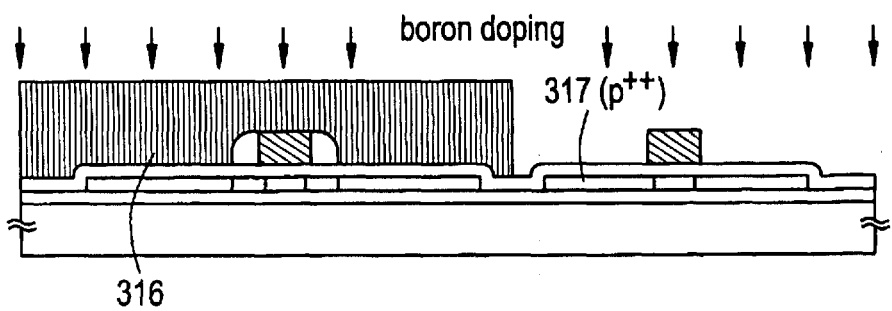
FIGS. 4A to 4D are views showing steps of manufacturing a CMOS circuit.

Then, a resist mask 316 covering NTFT is formed and the side wall 313 of PTFT is removed. Subsequently, a boron doping step (boron addition step) is conducted. In this step, the acceleration voltage is 70 KeV and the amount of dose is controlled such that boron is contained at a concentration of $3 \times 10^{21}$ atoms/cm$^3$ in the fourth impurity region 317 thus formed. The boron concentration is represented by "p$^{++}$" (FIG. 4A).

The first impurity region 309 and the second impurity region 315 formed in the PTFT are completely inverted into the p type by the boron doping step. The concentration of boron added in this step has to be set higher than the concentration of phosphorus added in the third phosphorus doping step to be conducted next. This will be described later.

Figure 4B:
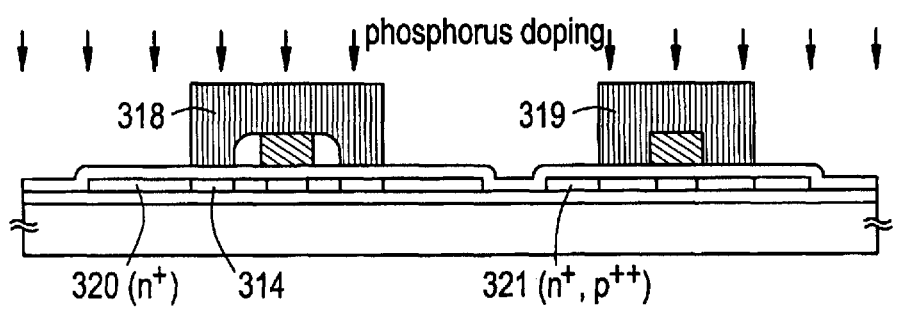

Then, the resist mask 316 is removed and resist masks 318, 319 are formed newly. Subsequently, a third phosphorus doping step is conducted. The acceleration voltage is set to 90 KeV. In this example, the amount of dose is controlled such that phosphorus is contained at a concentration of $5 \times 10^{20}$ atoms/cm$^3$ in the third impurity region 320 and the fifth impurity region 321 (FIG. 4B).

In this step, since phosphorus is not added to a portion shielded by the resist mask 318 formed on NTFT, the second impurity region 314 is left as it is in this portion. That is, the second impurity region 104 is defined as shown in FIG. 1 in this step. Further, the third impurity region 105 shown in FIG. 1 is also defined. The second impurity region 314 functions as a second LDD region while the third impurity region 105 functions as a source region or a drain region.

Further, in the active layer to form the PTFT, the fourth impurity region 317 is left below a portion shielded by the resist mask 319. That is, the fourth impurity region 111 shown in FIG. 1 is defined by this step. Simultaneously, the fifth impurity region 112 shown in FIG. 1 is defined.

In this example, the addition amount of phosphorus is desirably controlled such that the concentration of phosphorus in the third impurity region 320 and the fifth impurity region 321 is at least $1 \times 10^{19}$ atoms/cm$^3$ or more, preferably, $1 \times 10^{20}$–$5 \times 10^{23}$ atoms/cm$^3$. If the concentration is lower, a gettering effect with phosphorus may not be possibly expected.

Further, since the concentration of phosphorus added in this step is lower than the concentration of boron added upon boron doping described above, p type is kept in -the fifth impurity region 321. Accordingly, the fourth impurity region 317 and the fifth impurity region 321 can be collectively considered as a source region or a drain region.

Further, in this example, neither LDD region nor off set region is formed in the PTFT but there is no problem since the PTFT has high reliability by its nature and, it may be rather convenient not to dispose the LDD region or the like since ON current can be increased.

Finally, as shown in FIG. 4B, the channel forming region, the first impurity region, the second impurity region and the third impurity region are formed in the active layer of NTFT and the channel region, the fourth impurity region and the fifth impurity region are formed in the active layer of PTFT.

After attaining the state shown in FIG. 4B, the resist masks 318, 319 are removed and a silicon nitride film 322 is formed as a protection film. In this case, the thickness of the silicon nitride film is 1 to 100 nm (typically, 5 to 50 nm, preferably, 10 to 30 nm).

Figure 4C:
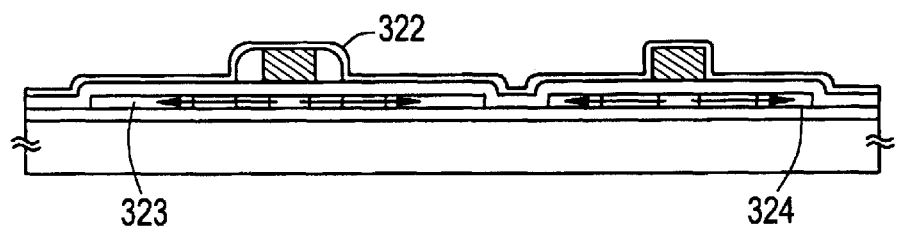

Then, a heat treatment step is conducted at a treating temperature of 500 to 650° C. (typically 550 to 600° C.) for 2 to 24 hours (typically for 4 to 12 hours). In this example, the heat treatment is conducted in a nitrogen atmosphere at 600° C. for 12 hours (FIG. 4C).

This heat treatment step is conducted with an aim of activating the impurity (phosphorus and boron) added to the first impurity region 308, second impurity region 314, third impurity region 320, fourth impurity region 317 and fifth impurity region 321. Simultaneously, the heat treatment is conducted for gettering nickel remaining in the channel forming regions 310, 311.

In this heat treatment step, phosphorus added in the third impurity region 320 and the fifth impurity region 321 getters nickel. That is, nickel moves in the direction of an arrow and is captured by being bonded with phosphorus. Therefore, nickel is collected at a high concentration in the third impurity region 323 and the fifth impurity region 324 shown in FIG. 4C. specifically, nickel is present in both of the third impurity region and the fifth impurity region at a concentration of $1 \times 10^{18}14$ $1 \times 10^{23}$ atoms/cm$^3$ (typically, $5 \times 10^{18}$ to $5 \times 10^{19}$ atoms/cm$^3$). It has been found that the concentration of the nickel in the channel forming regions 310, 311 is simultaneously reduced to $2 \times 10^{17}$ atoms/cm$^3$ or less (typically, $1 \times 10^{14}$–$5 \times 10^{16}$ atoms/cm$^3$).

In this case, the silicon nitride film 322 disposed as a protection film prevents oxidation of the tantalum film used as the material for the gate wiring from oxidation. While there is no problem if the gate wiring is less oxidized or an oxide film formed by oxidation can be etched easily, but a tantalum film is not easily oxidize but hardly etched extremely, it is desirable to dispose the silicon nitride film 322.

When the heat treatment step (gettering step) shown in FIG. 4C is thus completed, a first interlayer insulation film 325 is formed to a thickness of 1 μm. As the first interlayer insulation film 325, a silicon oxide film, silicon nitride film, silicon oxynitride film, organic resin film or a laminated film thereof can be used. In this example, an acrylic resin film is adopted.

After forming the first interlayer insulation film 325, source wirings 326, 327 and a drain wiring 328 comprising metallic materials are formed. In this example, a laminated wiring of a structure in which titan-containing aluminum is put between titanium films is used.

Further, when a resin film referred to as BCB (benzocyclobutene) is used as the first interlayer insulation film 325, flatness is improved and copper can be used as the wiring material. Since copper has low resistance, it is extremely effective as the wiring material.

When the source wiring and the drain wiring are thus formed, a silicon nitride film 329 of 50 nm thickness is formed as a passivation film. A second interlayer insulation film 330 is formed further thereover as a protection film. For the second interlayer insulation film 330, the same material as for the first interlayer insulation film 325 can be used. In this example, a laminated structure of an acrylic resin film on a silicon oxide film having 50 nm thickness is adopted.

Figure 4D:
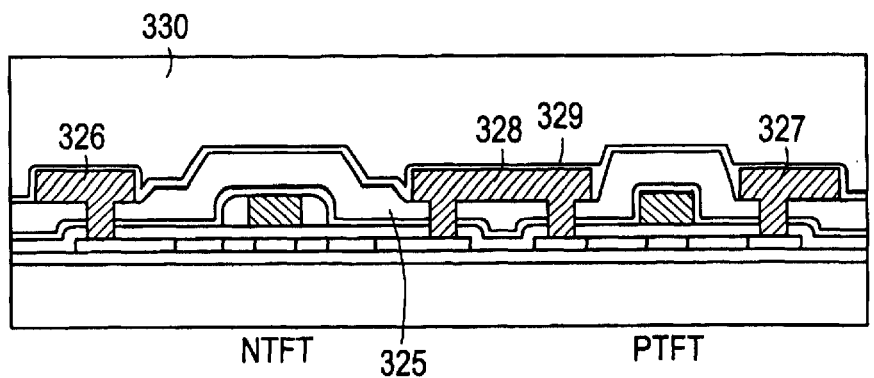

By way of the steps described above, a CMOS circuit of a structure shown in FIG. 4D is completed. In the CMOS circuit formed in this example, since NTFT had excellent reliability, the reliability is improved remarkably in the entire circuit. Further, in the structure as in this example, it has been found that operation failure less occurs since balance of characteristic (balance of electrical characteristics) is improved between the NTFT and PTFT.

Further, the undesired effect of nickel (catalyst element) in the channel forming region feared in the case of using the prior art described in Japanese Patent Laid-Open No. 7-130652 could be overcome by conducting the gettering step as shown in this example.

The structure explained in this example is merely an example and it is not necessary to be restricted to the structure shown in FIGS. 3A to 3D and FIGS. 4A to 4D. The important feature of the present invention resides in the structure of the active layer of NTFT and the effect of the present invention can be obtained unless this structure is identical.

EXAMPLE 2

In Example 1, undoped-Si (intrinsic silicon layer or undoped silicon layer) to which impurities are not added intentionally is used for the side wall, but a phosphorus doped silicon layer (N$^+$ Si layer) in which phosphorus is added upon forming the film or a boron-doped silicon layer (p$^+$ Si layer) is used. Of course, it may be an amorphous, crystalline or microcrystalline material.

By using phosphorus-added silicon layer or boron-added silicon layer, the resistance in the side wall portion is entirely lowered and a possibility for the fluctuation of characteristics caused by scattering of the profile for the concentration of phosphorus considered for the step in FIG. 3D could be eliminated.

EXAMPLE 3

In Example 1, undoped-Si in which impurities are not added intentionally is used as the side wall, but a silicon layer containing one of carbon (C), nitrogen (N) or oxygen (O) is used to increase the resistance value of the side wall in this example. Of course, the silicon layer may be formed any of amorphous, crystalline or micro-crystalline material. Further, as the impurity to be used, oxygen is most favorable.

That is, when a silicon layer as a side wall is formed, carbon, nitrogen or oxygen could be added at 1 to 50 atomic % (typically 10 to 30 atomic %). In this example, 20 atomic % of oxygen is added.

Since the resistance value due to the side wall is increased with the constitution of this example, it is possible to obtain a constitution in which the effect of the capacitance with the side wall as a dielectric is predominant in applying a gate voltage. That is, an effective gate voltage could be applied also to the side wall portion upon high frequency driving.

EXAMPLE 4

In this example, explanation is to be made to an example of crystallizing a semiconductor film containing crystals as the active layer in Example 1 by utilizing the technique as disclosed in Japanese Patent Laid-Open No. 8-78329 (1996). The technique described in the Japanese Patent enables selective crystallization of semiconductor films by selectively adding a catalyst element. Explanation is to be made for a case of applying this technique to the present invention with reference to FIGS. 6A and 6B.

At first, a silicon oxide film 602 is disposed on a stainless steel substrate 601, on which an amorphous silicon film 603 and a silicon oxide film 604 are formed continuously. In this case, the thickness of the silicon oxide film 604 is 150 nm.

Figure 6A:
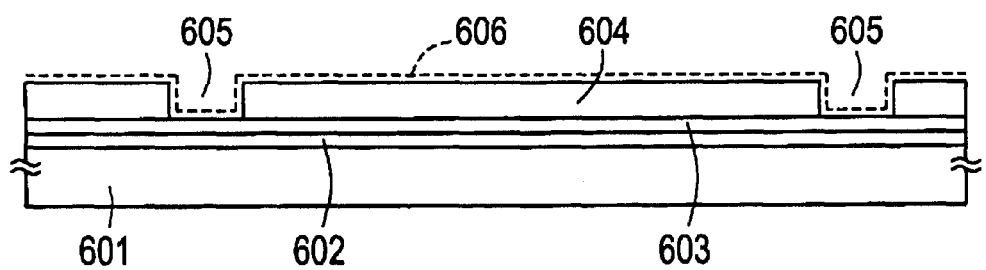
FIGS. 6A and 6B are views showing steps of manufacturing a crystalline silicon film.
Figure 6B:
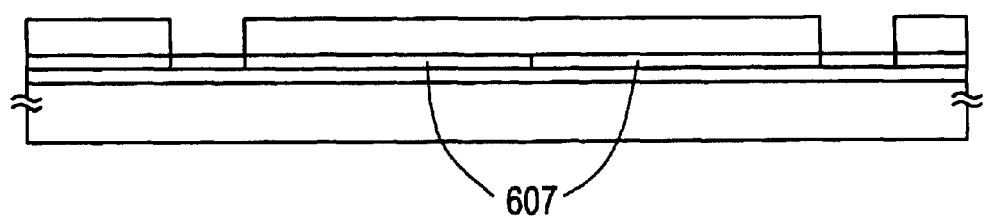

Then, the silicon oxide film 604 is pattered to selectively form openings 605 and then a nickel acetate solution containing 100 ppm of nickel on the weight basis is coated. The thus formed nickel containing layer 606 is in a state in contact with the amorphous silicon film 602 only at the bottom of the opening 605 (FIG. 6A).

Then, a heat treatment is conducted at 500 to 650° C. for 4 to 24 hours (at 580° C. for 14 hours in this example) to crystallize the amorphous silicon film. In the course of the crystallization, a portion in contact with nickel is crystallized at first and then crystal growing proceeds therefrom to a direction substantially in parallel with the substrate. It is confirmed that growing proceeds crystallographically in the direction of <111> axis.

The thus formed polysilicon film 607 comprises assembly of rod-like or acicular crystals and can provide a merit of uniform crystallinity since each of the rod-like crystals is grown with a predetermined directionality in a macroscopic view.

Also in the technique described in the patent publication, one or a plurality kinds of elements selected from germanium (Ge), iron (Fe), palladium (Pd), tin (Sn), lead (Pb), cobalt (Co), platinum (Pt), copper (Cu), gold (Au) and silicon (Si) can be used in addition to nickel (Ni).

A semiconductor film (including polysilicon film or polysilicon germanium) containing crystals may be formed by using the technique described above, and patterned to form an active layer comprising a semiconductor film containing crystals. Subsequent steps may be in accordance with those in Example 1. It can of course be combined with Example 2 or 3.

When TFT is manufactured by using the semiconductor film containing crystals crystallized by using the technique of this example, while high electric field effect mobility can be obtained but high reliability therefor is demanded. However, it has become possible to manufacture TFT while utilizing the technique of this example to the utmost degree by adopting the TFT structure of this invention.

EXAMPLE 5

In this example, a combination of the technique as described in Japanese Patent Laid-Open No. 10-135468 (1998) or Japanese Patent Laid-Open No. 10-135469 (1998) with Example 1 is shown. The former Japanese Patent corresponds to a pending U.S. application Ser. No. 08/951, 193 and the latter Japanese Patent corresponds to a pending U.S. application Ser. No. 08/951,819.

The technique described in the Japanese Patents are a technique of removing nickel used for the crystallization of a semiconductor by using a gettering effect of a halogen element (typically, chlorine) after crystallization. By the use of the technique, the concentration of the nickel in the active layer can be lowered to $1 \times 10^{17}$ atoms/cm$^3$ or lower (preferably, $1 \times 10^{16}$ atoms/cm$^3$ or lower).

Figure 7A:
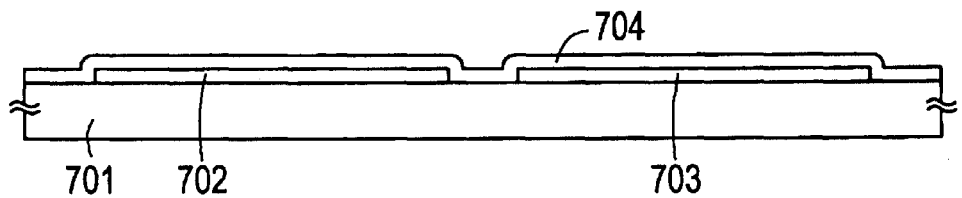
FIGS. 7A and 7B are views showing steps of manufacturing a crystalline silicon film.
Figure 7B:
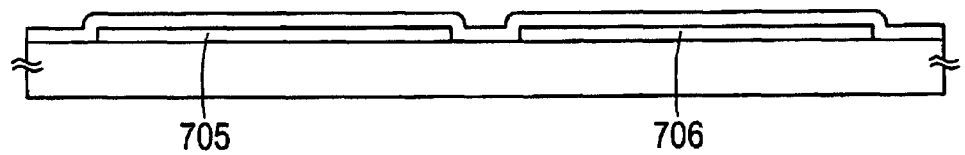

The constitution of this example is to be explained with reference to FIGS. 7A and 7B. At first, a highly heat resistant quartz substrate 701 is used for the substrate. A silicon substrate or ceramic substrate may of course be used. When the quartz substrate is used, there is no worry of contamination from the substrate with no particular disposition of a silicon oxide film as an underlying film.

Then, polysilicon film (not illustrated) is formed by using means in Example 1 or Example 4, which is patterned to form active layers 702, 703. Further, a gate insulation film 704 comprising a silicon oxide film is formed covering the active layers (FIG. 7A).

After forming the gate insulation film 704, a heat treatment is conducted in an atmosphere containing a halogen element. In this example, an oxidative atmosphere comprising a mixture of oxygen and hydrogen chloride is used as an atmosphere for the treatment and the treating temperature is 950° C. and the treating time is 32 min. The treating temperature may be selected between 700° C. and 1150° C. (typically, 800 to 1000° C.), while the treating time may be selected between 10 min and 8 hours (typically, 30 min to 2 hours)(FIG. 7B).

In this case, nickel formed volatile nickel chloride and released into the treating atmosphere, by which nickel concentration in the polysilicon film is reduced. Accordingly, the concentration of nickel contained in the active layers 705, 706 shown in FIG. 7B is reduced to $1 \times 10^{17}$ atoms/cm$^3$ or lower.

The active layer may be formed by using this example comprising the technique described above and the subsequent steps may be in accordance with those in Example 1. It is of course possible to combine this technique with any of Examples 2 to 5. Particularly, it has been found that a combination of this example and Example 4 can provide a polysilicon film of extremely high crystallinity.

The following is a finding on crystal structure of an active layer.

The active layer formed in accordance with the manufacturing steps described above has a crystal structure in which a plurality of acicular or rod-shaped crystals (hereinafter simply referred to as rod-shaped crystals) in a macroscopic view. This could be confirmed easily by TEM observation (transmission type electron microscopic method).

Further, it is confirmed by utilizing electron beam diffraction and X-ray diffraction for the surface of the active layer (channel forming portion) that the main orientation face is {110} phase although some displacement is included in the crystallographic axes. As a result of close observation made by the applicant on an electron diffraction photograph with a spot diameter of about 1.5 μm, it could be confirm that diffraction spots corresponding to {110} face clearly appeared and each of spots had a distribution on concentric circles.

Further, a crystal grain boundary formed from individual rod-like crystals in adjacent with each other is observed by the applicant by HR-TEM (high resolution transmission type electron microscopic method), to confirm that the crystal lattice had a continuity in the crystal grain boundary. This could be confirmed easily from that the lattice fringes to be observed are continued at the grain boundary.

The continuity of the crystal lattices at the crystal grain boundary is attributable to that the crystal grain boundary is such one referred to as "planar grain boundary". The planar grain boundary in this specification is defined as "planar boundary" described in "Characterization of High Efficiency Cast-Si Solar Cell Wafers by MBIC Measurement; Ryuichi Shimokawa and Yutaka Hayashi, Japanese Journal of Applied Physics Vol 27, No. 5, pp. 751–758, 1988".

According to the articles described above, the planar grain boundary includes, for example, twin grain boundary, special stacking fault and special twist grain boundary. The planar grain boundary is characterized in that it is electrically inactive. That is, since it does not function as a trap for inhibiting the transfer of carriers while this is the crystal grain boundary, it can be regarded that the boundary is not substantially present.

Particularly, when the crystallographic axis (axis vertical to the crystal face is a <110> axis, {211} twin crystal grain boundary is also referred to as a Σ3 coincidence grain boundary. The Σ value is a parameter as an index showing the commensurate degree of the coincidence grain boundary and it has been known that the commensurate property of the grain boundary is better as the Σ value is smaller.

As a result of close observation by the present applicant using TEM for the polysilicon film obtained by practicing the present invention, it has been found that most of the crystal grain boundaries (90% or more, typically 95% or more) are Σ3 coincidence grain boundaries, namely, {211} twin crystal grain boundaries.

In the crystal grain boundary formed between two crystal grains, in a case where the face direction of both of the crystals is {110}, assuming the angle formed with the lattice fringe corresponding to {111} face as theta, it has been known that this forms Σ3 coincidence grain boundary at theta =70.5°.

In the polysilicon film of this example, each of the lattice fringes of the crystal grains in adjacent at the crystal grain boundary are continuous just at an angle of about 75° and we have a conclusion to the effect that the crystal grain boundary is {211} twin crystal grain boundary.

When theta =38.90° it forms Σ9 coincidence grain boundary and such other crystal grain boundaries are also present.

Such a coincidence grain boundary is formed only between the crystal grains of an identical face direction. That is, in the polysilicon film obtained by practicing this invention, such a coincidence grain boundary can be formed over a wide range because the face direction is aligned substantially at {110}.

Such a crystal structure (more exactly, structure of the crystal grains boundary) show that two different crystal grains are joined with excellent commensurate property at the crystal grain boundary. That is, this provides a constitution in which the crystal lattices are arranged continuously hardly forming a trap level due to crystal defects or the like. Accordingly, the semiconductor thin film having such a crystal structure can be regarded as having no substantial crystal grain boundary.

Furthermore, it has been confirmed by TEM observation that most of defects present in the crystal grains are eliminated by a heat treatment step at such a high temperature as 700 to 1150° C. This is also apparent that the number of defects is remarkably decreased after the heat treatment step.

The difference in the number of defects appears as a difference by the spin density in electron spin resonance (ESR). At present it has been found that the spin density of the polysilicon film prepared in accordance with the manufacturing steps of this example is at least $5 \times 10^{17}$ spins/cm$^3$ or less (preferably $3 \times 10^{17}$ spins/cm$^3$ or less). However, since the measured value is approximate to the detection limit of an existent measuring apparatus, it is considered that the actual spin density is further lower.

From the descriptions above, since the crystal grain boundary is not substantially present in the polysilicon film obtained by practicing this example, it may be considered as a single crystal silicon film or a substantially single crystal silicon film. The present applicant refers the polysilicon having such a crystal structure as CGS (Continuous Grain Silicon).

Descriptions regarding CGS may be referred to the followings; Japanese Patent Laid-Open No. 10-294280 (1998) corresponding to U.S. application Ser. No. 09/027,344, U.S. application Ser. No. 09/120,290 or Japanese Patent Laid-Open No. 11-191628 (1999) corresponding to U.S. application Ser. No. 09/172,300 which are filed by the present applicant. The entire disclosure of them are incorporated herein by reference.

The following is a finding on the electrical characteristic of TFT.

TFT manufactured in this example shows electrical characteristics comparable with those of MOSFET. The following data are obtained from TFT manufactured by the present applicant.

(1) The sub-threshold coefficient as an index of the switching performance (rapid ON/OFF operation switching performance) is as small as 60 to 100 mV/decade (typically, 60 to 85 mV/decade) both for the n-channel TFT and the p-channel TFT.

(2) The electric field effect mobility (PFE) as an index of operation speed of TFT is as large as 200 to 650 cm$^2$/Vs (typically, 300 to 500 cm$^2$/Vs) for the n-channel TFT and 100 to 300 cm$^2$/Vs (typically, 150 to 200 cm$^2$/Vs) for the p-channel TFT.

(3) The threshold voltage ($V_{th}$) as an index of the driving voltage for TFT is as low as −0.5 to 1.5 V for the n-channel TFT and −1.5 to 0.5 V for the p-channel TFT.

As described above, it has been confirmed that excellent switching characteristics and high speed operation characteristics can be attained.

The following is a finding on circuit characteristics.

The frequency characteristics of a ring oscillator manufactured by using TFT formed by practicing this example are shown. The ring oscillator is a circuit connecting inverter circuits each comprising a CMOS structure in a ring-form in odd number stages, in which is utilized for determining a delay times per one stage of an inverter circuit. The ring oscillator used for the experiment has the following constitution.

The number of stages: 9

The thickness of a gate insulation film of the TFT: 30 nm and 50 nm

The gate length for the TFT: 0.6 μm

As a result of examining the oscillation frequency by the ring oscillator, an oscillation frequency of 1.04 GHz at the maximum value could be obtained. Further, a shift register as one of TEG (test element group) of an LSI circuit is manufactured and the operation frequency is confirmed. As a result, an output pulse at an operation frequency of 100 MHz is obtained in a shift register circuit, with a thickness of gate insulation film of 30 nm, a gate length of 0.6 μm, a power source voltage at 5 V and the number of stages of 50.

The surprising data by the ring oscillator and the shift register as described above show that TFT in this example has a performance (electric performance) comparable with or superior to that of MOSFET.

EXAMPLE 6

In this invention, the catalyst element used for the crystallization is put to gettering by using a portion to form a source region or a drain region of the active layer, but the catalyst element can be previously put to gettering out of the semiconductor film containing crystals prior to the formation of the gate insulation film.

In this case, the technique disclosed in Japanese Patent Laid-Open No. 10-270363 (1998) or Japanese Patent Laid-Open No. 10-247735 (1998) filed by the present applicant may be used. The former Japanese Patent corresponds to a U.S. application Ser. No. 09/050,182 and the latter Japanese Patent corresponds to a U.S. application Ser. No. 09/034,041.

In the technique disclosed in the patent publication, an element belonging to the group 15 is selectively added to the semiconductor film containing crystals, causing the region to function as a gettering region.

A catalyst element remaining in the channel forming region can further be reduced by the combination of this example and the gettering technique shown in Example 1. The technique of this example may be combined with that in Example 5. Further, it may also be combined with the technique in any of Examples 2 to 4.

EXAMPLE 7

Figure 8A:
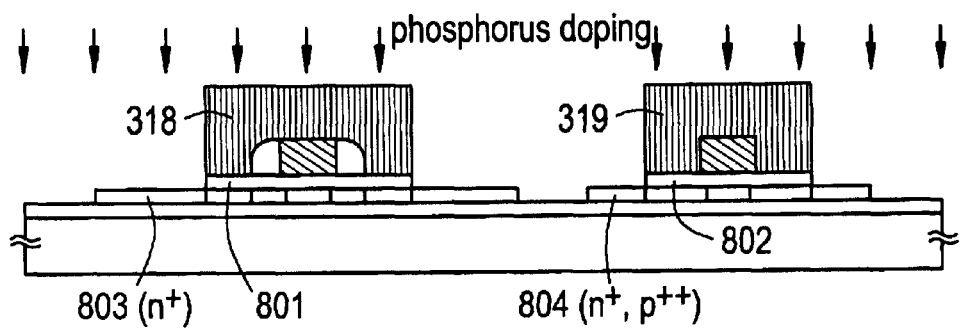
FIGS. 8A and 8B are views showing steps of manufacturing a CMOS circuit.
Figure 8B:
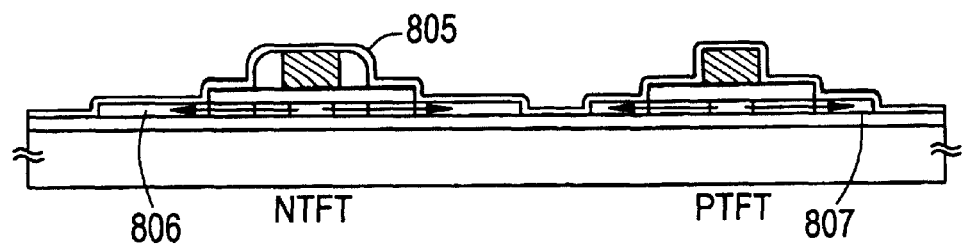

This example is to be explained with reference to FIGS. 8A and 8B in a case of forming a third impurity region and a fifth impurity region by steps different from those in Example 1.

At first, in accordance with the steps in Example 1, the process is proceeded before the phosphorus doping step in FIG. 4B.

In this Example, after forming resist masks 318, 319, a gate insulation film 305 is etched to form gate insulation films 801, 802.

Then, a phosphorus doping step is conducted in this state. In this example, an acceleration voltage is set somewhat lower as 10 keV since phosphorus is added directly to the exposed active layer.

A third impurity region 803 and a fifth impurity region 804 are thus formed. Further, the amount of dose is controlled such that phosphorus is contained at a concentration of $1\times10^{19}$–$1\times10^{21}$ atoms/cm$^3$ (typically, $1\times10^{20}$–$5\times10^{20}$ atoms/cm$^3$) in the third and the fifth impurity regions (FIG. 8A).

Subsequently, after removing the resist masks 318, 319, a silicon nitride film 805 is formed and a heat treatment step for gettering is conducted. Conditions for the heat treatment step may be referred to Example 1 (FIG. 8B).

By the heat treatment step, nickel is collected in the third impurity region 803 and the fifth impurity region 804 to form a third impurity region 806 and a fifth impurity region 807 containing nickel at a concentration of $1\times10^{17}$–$1\times10^{20}$ atoms/cm3 (typically, $1\times10^{18}$–$5\times10^{19}$ atoms/cm$^3$). The regions function as electrodes for connecting TFT with each of the wirings. Relation for the nickel concentration with the channel forming region is as has been already explained.

Subsequent steps may be in accordance with those in Example 1. Since the basic structure is identical with that in FIG. 1 or FIG. 4D, explanations are to be omitted. This example has a feature in that the gate insulation film of NTFT is finally in contact with the channel forming region, the first impurity region and the second impurity region but not in contact with the third impurity region, as well as the gate insulation film of PTFT is in contact with the channel forming region and the fourth impurity region but not in contact with the fifth impurity region.

The constitution of this example may also be combined optionally with any of Examples 2 to 6.

EXAMPLE 8

An example of conducting the step of forming the silicon nitride film 322 used in the gettering step (FIG. 4C) shown in Example 1 at the instance different from Example 1 is shown in FIGS. 9A to 9D for in example.

At first, process is carried out as far as the step shown in FIG. 3B in accordance with the steps of Example 1 and then a silicon nitride film 901 of 1 to 10 nm (preferably, 2 to 5 nm) thickness is disposed. Since the gate overlap structure using a side wall 902 can not be attained if the thickness of the silicon nitride film is excessively thick, it is desirably made thin. However, it is necessary to take care so as not to impair the effect of preventing oxidation of the gate wiring (in a case of tantalum) in the subsequent heat treatment steps.

Figure 9A:
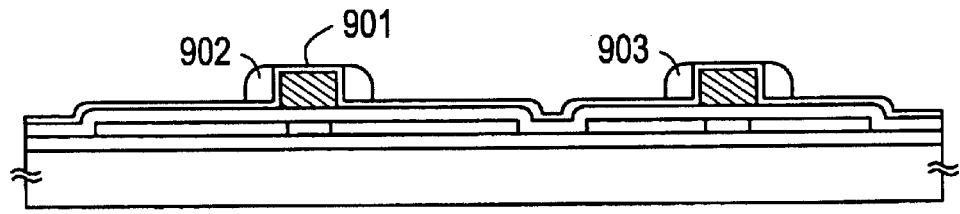
FIGS. 9A to 9D are views showing steps of manufacturing a CMOS circuit.

Then, an amorphous silicon film (not illustrated) is formed on the silicon nitride film 901 and side walls 902, 903 are formed by anisotropic etching (FIG. 9A).

The side walls 902, 903 may also be constituted as shown in Example 2 or Example 3.

Then, a step of adding phosphorus is conducted in the step in FIG. 9A and a second impurity region 904 is formed. Further, while the conditions for adding phosphorus may be identical with those in Example 1, it is desirable to optimize the acceleration voltage considering the thickness of the silicon nitride film 901. Although not illustrated, a second impurity region is formed also on the side of PTFT at this instance.

Figure 9B:
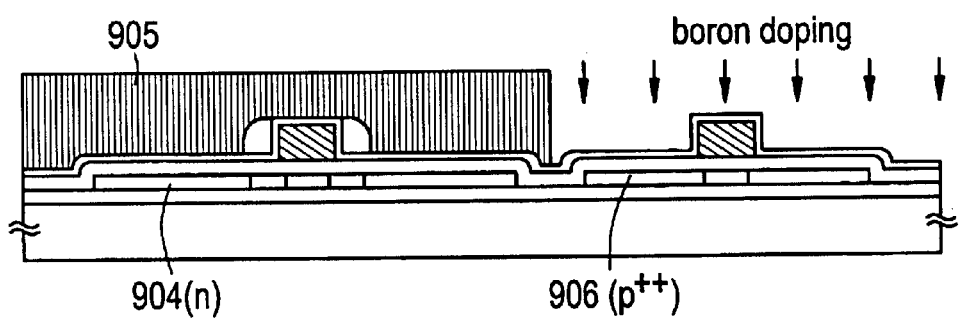

After forming the second impurity region 904, a resist mask 905 is formed and a boron doping step is conducted. Conditions in this step may also be identical with those in Example 1 but it is necessary to take the thickness of the silicon nitride film 901 into consideration. The second impurity region (not illustrated) thus formed in the phosphorus doping step described above is inverted to the p type, to form a fourth impurity region 906 (FIG. 9B).

Figure 9C:
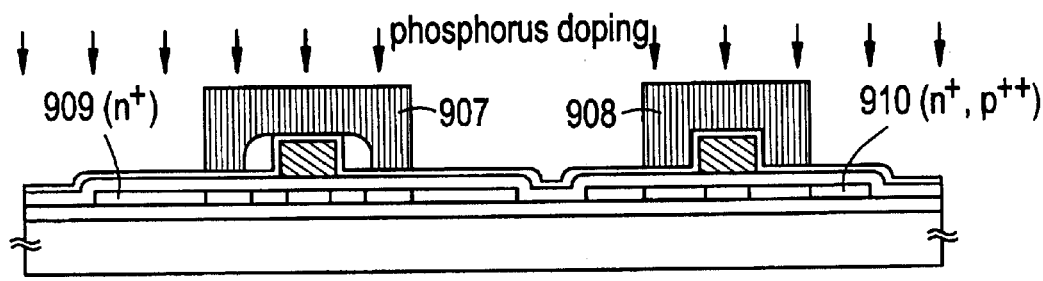
Figure 9D:
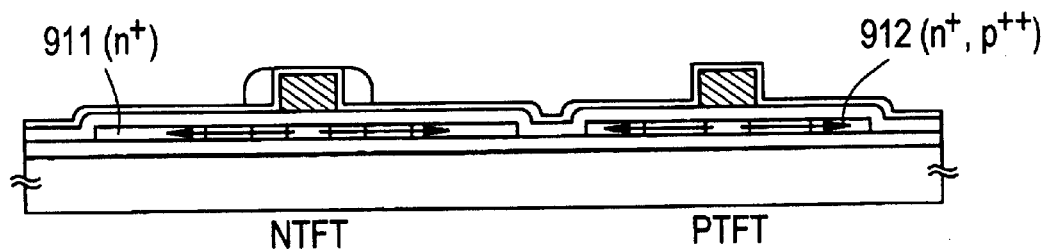

Then, the resist mask 905 is removed and resist masks 907, 908 are newly formed. In this state, a step of adding phosphorus is conducted again to form a third impurity region 909 and a fifth impurity region 910. The doping may be conducted under the conditions in accordance with Example 1, of course taking the thickness of the silicon nitride film into consideration (FIG. 9C).

Then, after removing the resist masks 907, 908, a heat treatment step is conducted for gettering under the same condition as in Example 1. After the heat treatment step, nickel is present at a concentration of $1\times10^{17}$–$1\times10^{20}$ atoms/cm$^3$ (typically, $1\times10^{18}$–$5\times10^{19}$ atoms/cm$^3$) in the third impurity region 911 and the fifth impurity region 912. The relation for the nickel concentration with the channel forming region is as has been described above.

After the steps described above, the same step as those in Example 1 are conducted successively to complete a CMOS circuit. The structure of the CMOS circuit manufactured in this example is identical with the structure of the CMOS circuit shown in FIG. 1 except for a portion where the silicon nitride film 901 is formed.

The constitution of this example may be combined optionally with the constitution of any of Examples 2 to 7.

EXAMPLE 9

Figure 10A:
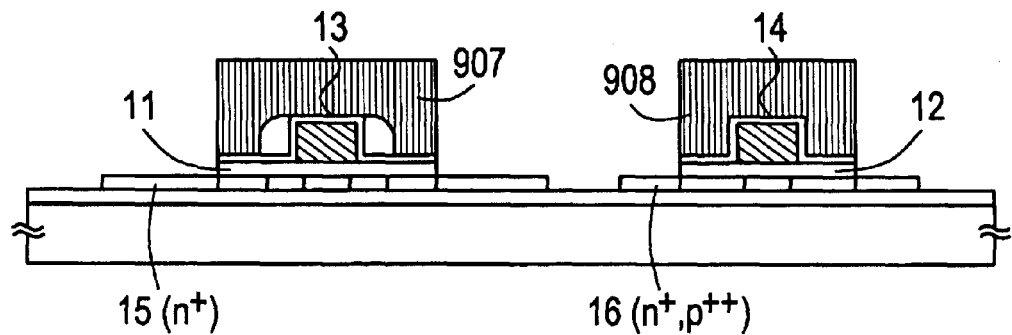
FIGS. 10A and 10B are views showing steps of manufacturing a CMOS circuit.
Figure 10B:
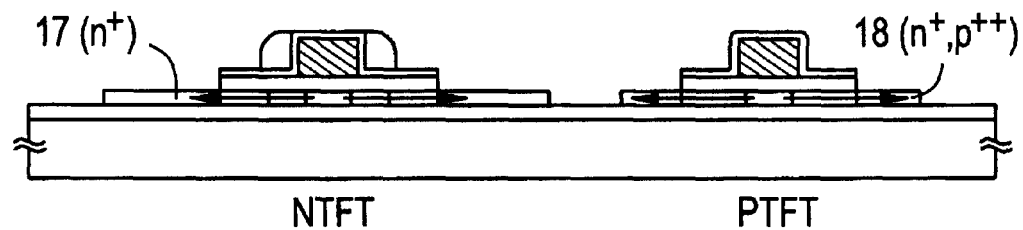

Explanation is to be made in this example to an example of combining Example 7 and Example 8 with reference to FIGS. 10A and 10B. At first in accordance with the steps in Example 8, the process is conducted as far as the phosphorus doping step in FIG. 9C). Then, the silicon nitride film 901 and the gate insulation film (not illustrated) are etched by using resist masks 907, 908 as a mask, to form gate insulation films 11, 12 and silicon nitride films 13, 14.

After completing etching for the silicon nitride film and the gate insulation film, a step of adding phosphorus is conducted in accordance with the conditions in Example 7, to form a third impurity region 15 and a fifth impurity region 16 (FIG. 10A).

Then, after removing the resist masks 907 and 908, a heat treatment step is conducted for gettering under the same conditions as in Example 7 or Example 1. After the heat treatment step, nickel is present at a concentration of $1\times10^{17}$–$1\times10^{20}$ atoms/cm$^3$ (typically, $1\times10^{18}$14 $5\times10^{19}$ atoms/cm$^3$) in the third impurity region 17 and the fifth impurity region 18. The relation for the nickel concentration with the channel forming region is as has been described above.

After the steps described above, a CMOS circuit is completed by conducting the same steps as those in Example 1 successively. Since the structure of the CMOS circuit manufactured by this example and the structure shown in FIG. 1 are identical except for the difference of the shape for the silicon nitride film covering the gate wiring and the gate insulation film, detailed explanations are to be omitted.

The constitution of this example may be optionally combined with the constitutions in any of Examples 2 to 6.

EXAMPLE 10

Figure 12A:
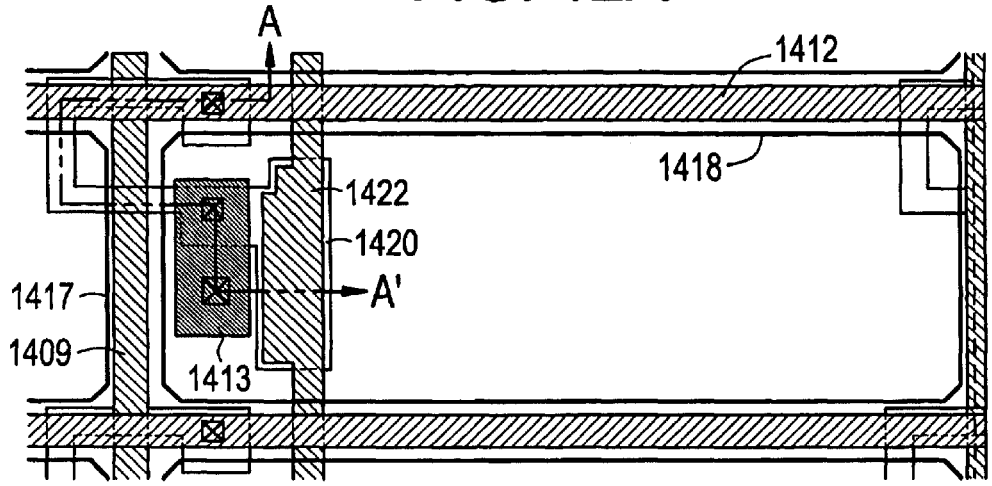
FIGS. 12A to 12C are views showing a structure of a pixel matrix circuit.
Figure 12B:
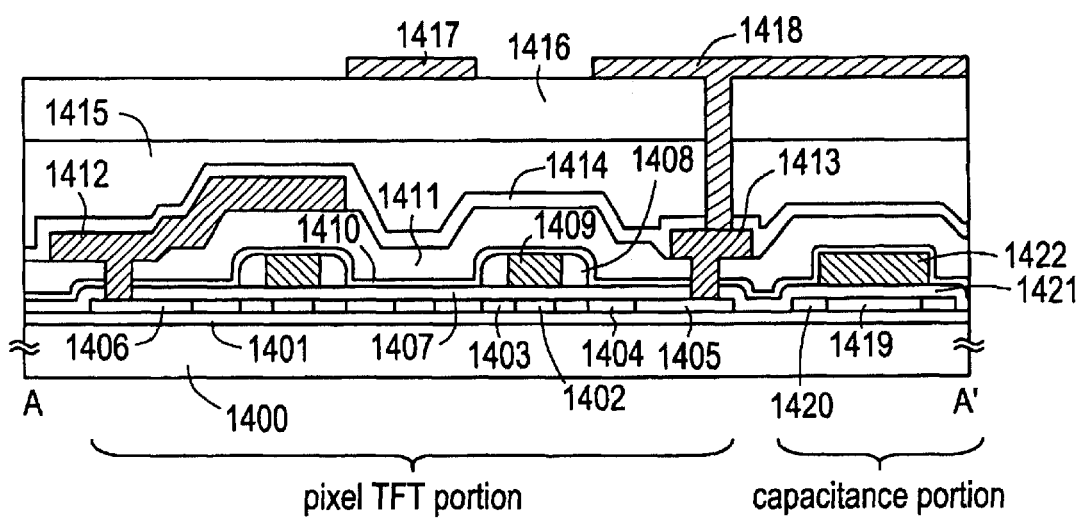
Figure 12C:
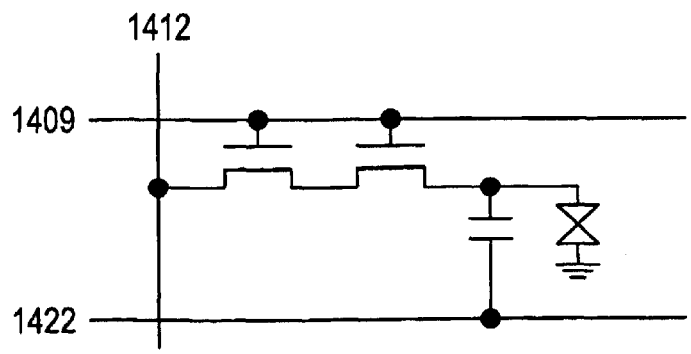

While the CMOS circuit has been explained as an example in Example 1, explanation is to be made to a case of applying this invention to a pixel matrix circuit in an active matrix type liquid crystal display panel in this example. Explanation is to be made with reference to FIGS. 12A to 12C. FIG. 12B is a cross sectional structural view taken along line A–A' in FIG. 12A, and FIG. 12C is an equivalent circuit diagram thereof. Further, since the pixel TFT has a double gate structure in which NTFTs of an identical structure are connected in series, explanation is to be made only for one of them with reference numerals being attached.

At first, in accordance with the steps in Example 1, an underlying film 1401, channel forming region 1402, first impurity region 1403, second impurity region 1404, third impurity regions 1405, 1406, gate insulation film 1407, gate wiring 1409, side wall 1408, silicon nitride film 1410, a first interlayer insulation film 1411, a source wiring 1412 and a drain wiring 1413 are formed on a substrate 1400.

Then, a silicon nitride film 1414 as a passivation film and a second interlayer insulation film 1415 are formed on each of the wirings. Further, a third interlayer insulation film 1416 is formed thereover, and a pixel electrode 1418 comprising a transparent conductive film such as of ITO and SnO$_2$ is formed. Further, 1417 also denotes a pixel electrode.

Further, a capacitance portion is formed by putting an insulation film 1421 (extended from the gate insulation film 1407) between a capacitance wiring 1422 as an upper electrode and a lower electrode comprising an undoped silicon layer (an intrinsic semiconductor layer or semiconductor layer with addition of boron at a concentration of $1\times10^{10}$ to $5\times10^{18}$ atoms/cm$^3$) 1419 and an impurity region 1420 (containing phosphorus at a concentration identical with the first impurity region 1403). The capacitance wiring 1422 is formed simultaneously with the gate wiring 1409 for the pixel TFT and grounded to the earth or connected to a fixed voltage.

Further, the insulation film 1421 is constituted with the same material as that for the gate insulation film 1407 of the pixel TFT. Further, the undoped silicon layer 1419 is constituted with the same material as that for the channel forming region 1402 of the pixel TFT.

In this way, the pixel TFT, the capacitance portion and the CMOS circuit could be manufactured and simultaneously and integrated on one identical substrate. In this example, a transmission type LCD has been explained as an example but it is not limited only thereto.

For example, it is possible to manufacture a reflection type LCD by using a reflective electroconductive material for the pixel electrode and properly conducting change of the pattern for the pixel electrode or addition/deletion of several steps.

Further, the gate wiring for the pixel TFT of a pixel matrix circuit is formed as a double gate structure, it may be a multi-gate structure such as a triple gate structure in order to reduce scattering of an off current. Further, it may be a single gate structure for improving the aperture ratio.

The constitution of this example may be combined optionally with the constitution of any of Examples 1 to 9.

EXAMPLE 11

Figure 13:
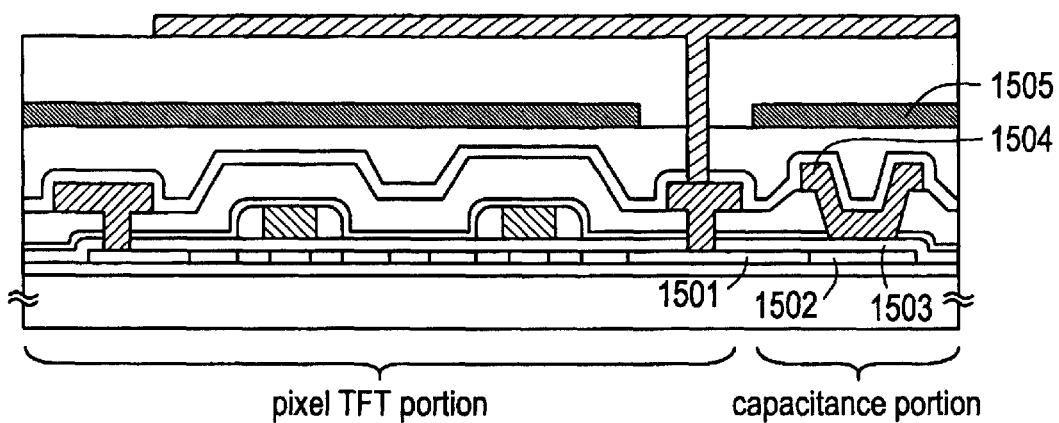
FIG. 13 is a view showing a structure of a pixel matrix circuit.

An example of forming a capacitance portion of a structure different from Example 10 is shown in FIG. 13 in this example. Since the basic constitution is substantially identical with that for Example 10, explanation is to be made only taking notice on the difference. The capacitance portion in this example is formed of an impurity region (containing phosphorus at a concentration identical with that in the second impurity region) 1502, an insulation film 1503 extended from the gate insulation film and a capacitance wiring 1504.

Further, a black mask 1505 is disposed to the substrate on the side of forming TFT. The capacitance wiring 1504 is formed simultaneously with the source wiring and the drain wiring for the pixel TFT and grounded to the earth or connected with a fixed voltage. In this way, the pixel TFT, the capacitance portion and the CMOS circuit can be manufactured simultaneously and integrated on one identical substrate. It is possible to combine the constitution of this example with any of Examples 1 to 9.

EXAMPLE 12

Figure 14:
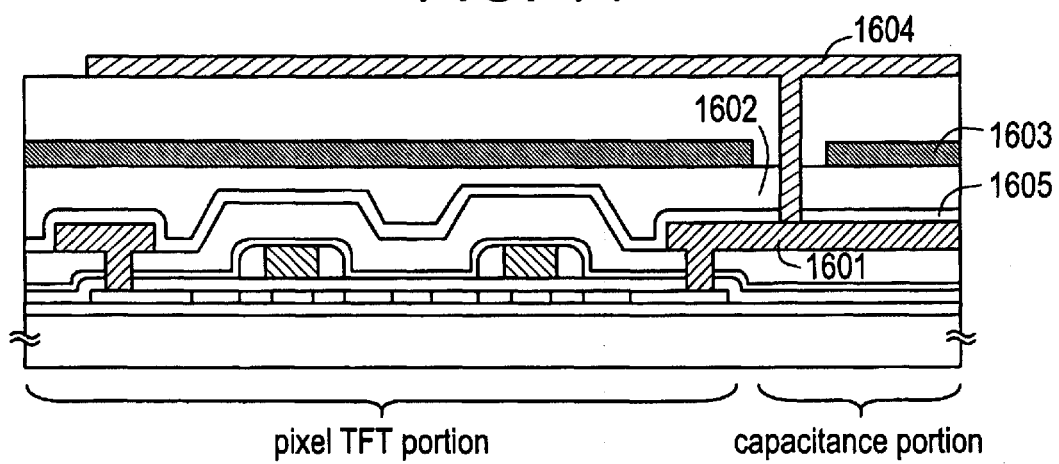
FIG. 14 is a view showing the structure of a pixel matrix circuit.

An example of forming a capacitance portion different from that in Examples 10, 11 is shown in FIG. 14 in this example. Since the basic constitution is substantially identical with that for Example 10, explanation is to be made while taking notice only on the difference. At first, in accordance with Example 1, a second interlayer insulation film 1602 and a black mask 1603 comprising a light shielding conductive material are formed. Further, a third interlayer insulation film is formed thereon and a pixel electrode 1604 comprising a transparent conductive film such as of ITO and $SnO_2$ is formed.

The black mask 1603 covers the pixel TFT portion and constitutes the capacitance portion together with the drain wiring 1601. In this embodiment, a dielectric of the capacitance portion is the second interlayer insulation film 1602. Alternatively, it may be adopted such a structure that a portion of the second interlayer insulation film 1602 is etched to expose the silicon nitride film 1605 disposed as a passivation film, and only the silicon nitride film 1605 is used as the dielectric.

In this way, the pixel TFT, the capacitance portion and the CMOS circuit can be manufactured simultaneously and integrated on one identical substrate. It is of course possible to combine the constitution of this example with any of Examples 1 to 9.

EXAMPLE 13

Figure 15:
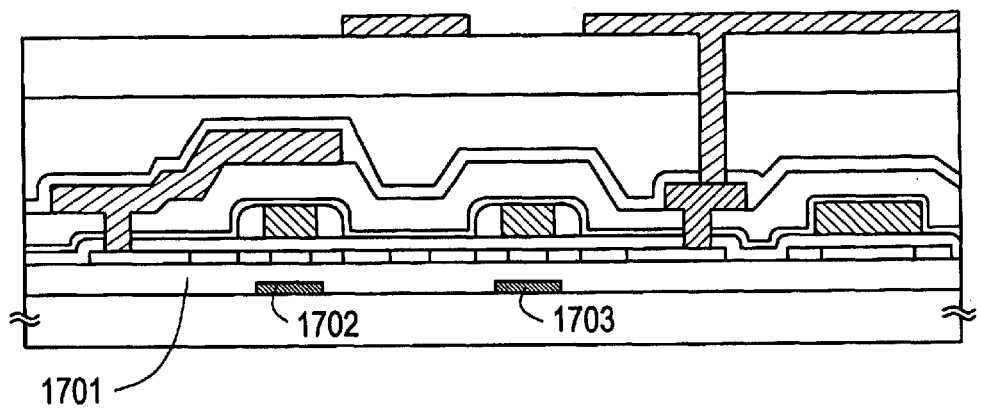
FIG. 15 is a view showing a structure of a pixel matrix.

This example is to be explained with reference to FIG. 15. In this example, back gate electrodes 1702, 1703 are formed by way of an insulation film 1701 below the channel forming region of the pixel TFT. The back gate electrode referred to herein is an electrode disposed with an aim of controlling a threshold voltage or reducing an off current, which is a pseudo gate electrode disposed on the side of the active layer (channel forming region) opposite to the gate wiring.

Any conductive material may be used with no trouble for the back gate electrodes 1702, 1703. Since a heat treatment step at about 550 to 650° C. is included in the gettering step for the catalyst element in the present invention, heat resistance capable of withstanding the temperature is required. For example, it is effective to use a silicon gate electrode using a polysilicon film (which may be intrinsic or added with impurities).

Further, since the insulation film 1701 functions as the gate insulation film of the back gate electrode, an insulation film of good film quality such as with less pinholes is used. While the silicon oxynitride film is used in this example, a silicon oxide film or a silicon nitride film may also be used. However, since TFT is manufactured thereon, a material capable of attaining a surface as flat as possible is desired for preparing TFT thereon.

In this example, an electric field distribution in the channel forming region is electrically changed by applying a voltage to the back gate electrodes 1702, 1703 thereby enabling to control the threshold voltage or reduce the off current. This is particularly effective to the pixel TFT as in this example.

The constitution of this example can be combined optionally with any of Examples 1 to 12.

EXAMPLE 14

Figure 16:
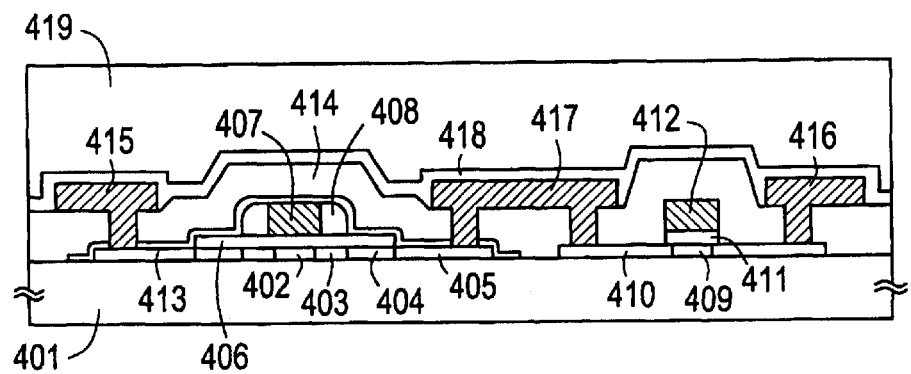
FIG. 16 is a view showing a cross section of a CMOS circuit.

This example is to be explained with reference to FIG. 16. This is an example in which a portion of a gate insulation film and a protection film is different from the structure shown in the embodiment. FIG. 16 is a cross sectional view and an upper plan view thereof corresponds to FIG. 11. In FIG. 16, 401 denotes a substrate having an insulative surface.

The active layer of NTFT is formed including a channel forming region 402, a pair of first impurity regions 403, a pair of second impurity regions 404 and a pair of third impurity regions 405.

Further, a channel forming region 402 (also 409) is an intrinsic semiconductor layer or a semiconductor layer with addition of boron at a concentration of $1 \times 10^{16}$–$5 \times 10^{18}$ atoms/cm$^3$.

Gate insulation films 406, 411 are formed on the thus formed active layer. In the case shown in FIG. 16, a gate insulation film 406 is formed in a state overlapping the second impurity region 404. This is a structure in view of the process when the second impurity region 404 is formed. In other words, the gate insulation film 406 is disposed in contact with the channel forming region 402, the first impurity region 403 and the second impurity region 404.

Further, gate wirings 407 and 412 are disposed on gate insulation films 406 and 411, respectively. It is preferable that a protection film is formed on the gate wiring in order to endure a heat treatment.

There are also shown a side wall 408, protection film 413, first interlayer insulation film 414, source wirings 415 and 416, drain wiring 417, silicon nitride layer 418 and second interlayer insulation film 419.

An example of steps for obtaining the structure shown in FIG. 16 is to be explained with reference to FIGS. 17A to 17E, FIGS. 18A to 18D and FIGS. 19A to 19C. The upper plan view thereof is identical with FIG. 12A.

At first, an underlying film comprising a silicon oxide film 1002 is formed to a thickness of 200 nm on a substrate 1001 in the same manner as in Example 1. A quartz substrate and a glass substrate, for example, are used as the substrate 1001.

Then, an amorphous silicon film of 30 nm thickness is formed on the silicon oxide film 1002 in the same manner as in Example 1 by a plasma CVD method and, after a hydrogen-releasing treatment, a polysilicon film (crystalline silicon film or polycrystal silicon film) is formed by a thermal crystallization method using a catalyst element.

Figure 17A:
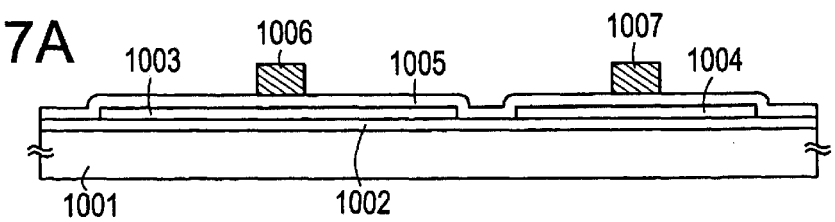
FIGS. 17A to 17E are views showing steps of manufacturing a CMOS circuit.

Then, the crystalline silicon film is patterned to form active layers 1003, 1004 comprising an island shape silicon layer shown in FIG. 17A. After forming the polysilicon film, an excimer laser beam may be irradiated to improve the crystallinity. Alternatively, this it may be conducted after forming the active layers 1003, 1004. Since known technique may be used for the irradiation step of the excimer laser beam, detailed explanations are to be omitted.

Then, in the same manner as in Example 1, a gate insulation film 1005 comprising a silicon oxide film is formed covering the active layers 1003, 1004, on which a gate wirings (including gate electrode) 1006, 1007 comprising a laminated structure of tantalum and tantalum nitride are formed. The thickness of the gate insulation film 1005 in this case is 100 nm (FIG. 17A).

After thus obtaining the state shown in FIG. 17A, a first phosphorus doping step (phosphorus addition step) is conducted in the same manner as in Example 1. Further, the amount of dose is controlled such that the first impurity regions 1008, 1009 thus formed had a length (width) of 0.5 μm and the phosphorus concentration of $1 \times 10^{17}$ atoms/cm$^3$. The phosphorus concentration in this case is indicated by "n⁻" as in Example 1.

Figure 17B:
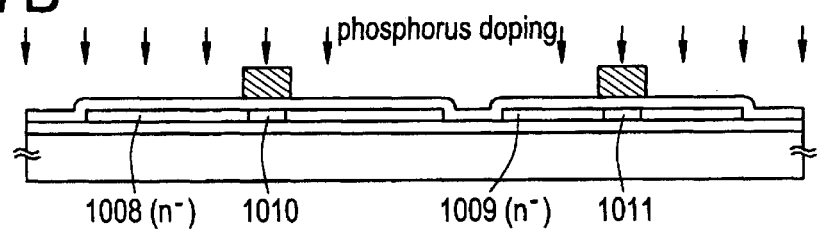

The first impurity regions 1008, 1009 are formed in self-alignment using the gate wirings 1006, 1007 as a mask. In this case, an intrinsic crystalline silicon layer is left just below the gate wirings 1006, 1007, to form channel forming regions 1010, 1011. However, since a portion of phosphorus is added actually in a state creeping to the inside of the gate wiring, it provided a structure in which the gate wirings 1006, 1007 and the first impurity regions 1008, 1009 overlap to each other (FIG. 17B).

Then, an amorphous silicon layer at a thickness of 0.1 to 1 μm (typically 0.1 to 0.3 μm) is formed so as to cover the gate wirings 1006, 1007 in the same manner as in Example 1, and anisotropic etching is conducted to form side walls 1012, 1013. The width for the side walls 1012, 1013 (thickness as viewed from the side wall of the gate wiring) is 0.2 μm (FIG. 17C).

Since an amorphous silicon layer with no addition of impurities is used in this example like that in Example 1, side walls comprising the intrinsic silicon layer are formed.

Figure 17C:
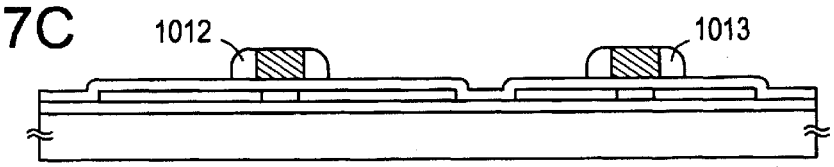

After obtaining the state shown in FIG. 17C, a second phosphorus doping step is conducted in the same manner as in Example 1. Also in this case, the acceleration voltage is set to 80 KeV in the same manner as in the first step. Further, the amount of dose is controlled such that phosphorus is contained at a concentration of $1 \times 10^{18}$ atoms/cm$^3$ in the second impurity regions 1014, 1015 formed in this step. The concentration of phosphorus is represented by "n" in the same manner as in Example 1.

In the phosphorus doping step shown in FIG. 17D, the first impurity regions 1008, 1009 are left only just below the side walls 1012, 1013. The first impurity region 403 shown in FIG. 16 is defined in this step. The first impurity region 403 functions as a first LDD region.

Then, a resist mask 1016 covering a portion of NTFT and a resist mask 1017 covering a portion of PTFT are formed. In this state, a gate insulation film 1018 fabricated by dry etching the gate insulation film 1005 is formed (FIG. 17E). In this case, in PTFT, an end of the active layer is exposed by a distance X (1 to 20 μm, typically 2 μm) shown in FIG. 17E by the resist mask 1017 covering a portion of PTFT.

Further, in this case, the length of a portion of the gate insulation film 1018 protruding to the outside from the side wall 1012 (length of a portion of the gate insulation film 1018 in contact with the second impurity region 1014) determines the length (width) of the second impurity region 404 shown in FIG. 16. Accordingly, it is necessary to conduct mask alignment at a good accuracy between the resist mask 1016 and 1017. Since one LDD region is used in the prior art, scattering of the width gave a significant effect on the electrical characteristics but since this example substantially includes two LDD regions, slight scattering for the width of the second impurity region, if any, resulted in no problems.

Figure 17D:
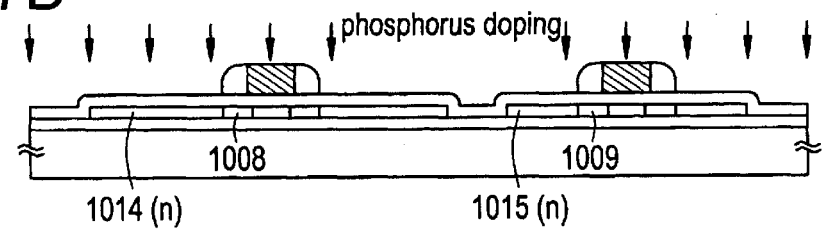
Figure 17E:
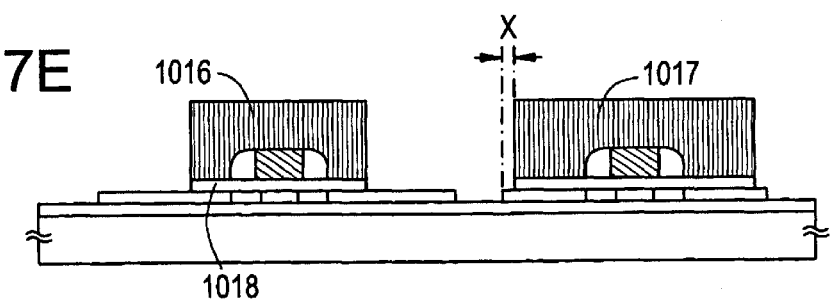
Figure 18A:
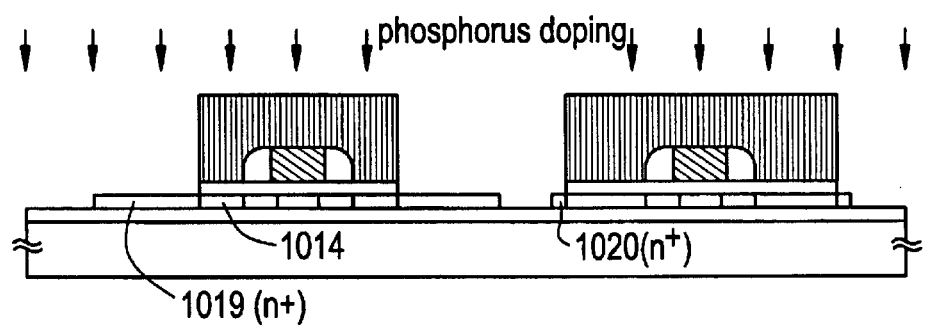
FIGS. 18A to 18D are views showing steps of manufacturing a CMOS circuit.

After obtaining the state shown in FIG. 17E, a third phosphorus doping step is conducted. Since phosphorus is added to the exposed active layer, the acceleration voltage is set lower as 10 keV. The amount of dose is controlled such that phosphorus is contained at a concentration of $5 \times 10^{20}$ atoms/cm$^3$ in the third impurity regions 1019, 1020 thus formed. The concentration of phosphorus in this case is represented as "N$^+$" (FIG. 18A).

In this step, since phosphorus is not added to a portion shielded by the resist mask 1016, the second impurity region 1014 is left as it is in the portion. Accordingly, the second impurity region 404 shown in FIG. 16 is defined. Simultaneously, the third impurity region 405 shown in FIG. 16 is also defined.

The second impurity region 1014 functions as a second LDD region while the third impurity region 405 functions as a source region or a drain region.

In this example, the addition amount of phosphorus is desirably controlled such that the concentration in the third impurity regions 1019, 1020 is at least $1 \times 10^{19}$ atoms/cm$^3$ or more (preferably, $1 \times 10^{20} - 5 \times 10^{21}$ atoms/cm$^3$). If the concentration is lower, there may be a worry that no effective gettering effect with phosphorus can be expected.

Then, the resist masks 1016, 1017 are removed and a protection film 1021 covering the entire NTFT and PTFT is formed. In this case, the silicon nitride film disposed at the protection film 1021 prevents oxidation of the tantalum film used as the material for the gate wiring. If the gate wiring is less oxidized or an oxide film formed by oxidation is easily etched, there are no substantial problems. However, since the tantalum film is easily oxidized, as well as a tantalum oxide film extremely less etched, it is desirable to dispose the silicon nitride film 1021. Instead of the silicon nitride film 1021, a silicon oxide film, a silicon oxynitride film or a laminate film thereof can also be used and the range for the film thickness is from 1 to 30 nm, preferably, 5 to 20 nm (silicon nitride film at a thickness of 10 μm in this example). Further, a silicon nitride film containing boron by a sputtering method (using a boron-containing silicon target and using an Ar gas and a nitrogen gas) is favorable since it has a high heat conductivity and serves as a heat dissipation layer.

Figure 18B:
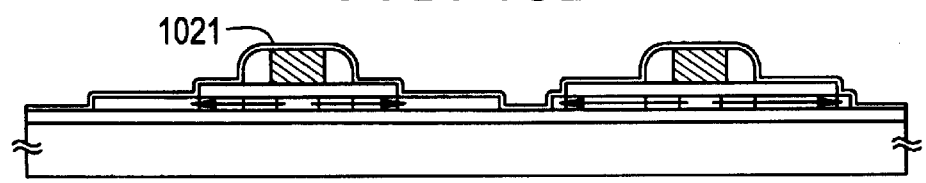

Then, a heat treatment is conducted at 500 to 650° C., typically, 550 to 600° C. for 2 to 24 hours, typically, 4 to 12 hours (at 600° C. for 12 hours in a nitrogen atmosphere in this example) (FIG. 18B). The heat treatment removes nickel remaining in the active layer. This example uses the technique described in Japanese Patent Laid-Open No. 10-270363 as a technique for removing nickel. The technique described in Japanese Patent Laid-Open No. 10-270363 is a technique of removing nickel used for the crystallization of the semiconductor by utilizing a gettering effect of an element belonging to the group 15 (typically phosphorus) after crystallization. By the heat treatment, the catalyst element (nickel in this example) remained in the active layer is moved in the direction of an arrow and captured (gettering) in the third impurity regions 1019, 1020. However, it is necessary to incorporate phosphorus at a concentration of $1 \times 10^{19}$ atoms/cm$^3$ or more, preferably, $1 \times 10^{20} - 5 \times 10^{21}$ atoms/cm$^3$ in the third impurity regions 1019, 1020 before the heat treatment. The third impurity regions 1019, 1020 are referred to as gettering regions.

The nickel concentration contained in the thus formed channel regions 1010, 1011 is reduced as low as $2 \times 10^{17}$ atoms/cm$^3$ or lower, typically, $1 \times 10^{14} - 5 \times 10^{16}$ atoms/cm$^3$. Further, the concentration of nickel contained in the third impurity regions 1019, 1020 is $1 \times 10^{18} - 1 \times 10^{21}$ atoms/cm$^3$, typically, $5 \times 10^{18} - 5 \times 10^{19}$ atoms/cm$^3$. Further, the heat treatment can activate impurities (phosphorus and boron) in the film. Further, since the upper part of the gate wirings 1006, 1007 are in contact with the silicon nitride film 1021, while the sides of the wirings are in contact with the side walls 1012, 1013, the wirings are scarcely denatured (oxidized or the like) by the heat treatment.

Figure 18C:
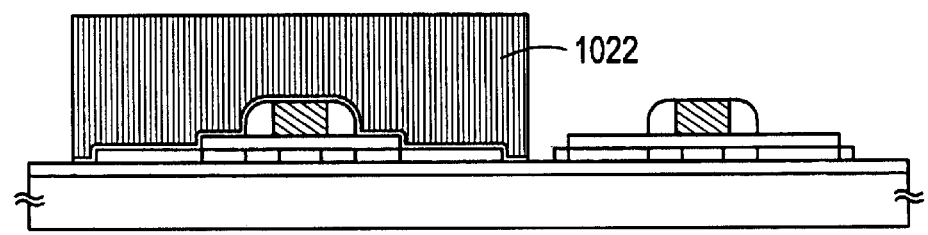

Then, a resist mask 1022 covering the entire NTFT is formed. Then, the silicon nitride film 1021 of PTFT is at first removed (FIG. 18C).

Figure 18D:
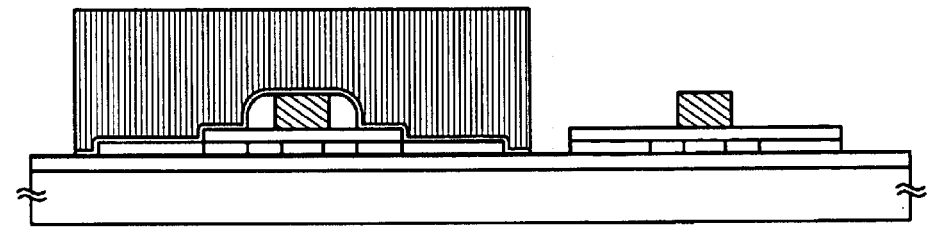

Successively, the side wall 1013 and the third impurity region 1020 of PTFT are removed (FIG. 18D). The width of the active layer of PTFT is defined by the removing step.

Figure 19A:
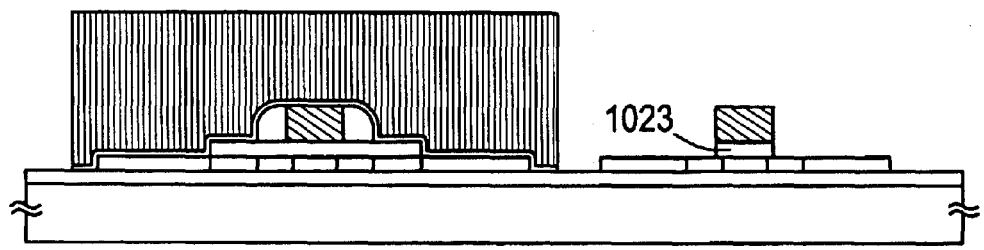
FIGS. 19A to 19C are views showing steps of manufacturing a CMOS circuit.

Then, the gate insulation film 1005 is dry etched to form a gate insulation film 23 of the same shape as the gate wiring 1007 (FIG. 19A).

After obtaining the state shown in FIG. 19A, a boron doping step (boron addition step) is conducted. In this case, the acceleration voltage is set to 10 keV and the amount of dose is controlled such that boron is contained at a concentration of $3 \times 10^{21}$ atoms/cm$^3$ in the thus formed fourth impurity region 1024. The concentration of boron in this case is indicated by "P$^{++}$" (FIG. 19B).

In this case, since boron is added also creeping to the inside of the gate wiring 1007, the channel forming region 1011 is formed to the inside of the gate wiring 1007. Further, the conduction type of the first impurity region 1009 and the second impurity region 1015 formed on the side of the PTFT in this step is inverted by boron into the p type. Accordingly, while the resistance value varies actually in a portion originally constituting the first impurity region and a portion originally constituting the second impurity region, but since boron is added at a concentration sufficiently high, there are no problems.

In this way, the fourth impurity region 410 shown in FIG. 16 is defined. The fourth impurity region 1024 is completely formed in self-alignment using the gate wiring 1007 as a mask and functions as a source region or a drain region. In this example, PTFT is formed with neither LDD region nor offset region, but there are no problems since PTFT is highly reliable by its nature and it is, rather, convenient not to dispose the LDD region since on current can be increased.

Figure 19B:
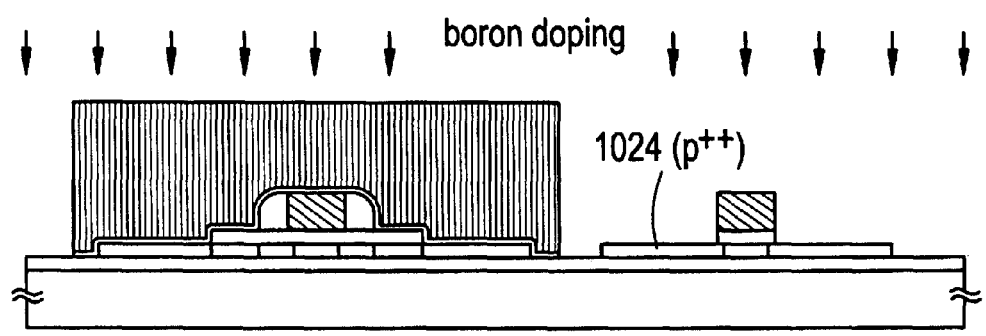

Finally, as shown in FIG. 19B, the channel forming region, the first impurity region, the second impurity region and the third impurity region are formed in the active layer of NTFT, while only the channel forming region and the fourth impurity region are formed in the active layer of PTFT.

After obtaining the state shown in FIG. 19B in this way, the resist mask 1022 is removed, the boron contained in the fourth impurity region 1024 is activated by heating or irradiating laser beam. It is preferable that a film for protecting the gate wirings from heat is formed on the gate wirings. And then a first interlayer insulation film 1025 is formed to a thickness of 1 µm. As the first interlayer insulation film 1025, a silicon oxide film, silicon nitride film, silicon oxynitride film, organic resin film or a laminated film thereof can be used. In this example, an acrylic resin film is adopted.

After forming the first layer insulation film 1025, source wirings 1026, 1027 and a drain wiring 1028 made of a metallic material are formed. In this example, a three layered wiring of a structure putting a titanium-containing aluminum film between titanium films is used.

Further, in a case of using a resin film referred to as BCB (Benzocyclobuten) as the first interlayer insulation film 1025, flatness is improved and it is possible to use copper as the wiring material. Since copper has low wiring resistance, it is extremely effective as the wiring material.

When the source wiring and the drain wiring are formed in this way, a silicon nitride film of 50 nm thickness is formed as a passivation film. Further, a second interlayer insulation film 1030 is formed thereon. As the second interlayer insulation film 1030, it is possible to use the same material as that for the first interlayer insulation film 1025. In this example, a laminated structure of an acrylic resin film on a silicon oxide film of 50 nm thickness is adopted.

Figure 19C:
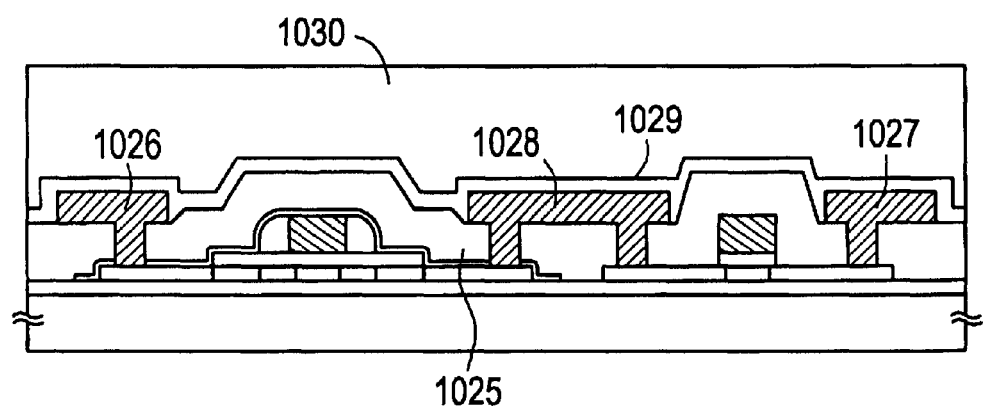

By way of the steps as described above, a CMOS circuit of a structure shown in FIG. 19C is completed. Since NTFT has excellent reliability, the CMOS circuit formed in this example is remarkably improved for the reliability as the entire circuit. Further, in the structure as in this example, since balance of characteristics (balance of electric characteristics) between NTFT and PTFT is improved, it has been found that operation failure less occurs.

Further, the undesired effect of nickel (catalyst element) in the channel forming region which caused a worry in a case of using the prior art described in Japanese Patent Laid-Open No. 7-130652 could be overcome by conducting the gettering step as shown in this example. However, the structure explained in this example is only an example and it is not necessarily limited to the structure shown in FIG. 16, FIGS. 17A to 17E, FIGS. 18A to 18D and FIGS. 19A to 19C. What is important in this invention is a structure of the active layer of NTFT and the effect of this invention can be obtained so long as the structure is identical.

The constitution of this example can be combined optionally with any of Examples 2 to 6.

EXAMPLE 15

This example shows an example of forming a crystalline semiconductor film as the active layer by a laser beam or an intense light in the crystallizing step of Example 1 or Example 14. An amorphous silicon film of 30 nm thickness is formed on a silicon oxide film formed on a glass substrate by a plasma CVD method and, after hydrogen-releasing treatment, excimer laser annealing is conducted to form a polysilicon film (crystalline silicon film or polysilicon film).

The crystallization step may be conducted by using known laser crystallization technique or thermal crystallization technique. As the laser to be used, UV-ray lasers such as various kinds of excimer lasers, IR lasers and visible ray lasers such as YAG laser, glass laser and ruby laser are preferred. Further, continuously oscillation lasers such as an argon laser may also be used. In this example, a KrF excimer laser of a pulse oscillation laser is processed into a linear form and the amorphous silicon film is crystallized by irradiating the KrF excimer laser having a linear form.

In this example, the polysilicon film is obtained by crystallizing an initial film of an amorphous silicon film by laser annealing but a microcrystalline silicon film may also be used as the initial film, or a polysilicon film may be formed directly. Of course, laser annealing may be conducted to the polysilicon film formed directly. Alternatively, furnace annealing may be conducted instead of laser annealing. Further, a catalyst element (nickel or the like) may be added to the initial film before laser crystallization.

A crystalline semiconductor film (crystalline silicon film or crystalline germanium film) may be formed by using the techniques as described above and patterning may be conducted to form an active layer. Subsequent steps may be in accordance with Example 1 or Example 14.

EXAMPLE 16

Figure 20A:
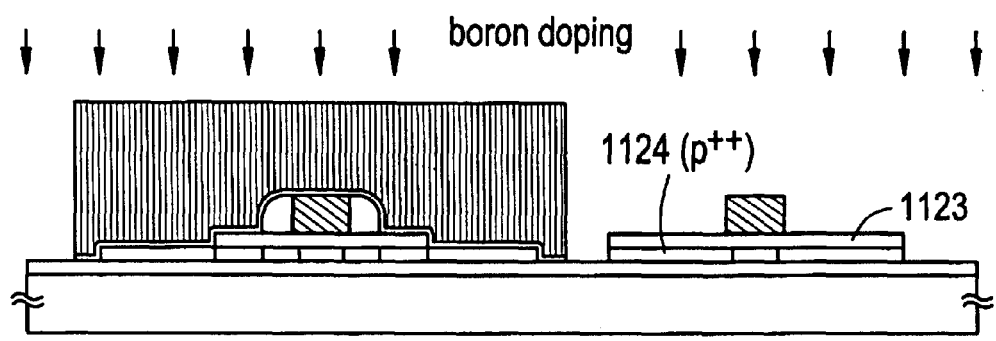
FIGS. 20A and 20B are views showing steps of manufacturing a CMOS circuit.
Figure 20B:
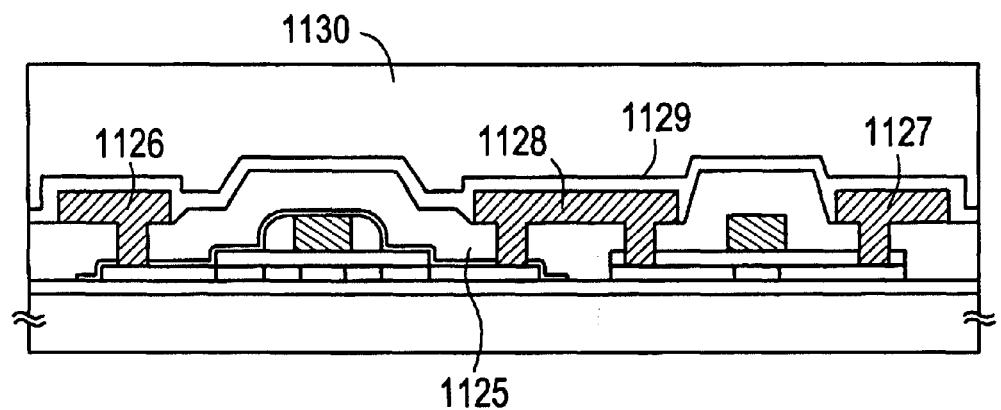

For this example, FIGS. 20A and 20B show an example of not conducting the step of forming the gate insulation film 1023 in Example 14 shown in FIG. 19A but boron doping is conducted through a gate insulation film. Since this example is identical with Example 1 as far as the steps shown by FIG. 18D, explanations for the steps are to be omitted.

In this example, after obtaining the state shown in FIG. 18D in accordance with Example 14, a boron addition step is conducted (FIG. 20A). In this case, the amount of dose and the acceleration voltage are controlled such that boron contained at a concentration of $3\times10^{20}$ atoms/cm$^3$ in the fourth impurity region 1124 by way of the gate insulation film 1123.

After obtaining the state shown in FIG. 20A as described above, the resist mask is removed and the boron contained in the fourth impurity region 1124 is activated by heating or irradiating laser beam. It is preferable that a film for protecting the gate wirings from heat is formed on the gate wirings. And then a first interlayer insulation film 1125, source wirings 1126, 1127 and a drain wiring 1128 made of metallic material, a passivation film 1129 and a second interlayer insulation film 1130 are formed in the same manner as in Example 1. It is preferred that the thickness of the gate insulation film 1123 and the silicon nitride film is controlled so as not to damage the active layer considering the etching rate, and the contact hole for forming the source wirings 1126, 1127 and the drain wiring 1128 are controlled to a substantial identical depth.

By way of the steps described above, the CMOS circuit of a structure shown in FIG. 20B is completed. In this way, the steps could be simplified. This example has a feature in that the gate insulation film is in contact with the channel forming region, the first impurity region and the second impurity region but not with the third impurity region finally, as well as the gate insulation film of PTFT is in contact with the channel forming region and the fourth impurity region. Of course, this constitution may be combined with Example 15.

EXAMPLE 17

For this example, FIG. 21 shows an example of forming a protection film at the instance different from Example 14. While the protection film is formed after the third phosphorus doping step in Example 14, a protection film 1200 is formed in the step after obtaining the state shown in FIG. 17C in this example. Since the basic constitution is identical with that in Example 1, explanation is to be made while taking notice only on the differences. For the simplicity, same reference numeral as those in Example 14 are used except for the protection film.

Figure 21A:
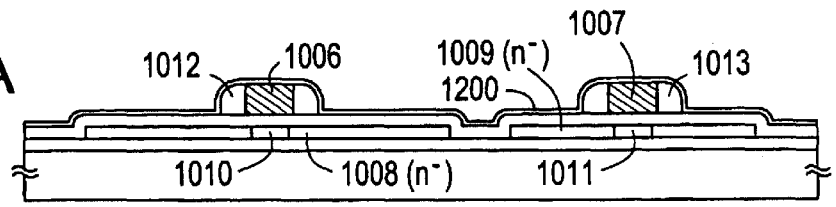
FIGS. 21A to 21E are views showing steps of manufacturing a CMOS circuit.

At first, in accordance with Example 14, an identical state with that in FIG. 17C is formed. Then, a protection film 1100 of 20 nm thickness comprising a silicon nitride film is formed (FIG. 21A).

Then, a second phosphorus doping step (phosphorus adding step) is conducted to form a second impurity region. The doping condition (amount of dose, accelerate voltage and the like) is controlled while taking the thickness of the protection film 1200 also into consideration. Further, the protection film 1200 may be formed after the second phosphorus doping step, not forming the protection film before the second phosphorus doping step.

Then, the resist masks 1016, 1017 are formed. Then, the protection film and the gate insulation film are selectively removed using the resist masks 1016, 1017 as a mask. The thus formed protection film 1201 and the gate insulation film 1018 have an identical patterned shape to expose a portion of the active layer. Then, a third phosphorus doping step is conducted, to form third impurity regions 1019, 1020 (FIG. 21B).

Figure 21B:
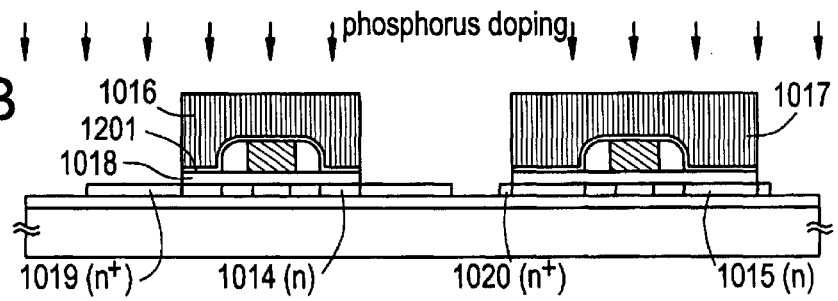
Figure 21C:
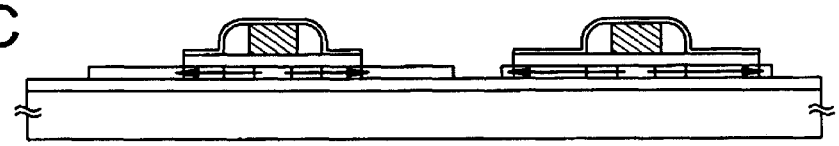

Thus, when the state shown in FIG. 21B is obtained, the resist masks 1016, 1017 are removed. Then, the same heat treatment step as in Example 14 is conducted to getter the catalyst element in the film into the third impurity regions 1019, 1020 (FIG. 21C).

Figure 21D:
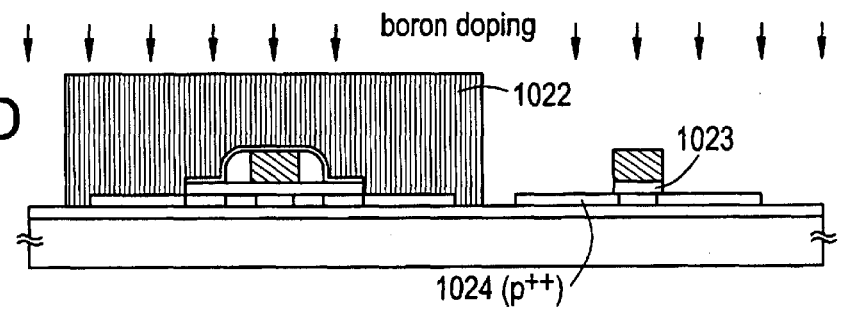

Then, a resist mask 1022 covering the entire NTFT is formed. At first, the protection film 1201 of PTFT is removed. Successively, the side wall 1013 and the third impurity region 1020 of PTFT are removed. Further, the gate insulation film 1018 is dry etched to form a gate insulation film 1023 of the same shape as the gate wiring. Then, the same boron doping as in Example 14 is conducted to form a fourth impurity region 1024 (FIG. 21D).

Figure 21E:
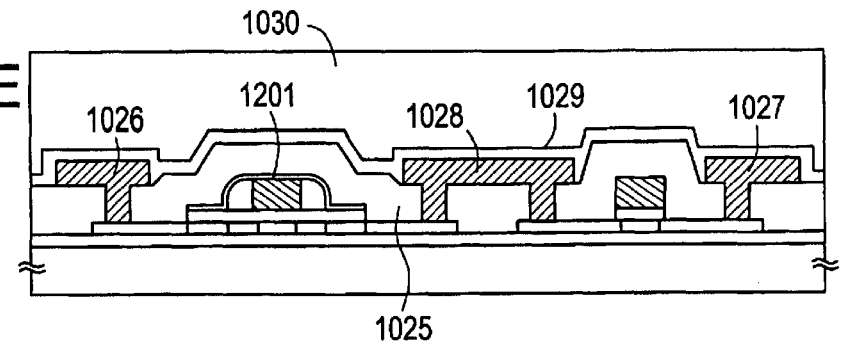

By the subsequent steps conducted in accordance with Example 14, TFT shown in FIG. 21E is completed. Of course, this constitution can be combined with any of Examples 14 to 16.

With such steps, degradation of the gate electrode by oxidation or the like can effectively be prevented by the protection film. Further, upon forming the source wiring 1026 and the drain wiring 1027, since a protection film is not disposed in contact with the third impurity region and the fourth impurity region, the contact hole could be formed easily.

EXAMPLE 18

For this example, FIGS. 22A to 22E show an example of forming a protection film at the instance different from Example 14. While the protection film is formed in Example 14 after the third phosphorus doping step, a protection film 1210 shown in FIG. 22A is formed in the step after obtaining the state shown in FIG. 17B in this example. Since basic constitution is identical with that in Example 1, explanation is to be made taking notice only on the difference. However, for the sake simplicity, same reference numerals as those in Example 14 are used except for the protection film.

At first, the state identical with that in FIG. 17B is formed in accordance with Example 14. Then, a protection film 1210 of 5 nm thickness comprising a silicon nitride film is formed. Then, a side wall is formed on the protection film. The range for the thickness of the protection film 1210 is from 1 to 10 nm, preferably, 2 to 5 nm. If the thickness of the silicon nitride film 1210 is excessive, a gate overlap structure using the side wall can not be realized, so that it is desirable to make the film thin. However, a care should be taken not to impair the effect of preventing oxidation of the gate wiring (in a case of tantalum) in the subsequent heat treatment step. Then, a second phosphorus doping step (phosphorus addition step) is conducted to form second impurity regions 1014, 1015 (FIG. 22A). However, the doping condition (amount of dose, acceleration voltage and the like) is controlled while taking the thickness of the protection film 1210 also into consideration. Further, the protection film may be formed before the second phosphorus doping step without forming the protection film after the second phosphorus doping step.

Then, resist masks 1016, 1017 are formed. Then, the protection film and the gate insulation film are removed selectively by using the resist masks 1016, 1017 as a mask. The thus formed protection film 1211 and the gate insulation film 1018 are of an identical shape to expose a portion of the active layer. Then, a third phosphorus doping step is conducted to form third impurity regions 1019, 1020 (FIG. 22B).

After obtaining the state shown in FIG. 22B, the resist masks 1016, 1017 are removed. Then, the same heat treatment as in Example 14 is conducted to getter the catalyst element in the active layer into the third impurity regions 1019, 1020 (FIG. 22C).

Then, a resist mask 1022 covering the entire NTFT is formed. The protection film 1211 of PTFT is at first removed. Successively, the side wall 1013 and the third impurity region 1020 of PTFT are removed. Further, the insulation film 1018 is dry etched to form a gate insulation film 1023 of the same shape as the gate wiring. Then, boron doping is conducted in the same manner as in Example 14 to form a fourth impurity region 1024 (FIG. 22D).

By conducting the subsequent steps in accordance with Example 14, TFT shown in FIG. 22E is completed. Of course, this constitution can be combined with any of Examples 14 to 17.

With the steps described above, degradation of the gate electrode by oxidation or the like can be effectively prevented by the protection film 1211. Further, upon forming the source wiring 1026 and the drain wiring 1027, since the protection film is not disposed in contact with the third impurity region and fourth impurity region, the contact hole could be formed easily. Further, the protection film may be used as an etching stopper upon forming the side wall.

EXAMPLE 19

For this example, FIGS. 23A to 23E show an example of steps different from Example 18. In this example, the protection film is removed in the step after obtaining the state shown in FIG. 22B. Since the basic constitution is identical with that in Example 18, explanation is to be made while taking notice only on the difference. However, for the sake of simplicity, identical reference numerals as those in Example 18 are used except for the protection film. FIG. 22B is identical with FIG. 23A.

Figure 23A:
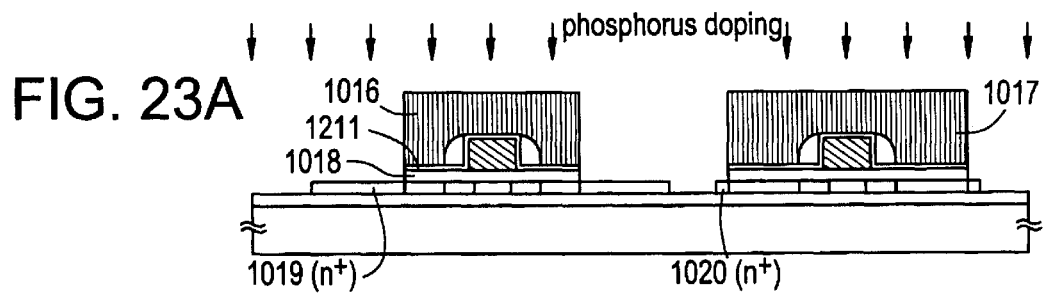
FIGS. 23A to 23E are views showing steps of manufacturing a CMOS circuit.
Figure 23B:
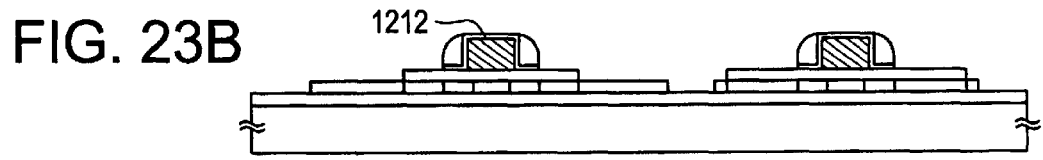

At first, a state identical with FIG. 22B is formed in accordance with Example 18. After obtaining the state shown in FIG. 22B, the resist masks 1016, 1017 are removed. Further, the protection film 1211 is removed using the side wall as the mask, to form a protection film 1212 (FIG. 23B).

Figure 23C:
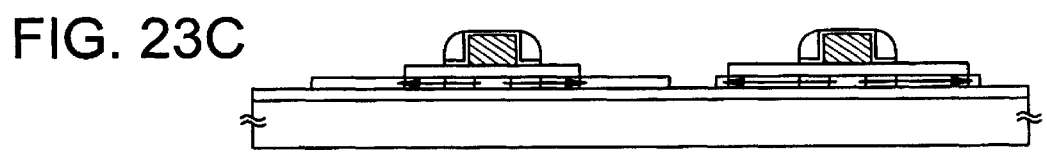

Then, the same heat treatment as in Example 14 is conducted to getter the catalyst element into the third impurity regions 1019, 1020 (FIG. 23C).

Figure 23D:
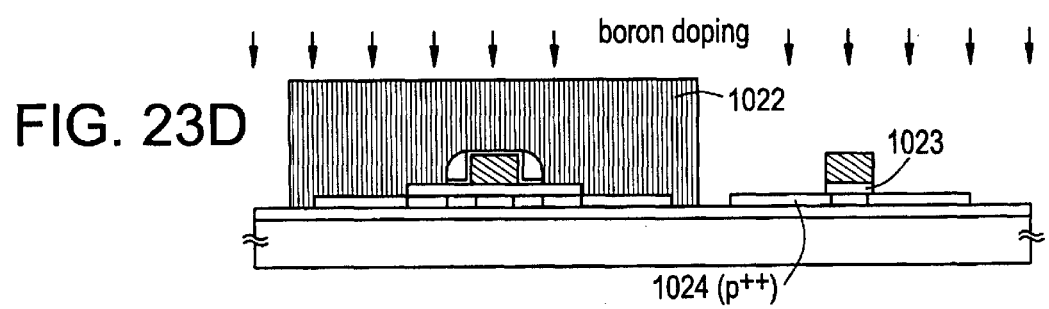

Then, a resist mask 1022 covering the entire NTFT is formed. Then, the protection film 1212 of PTFT is at first removed. Successively, the side wall 1013 and the third impurity region 1020 of PTFT are removed. Further, the gate insulation film 1018 is dry etched to form a gate insulation film 1023 of the same shape as the gate wiring. Then, the same boron doping as in Example 1 is conducted to form a fourth impurity region 1024 (FIG. 23D).

Figure 23E:
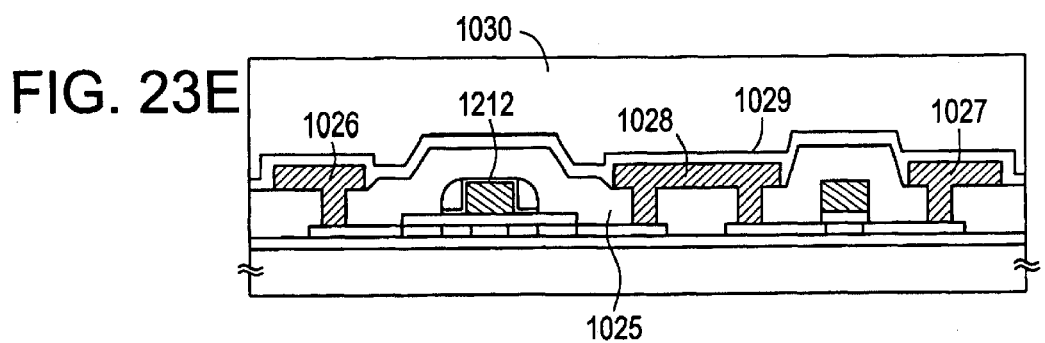

By conducting the subsequent steps in accordance with Example 18, TFT shown in FIG. 23E is completed. Of course, this constitution can be combined with any of Examples 14 to 18.

EXAMPLE 20

Figure 24A:
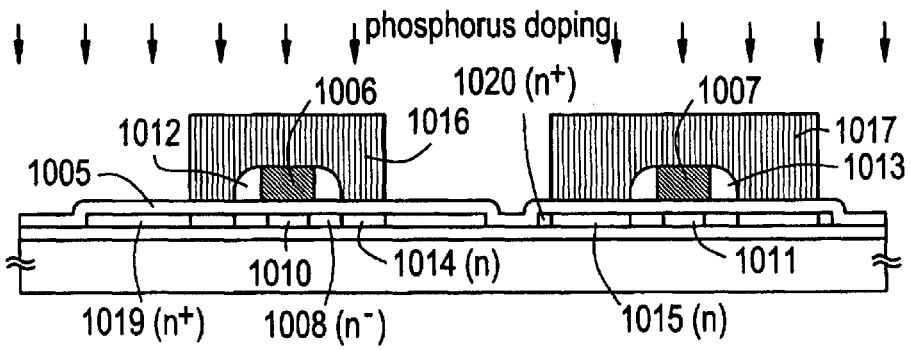
FIGS. 24A and 24B are views showing steps of manufacturing a CMOS circuit.

In this example, a state shown in FIG. 17D is obtained in accordance with Example 14 and then resist masks 1016, 1017 are formed, and a third phosphorus adding step is conducted (FIG. 24A). In this case, the amount of dose and the acceleration voltage are controlled such that phosphorus is contained at a concentration of $1 \times 10^{20}$ atoms/cm$^3$ in the third impurity regions 1019, 1020 through the gate insulation film 1005.

Figure 24B:

After obtaining the state shown in FIG. 24A, the gate insulation film 1005 is removed selectively and then the resist mask is removed. Subsequently, a protection film 1021 is formed in the same manner as in Example 1 and a heat treatment is conducted (FIG. 24B).

In this example, an etching step is conducted for the gate insulation film 1005, but it is also possible to save this step and leave the gate insulation film 1005 as far as the final step. In this case, since the active layer is not exposed after forming the gate insulation film 1005, there is no worry of contamination from the processing atmosphere.

By conducting the subsequent steps in accordance with Example 14, TFT is completed. Of course, this constitution can be combined with any of Examples 14 to 19.

EXAMPLE 21

In this example, explanation is to be made to a case of setting up a circuit with TFTs formed by practicing the present invention, and manufacturing an active matrix type liquid crystal display device in which a driver circuit (for example, shift register circuit, buffer circuit, sampling circuit, signal amplifying circuit) and a pixel matrix circuit are formed integrally on one identical substrate.

Figure 25:
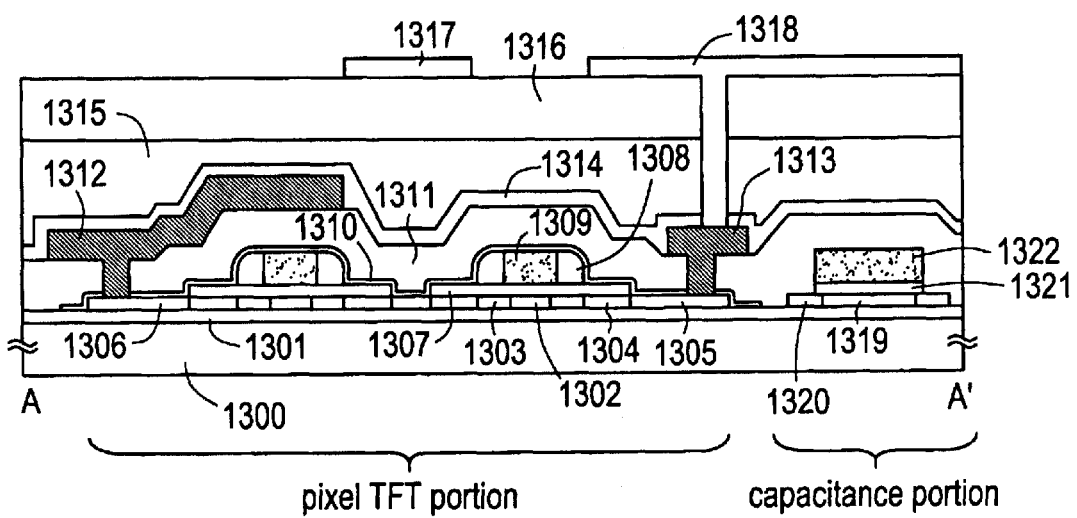
FIG. 25 is a view showing a structure of a pixel matrix circuit.

While explanation has been made in Example 14 to an example of a CMOS circuit, a driver circuit comprising CMOS circuit (FIG. 16, FIG. 25) as a basic unit and a pixel matrix circuit (FIG. 25) using NTFT as pixel TFT are formed on one identical substrate in this example. FIG. 25 is a cross sectional structural view taken along line A–A' in FIG. 12A. Further, since the pixel TFT shown in FIG. 25 is a double gate structure in which TFTs of an identical structure are connected in series, explanation is to be made only on one of them, with reference numerals being added.

The pixel TFT may be adapted as a structure obtained by forming a source wiring and a drain wiring in accordance with the steps in Example 14 and then forming pixel electrodes so as to be connected with the drain wiring. The manufacturing method is to be shown briefly below.

In accordance with the steps in Example 14, an underlying film 1301 on a substrate 1300, a channel forming region 1302, a first impurity region 1303, a second impurity region 1304, third impurity regions 1305, 1306, a gate insulation film 1307, a gate wiring 1309, a side wall 1309, a protection film 1310, a first interlayer insulation film 1311, a source wiring 1312 and a drain wiring 1313 are formed.

Then, a second interlayer insulation film 1315 is formed over the first interlayer insulation film formed on the protection film 1310. Further, a third interlayer insulation film 1316 is formed on the second interlayer insulation film and a pixel electrode 1318 comprising a transparent conductive film such as ITO and SnO$_2$ is formed thereon. Further, numeral 1317 also denotes a pixel electrode.

Further, the capacitance portion is formed by putting an insulation film 1321 between a capacitance wiring 1322 as an upper electrode and a lower electrode comprising an undoped silicon layer (intrinsic semiconductor layer or a semiconductor layer with addition of boron at a concentration of $1 \times 10^{16}$–$5 \times 10^{18}$ atoms/cm$^3$) 1319 and an impurity region 1320. The capacitance wiring 1322 is formed simultaneously with the gate wiring of the pixel TFT and grounded to the earth or connected to a fixed voltage. Further, the insulation film 1321 is constituted with the same material as that for the gate insulation film 1307 of the pixel TFT. Further, the intrinsic region 1319 is constituted with the same material as that for the channel forming region of the pixel TFT. Further, the impurity regions 1320 is constituted with the same material as that for the first impurity region of NTFT in the CMOS circuit. In this way, it is possible to manufacture a pixel TFT, a capacitance portion and a CMOS circuit integrally on one identical substrate.

EXAMPLE 22

This example shows an example forming a capacitance portion of a structure different from that in Example 21.

Figure 26:
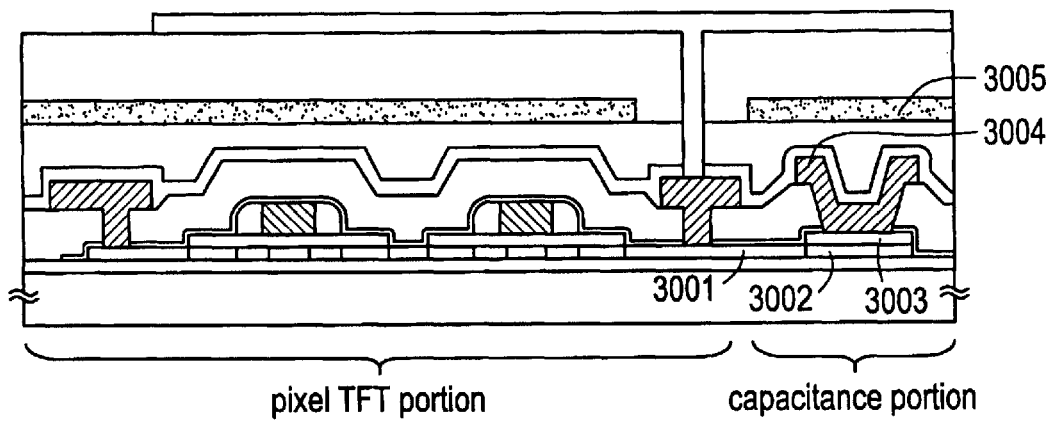
FIG. 26 is a view showing a structure of a pixel matrix circuit.

Since the basic constitution is substantially identical with that in Example 21, explanation is to be made while taking notice only on the difference. The capacitance portion in this example is formed with the second impurity region 3002 connected to the third impurity region 3001, an insulation film 3003 and a capacitance wiring 3004. FIG. 26 shows a cross sectional structural view of a substrate on the side of forming TFT having the capacitance portion.

Further, a black mask 3005 is disposed to the substrate formed TFTs thereon. Further, the capacitance wiring 3004 is formed simultaneously with the source wiring and the drain wiring of the pixel TFT and grounded to the earth or connected to a fixed voltage. In this way, it is possible to that simultaneously manufacture and integrate the pixel TFT, the capacitance portion and the CMOS circuit on one identical substrate. Of course, this constitution can be combined with any of Examples 14 to 20.

EXAMPLE 23

This example shows an example of forming a capacitance portion different from that in Examples 20, 21. Since the basic constitution is substantially identical with that in Example 21, explanation is to be made taking notice only on the difference. At first, a second interlayer insulation film 3102 and a black mask 3103 comprising a conductive material having a light shielding performance are formed over the first interlayer insulation film. Further, a third interlayer insulation film is formed thereon and a pixel electrode 3104 comprising a transparent conductive film such as of ITO or $SnO_2$ is connected.

Figure 27:
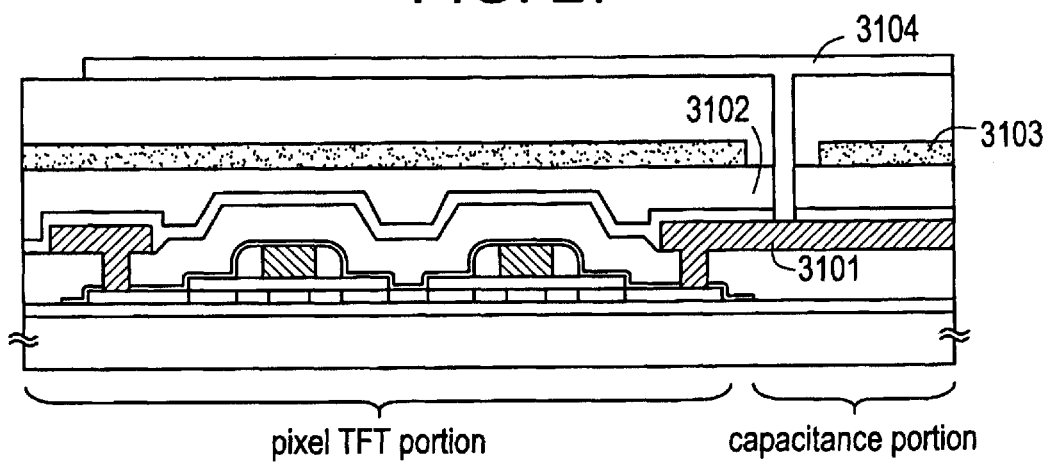
FIG. 27 is a view showing a structure of a pixel matrix circuit.

Further, the black mask 3103 covers the pixel TFT and forms a drain wiring 3101 and a capacitance portion. FIG. 27 shows a cross sectional view of the substrate having the capacitance portion and TFTs formed thereon. In this way, it is possible to simultaneously manufacture and integrate the pixel TFT, the capacitance and the CMOS circuit on one identical substrate. Of course, this constitution can be combined with any of Examples 14 to 20.

EXAMPLE 24

Figure 28:
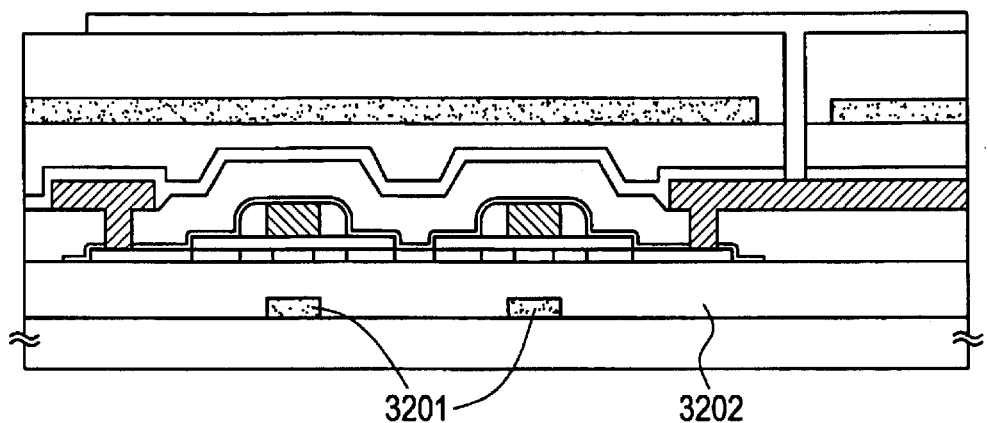
FIG. 28 is a view showing a structure of a pixel matrix circuit.

In this example, FIG. 28 shows an example of forming a back gate electrode 3201 below the channel forming region by way of an insulation film 3202.

By injecting electrons into the back gate electrode 3201, the threshold voltage can be changed to control the threshold voltage to a desired level. Particularly, it is desirable in the pixel TFT as in this example to properly control the threshold voltage and reduce the power consumption. Of course this constitution can be combined with any of Examples 14 to 24.

EXAMPLE 25

In this example, explanation is to be made to a case of setting up a circuit with TFTs formed by practicing the present invention and manufacturing an active matrix type liquid crystal display panel in which a driver circuit (for example, shift register circuit, buffer circuit, sampling circuit and signal amplifying circuit) and a pixel matrix circuit are integrally formed on one identical substrate.

While Example 1 has been explained with reference to an example of the CMOS circuit, a driver circuit comprising the CMOS circuit as a base unit and a pixel matrix circuit comprising NTFT as a pixel TFT are formed on one identical substrate in this example. The pixel TFT may be of a so-called multi-gate structure such as a double gate structure or a triple gate structure.

Further, after forming as far as the source wiring and the drain wiring in accordance with the steps in Example 1 or Example 14, the pixel TFT may be formed into a structure in which pixel electrodes are formed so as to be in connection with drain wirings. This invention has a feature in the structure of NTFT and application thereof to the pixel TFT can be done easily by known technique, so that detailed explanations therefor are to be omitted.

After forming the driver circuit and the pixel matrix circuit on one identical substrate, an orientation film is formed to substantially complete an active matrix substrate. Then, a counter substrate having a counter electrode and an orientation film is provided and a liquid crystal material is sealed between the active matrix substrate and the counter substrate to complete an active matrix type liquid crystal display device (also referred to as a liquid crystal display panel or a liquid crystal module) of a structure shown in FIG. 29. Since of a step of sealing liquid crystal material may be conducted by using known cell assembling steps, detailed explanations therefor are to be omitted.

Figure 29:
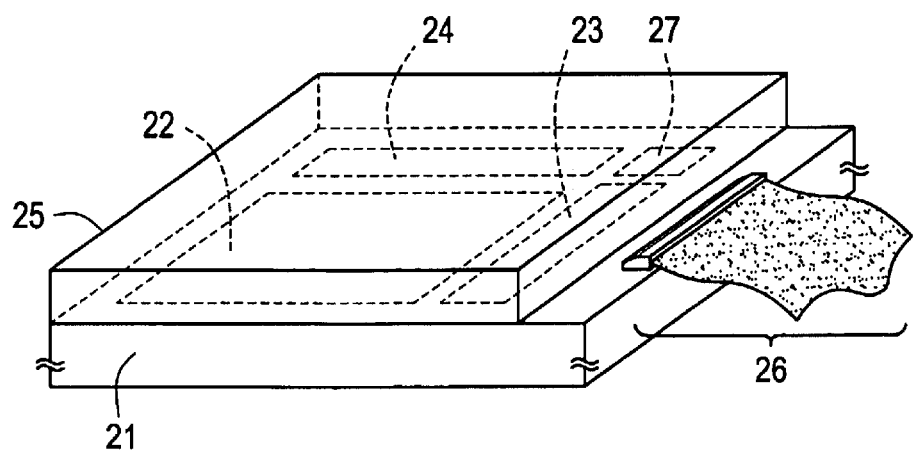
FIG. 29 is a view showing an appearance of an electro-optic device.

In FIG. 29, are shown a substrate 21 having an insulation surface, a pixel matrix circuit 22, a source driver circuit 23, a gate driver circuit 24, a counter substrate 25, an FPC (Flexible Printed Circuit) 26 and a signal processing circuit 27 such as a D/A converter or a gamma compensation circuit. Further, a complicated signal processing circuit may be formed with an IC chip and the IC chip may be attached on a substrate like that COG.

Further, while explanations have been made to an example of the liquid crystal display device, it is also possible to apply the invention to other electro-optic devices such as an EL (electroluminescence) display device. an EC (electrochromic) display device or an image sensor so long as the device is an active matrix display device.

Further, the electro-optical device in this example can be realized by using a constitution comprising a combination with any one of Examples 1 to 24.

EXAMPLE 26

The TFT structure of this invention is applicable not only to the electro-optical device shown in Example 25 but also to all sorts of semiconductor circuits. That is, it may be applied to a microprocessor such as an RISC processor or an ASIC processor, or it may be applicable to a signal processing circuit such as D/A converter or a high frequency circuit for use in portable equipments (portable telephone, PHS, mobile computer or the like).

Further, it is also possible to attain a semiconductor device of a three dimensional structure in which an interlayer insulation film is formed on an existent MOSFET and a semiconductor circuit is manufactured thereon using this invention. As described above, this invention is applicable to all sorts of semiconductor devices in which LSIs are used at present. That is, this invention is applicable also to SOI structure (TFT structure using single crystal semiconductor thin film), for example, SIMOX, Smart-Cut (registered trademark of SOITEC Co.) or ELTRAN (registered trademark of Canon Inc.)

Further, the semiconductor circuit of this example can be attained by using a constitution comprising a combination with any one of Examples 1 to 25.

EXAMPLE 27

The TFT formed by practicing this invention is applicable to various electro-optical devices or semiconductor circuits.

That is, this invention is applicable to all sorts of electronic equipments in which such electro-optical devices or semiconductor circuits are incorporated as components.

Such electronic equipments include, for example, video cameras, digital cameras, projection TV, head mount displays (Goggle type display), car navigation devices, personal computers, portable information terminals (mobile computer, portable telephone or electronic books). An example of them is shown in FIGS. 30A to 30F.

Figure 30A:
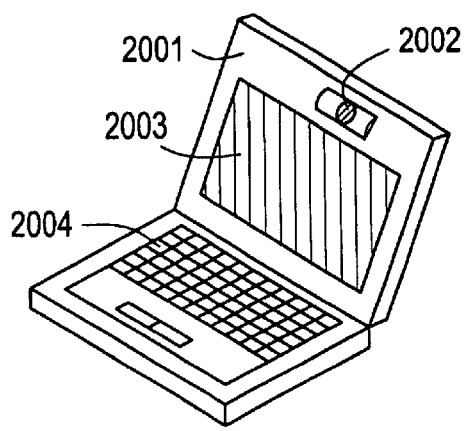
FIGS. 30A to 30F are views showing examples of electronic equipments.

FIG. 30A shows a personal computer comprising a main body 2001, an image input section 2002, a display section 2003 and a keyboard 2004. This invention is applicable to the signal control circuits for image input section 2002, display section 2003 or the like.

Figure 30B:
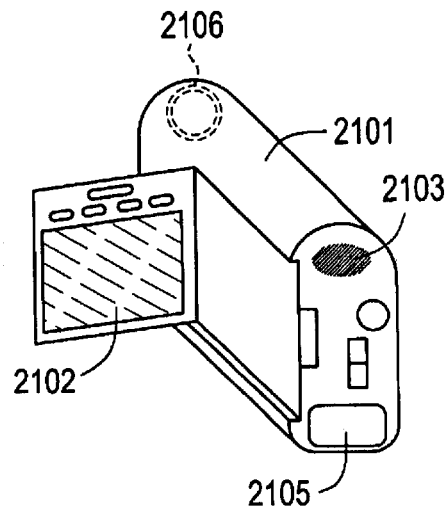

FIG. 30B is a video camera comprising a main body 2101, a display section 2102, a voice input section 2103, an operation switch 2104, a battery 2105 and an image receiving section 2106. This invention is applicable to signal control circuits for the display section 2102, voice input section 2103 or the like.

Figure 30C:
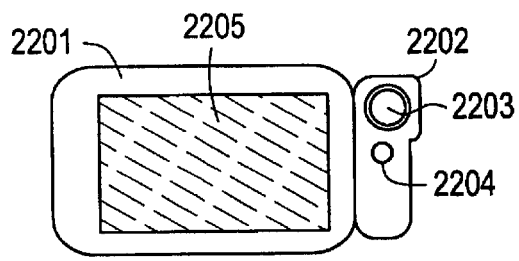

FIG. 30C is a mobile computer comprising a main body 2201, a camera section 2202, an image receiving section 2203, an operation switch 2204 and a display section 2205. This invention is applicable to signal control circuits for the display portion 2205 or the like.

Figure 30D:
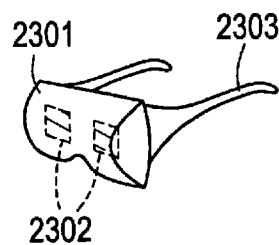

FIG. 30D is a goggle type display comprising a main body 2301, a display section 2302 and an arm section 2303. This invention is applicable to signal control circuits for the display section 2302 or the like.

Figure 30E:
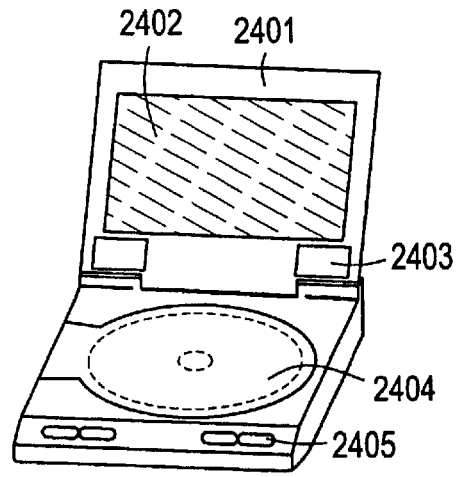

FIG. 30E is a player using a recording medium for recording programs (hereinafter referred to as a recording medium), comprising a main body 2401, a display section 2402, a loud speaker 2403, recording medium 2404 and an operation switch 2405. The device uses a DVD (Digital Versatile Disc), CD or the like as the recording medium and can enjoy musics or movies and conduct games or internets. This invention is applicable to signal control circuits for the display section 2402 or the like.

Figure 30F:
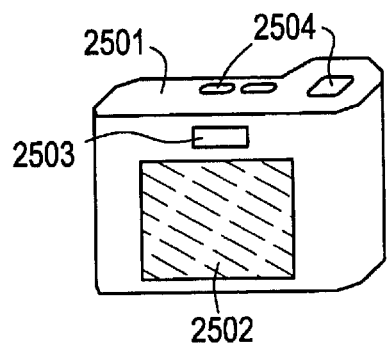

FIG. 30F is a digital camera comprising a main body 2501, a display section 2502, an eye contact section 2503, an operation switch 2504 and an image receiving section (not illustrated). This invention is applicable to signal control circuits for the display section 2502 or the like.

As has been described above, this invention has an extremely wide application range and is applicable to electronic equipments in all sorts of fields. Further, the electronic equipments in this example can be attained by using a constitution comprising a combination of any of Examples 1 to 26.

EXAMPLE 28

Further, this invention is applicable to a projector by using an electro-optical device shown in Example 25. That is, this invention is applicable to a projector in which an electro-optic device incorporated into the display device.

Figure 31A:
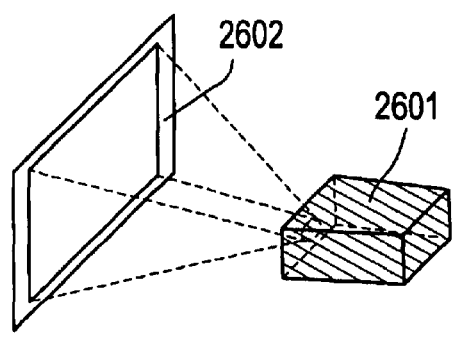
FIGS. 31A to 31D are views showing examples of electronic equipments.

FIG. 31A is a front type projector comprising a display device 2601 and a screen 2602. This invention is applicable to signal control circuits for the display device or the like.

Figure 31B:
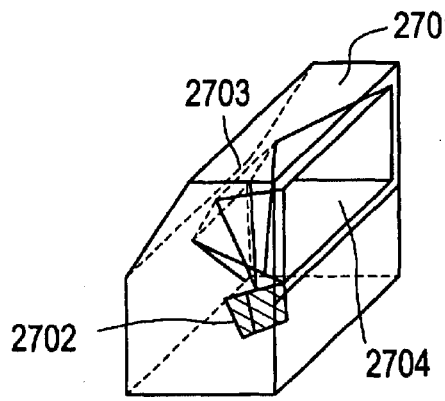

FIG. 31B is a rear type projector comprising a main body 2701, a display device 2702, a mirror 2703 and a screen 2704. This invention is applicable to signal control circuits for a display device or the like.

Figure 31C:
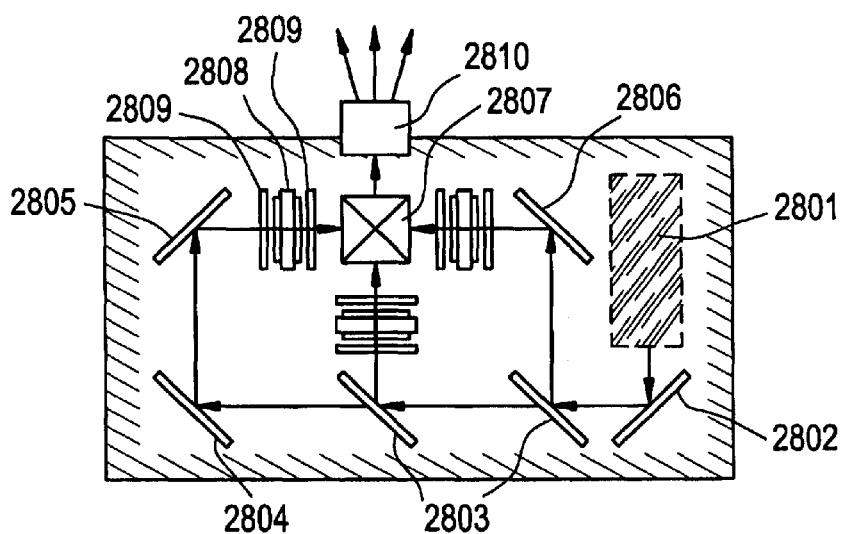

Further, FIG. 31C is a view illustrating an example of a structure for the display device 2601, 2702 in FIG. 31A and FIG. 31B. The display device 2601 or 2702 comprises a light source optical system 2801, mirrors 2802, 2804, 2805 and 2806, dichroic mirror 2803, a prism 2807, a liquid crystal display device 2808, phase difference plates 2809, and a projection optical system 2810. The projection optical system 2810 comprises an optical system including a projection lens. This example shows a three plate type but it is not particularly restricted thereto and it may be, for example, a single plate type. Further, in an optical path shown by an arrow in FIG. 31C, a user may properly dispose an optical lens, a film having a polarizing function, a film for adjusting phase difference or an optical system such as an IR film.

Figure 31D:
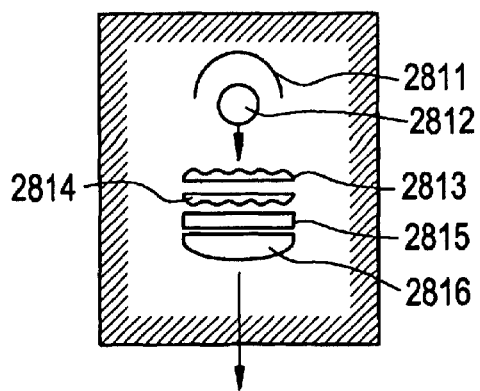

Further, FIG. 31D is a view showing an example of a structure of a light source optical system 2801 in FIG. 31C. In this example, the light source optical system 2801 comprises a reflector 2811, a light source 2812, lens arrays 2813, 2814, a polarization conversion element 2815 and condenser lens 2816. Further, the light source optical system shown in FIG. 31D is an only example and it is not restricted only thereto. For example, a user may property dispose an optical system such as an optical lens, a film having a polarizing function, a film-controlling the phase difference, an IR film or the like.

As described above, this invention has an extremely wide application range and is applicable to electronic equipments in all sorts of fields. Further, the electronic equipment in this example can be realized also by using a constitution of a combination with one of Examples 1 to 24.

EXAMPLE 29

This example demonstrates a process for producing an active matrix type EL (electroluminescence) display device according to the invention of the present application.

Figure 34A:
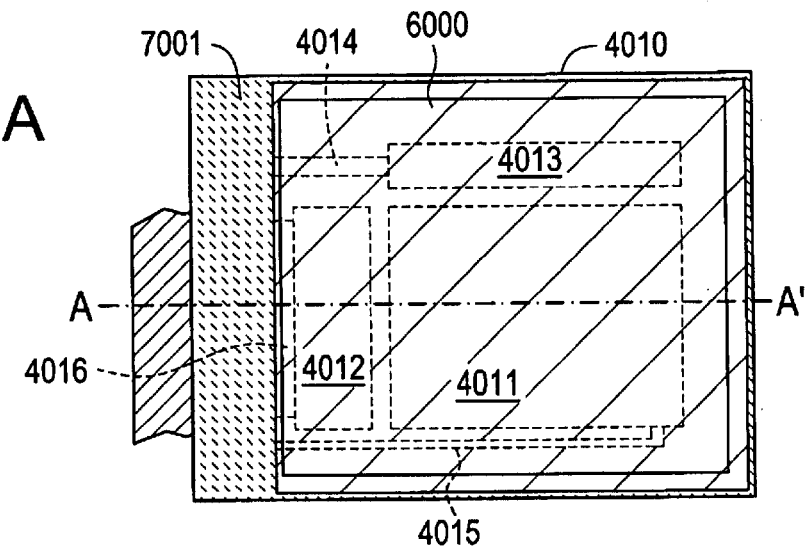
FIGS. 34A and 34B are views showing a structure of an active matrix type EL display device.

FIG. 34A is a top view showing an EL display device, which is produced according to the present invention. In FIG. 34A, there are shown a substrate 4010, a pixel portion 4011, a source side driving circuit 4012, and a gate side driving circuit 4013, each driving circuit connecting to wirings 4014, 4015 and 4016 which reach FPC 4017 leading to external equipment.

The pixel portion, preferably together with the driving circuit, is enclosed by a covering material 6000, a sealing material (or housing material) 7000, and an end-sealing material (or second sealing material) 7001.

Figure 34B:
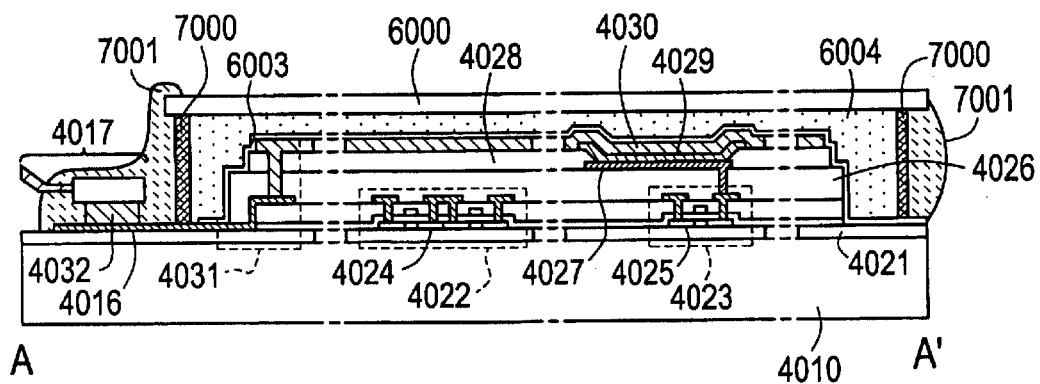

FIG. 34B is a sectional view showing the structure of the EL display device in this Example. There is shown a substrate 4010, a base film 4021, a TFT 4022 for the driving circuit, and a TFT 4023 for the pixel portion. (The TFT 4022 shown is a CMOS circuit consisting of an n-channel TFT and a p-channel TFT. The TFT 4023 shown is the one, which controls current to the EL element.) Incidentally, the present invention is used in the TFT 4022 for the driving circuit and the TFT 4023 for the pixel portion.

Upon completion of TFT 4022 (for the driving circuit) and TFT 4023 (for the pixel portion) according to the invention of the present application, a pixel electrode 4027 is formed on the interlayer insulating film (planarizing film) 4026 made of a resin. This pixel electrode is a transparent conductive film, for example, which is electrically connected to the drain of TFT 4023 for the pixel portion. It is preferable that the TFT for the pixel portion is a p-channel TFT in the case that the transparent conductive film is used for the pixel electrode 4027. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 subsequently in a vacuum, or by forming the EL layer 4029 in an inert atmosphere and then forming the cathode 4030 in the same atmosphere without exposing to air. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

EXAMPLE 30

Figure 35A:
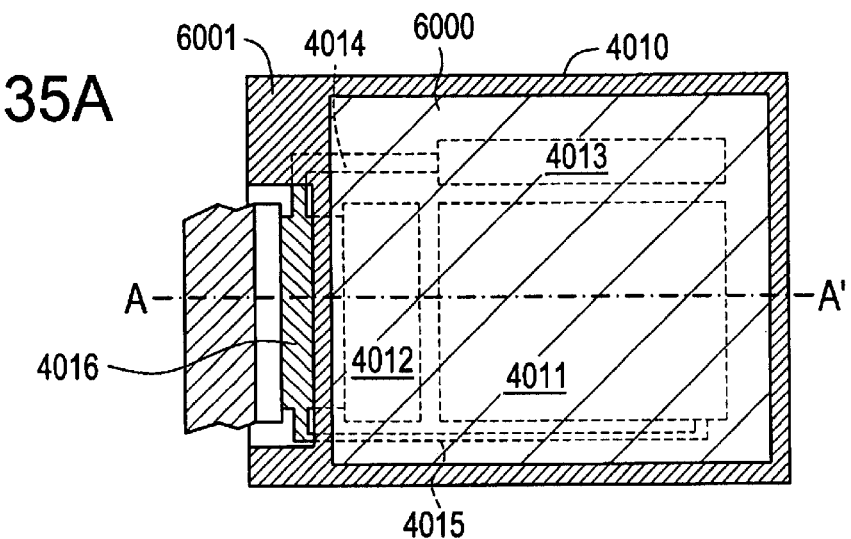
FIGS. 35A and 35B are views showing a structure of an active matrix type EL display device.
Figure 35B:
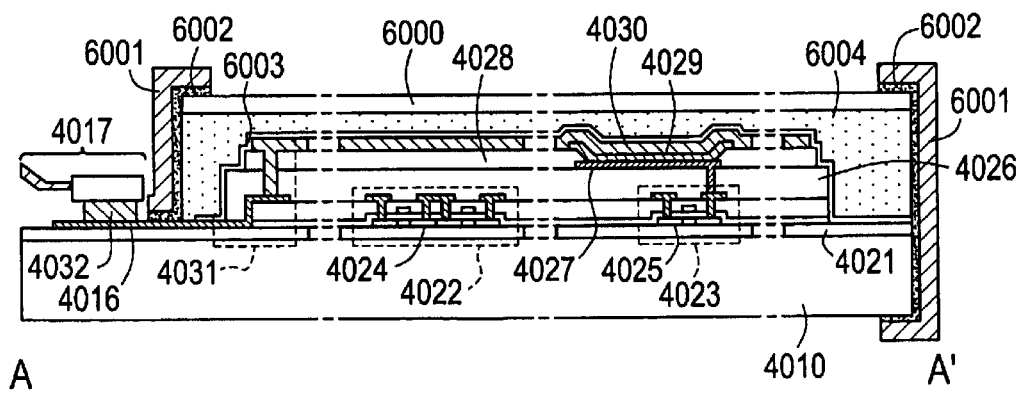

In this Example, another active matrix type EL display device having a different structure from the embodiment 15 is explained, as shown in FIGS. 35A and 35B. The same reference numerals in FIGS. 35A and 35B as in FIGS. 34A and 34B indicate same constitutive elements, so an explanation is omitted.

FIG. 35A shows a top view of the EL module in this embodiment and FIG. 35B shows a sectional view of A–A' of FIG. 35A.

According to Embodiment 29, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicone resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

EXAMPLE 31

Figure 36:
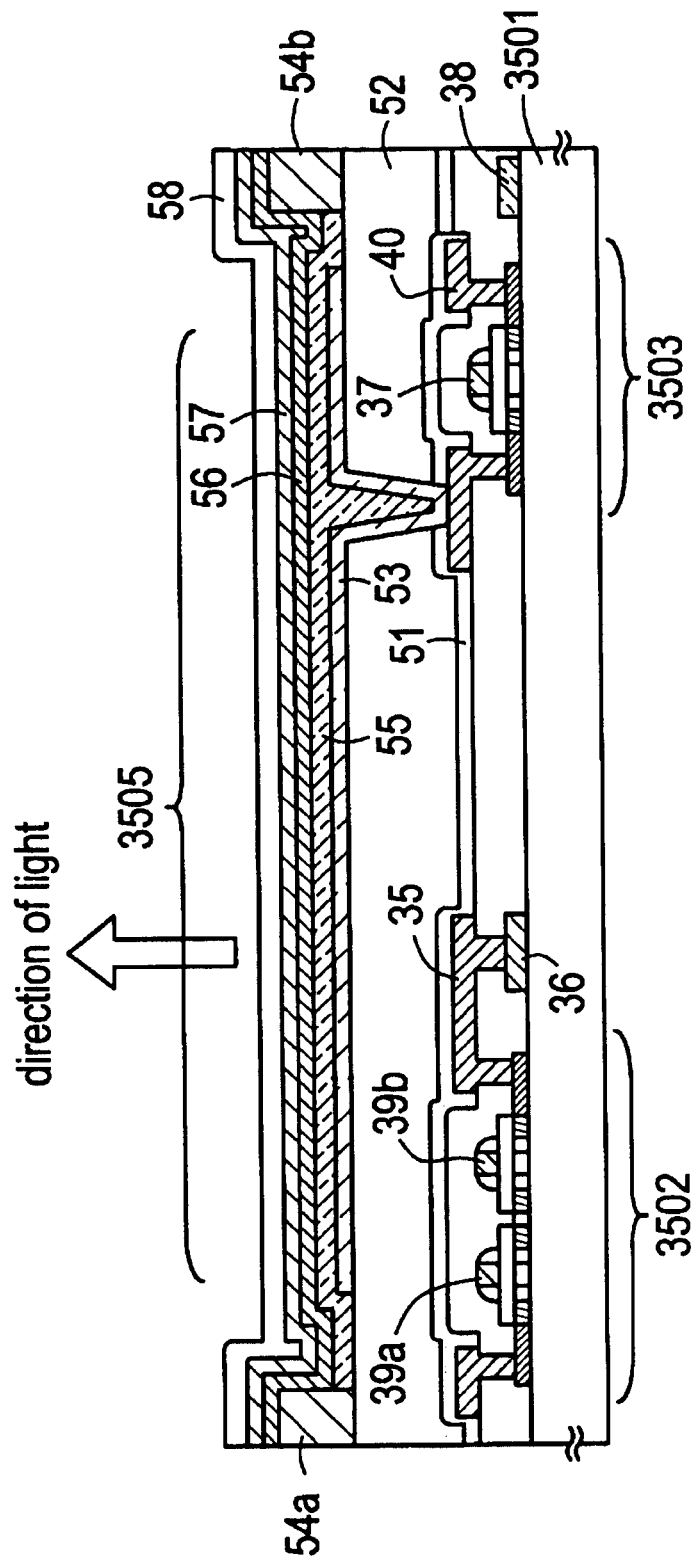
FIG. 36 is a view showing a cross section of a pixel portion in the an active matrix type EL display device.
Figure 37A:
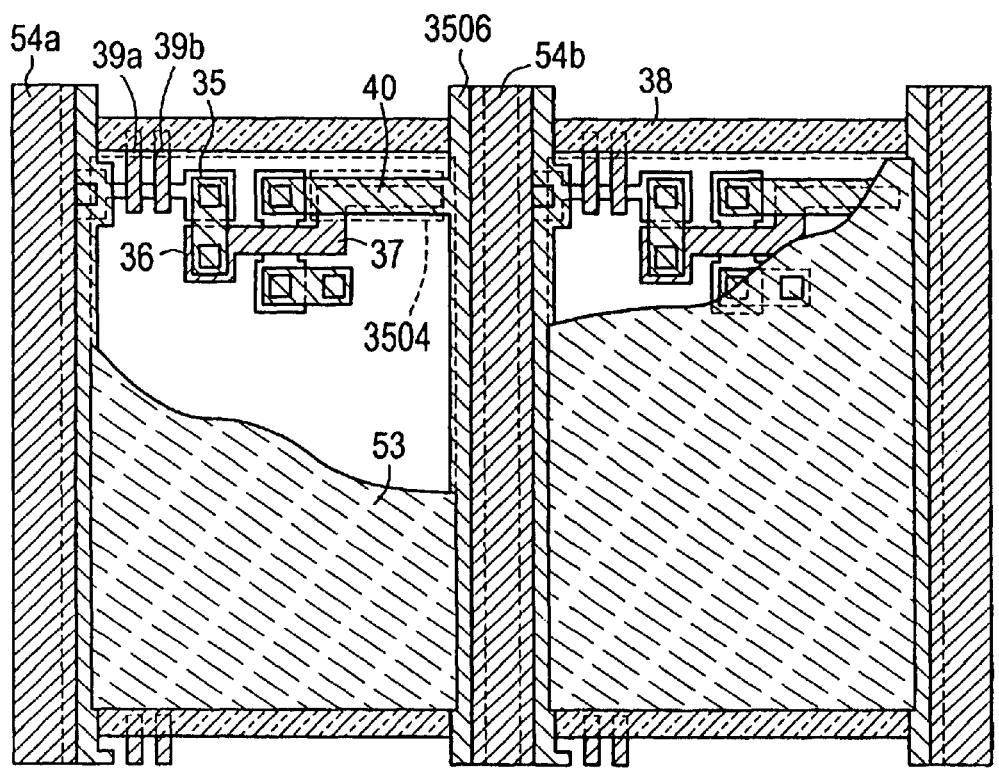
FIGS. 37A and 37B are views showing a structure of the pixel portion in an active matrix type EL display device and a circuit structure for the pixel portion, respectively.
Figure 37B:
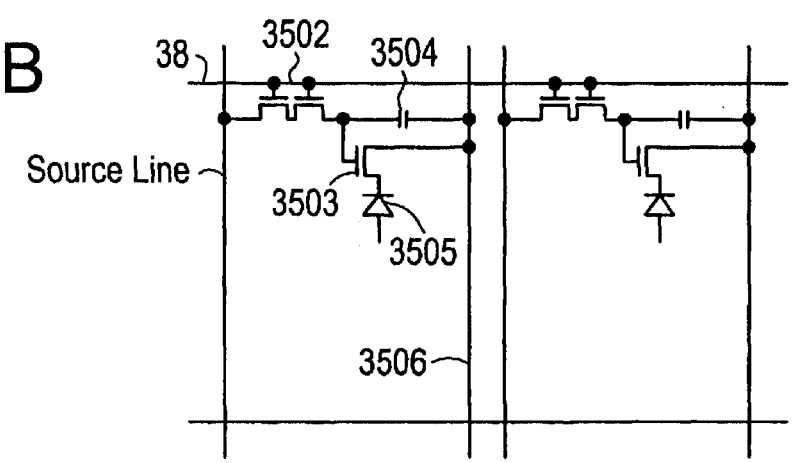

In this Example, the structure of the pixel region in the EL display device is illustrated in more detail. FIG. 36 shows the cross section of the pixel region; FIG. 37A shows the top view thereof; and FIG. 37B shows the circuit structure for the pixel region. In FIG. 36, FIG. 37A and FIG. 37B, the same reference numerals are referred to for the same portions, as being common thereto.

In FIG. 36, the switching TFT 3502 formed on the substrate 3501 is NTFT of the present invention. In this Example, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 35 in the switching TFT 3502 is electrically connected with the gate electrode 37 of the current-control TFT, via the wire 36 therebetween. The wire indicated by 38 is a gate wire for electrically connecting the gate electrodes 39a and 39b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which a first impurity region (first LDD region) and a second impurity region (second LDD region) are constructed at the drain side in the current-control TFT.

In this example, the current-control TFT 3503 is illustrated to have a single-gate structure, but it may have a multi-gate structure with plural TFTs connected in series. In addition, plural TFTs may be connected in parallel so that the channel forming region is substantially divided into plural sections. In the structure of that type, heat radiation can be effected efficiently. The structure is advantageous for protecting the device with it from thermal deterioration.

As in FIG. 37A, the wire to be the gate electrode 37 in the current-control TFT 3503 overlaps with the drain wire 40 therein in the region indicated by 3504, via an insulating film therebetween. In this state, the region indicated by 3504 forms a capacitor. The capacitor 3504 functions to retain the voltage applied to the gate electrode in the current-control TFT 3503. The drain wiring 40 is connected with the current supply line (power line) 3506, from which a constant voltage is all the time applied to the drain wiring 40.

On the switching TFT 3502 and the current-control TFT 3503, a first passivation film 51 is formed. On the film 51, formed is a planarizing film 52 of an insulating resin. It is extremely important that the difference in level of the layered portions in TFT is removed through planarization with the planarizing film 52. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 53 indicates a pixel electrode (a cathode in the EL device) of an conductive film with high reflectivity. The pixel electrode 53 is electrically connected with the drain region in the current-control TFT 3503. It is preferable to use a n-channel TFT for the current-control TFT in the case of the conductive film with high reflectivity is used for the pixel electrode 53. Moreover, it is preferable that the pixel electrode 53 is of a low-resistance conductive film of an aluminum alloy, a copper alloy or a silver alloy, or of a laminate of those films. Needless-to-say, the pixel electrode 53 may have a laminate structure with any other conductive films.

In the recess (this corresponds to the pixel) formed between the banks 54a and 54b of an insulating film (preferably of a resin), the light-emitting layer 55 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PPV) materials, polyvinylcarbazole (PVK) materials, polyf luorene materials, etc.

Various types of PPV-type organic EL materials are known, such as those disclosed in H. Shenk, H. Becker, O. Gelsen, E. Klunge, W. Kreuder, and H. Spreitzer; Polymers for Light Emitting Diodes, Euro Display Proceedings, 1999, pp. 33–37 and in Japanese Patent Laid-Open No. 10-92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this embodiments to demonstrate an embodiment of using polymer materials to form light-emitting layers, which, however, is not limitative. Low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Example, a hole injection layer 56 of PEDOT (polythiophene) or PAni (polyaniline) is formed on the light-emitting layer 55 to give a laminated structure for the EL layer. On the hole injection layer 56, formed is an anode 57 of a transparent conductive film. In this Example, the light having been emitted by the light-emitting layer 55 radiates therefrom in the direction toward the top surface (that is, in the upward direction of TFT). Therefore, in this, the anode must transmit light. For the transparent conductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent conductive film for the anode is of a material capable of being formed into a film at as low as possible temperatures.

When the anode 57 is formed, the EL device 3505 is finished. The EL device 3505 thus fabricated herein indicates a capacitor comprising the pixel electrode (cathode) 53, the light-emitting layer 55, the hole injection layer 56 and the anode 57. As in FIG. 37A, the region of the pixel electrode 53 is nearly the same as the area of the pixel. Therefore, in this, the entire pixel functions as the EL device. Accordingly, the light utility efficiency of the EL device fabricated herein is high, and the device can display bright images.

In this Example, a second passivation film 58 is formed on the anode 57. For the second passivation film 48, preferably used is a silicon nitride film or a silicon nitride oxide film. The object of the film 58 is to insulate the EL device from the outward environment. The film 48 has the function of preventing the organic EL material from being degraded through oxidation and has the function of preventing it from degassing. With the second passivation film 58 of that type, the reliability of the EL display device is improved.

As described hereinabove, the EL display panel of the invention fabricated in this Embodiment has a pixel portion for the pixel having the constitution as in FIG. 36, and has the switching TFT through which the off-current to pass is very small to a satisfactory degree, and the current-control TFT resistant to hot carrier injection. Accordingly, the EL display panel fabricated herein has high reliability and can display good images.

Incorporating the EL display device of the Example 31 into the electronic equipments of Example 27 as its display portion is advantageous.

EXAMPLE 32

This Embodiment is to demonstrate a modification of the EL display panel of Embodiment 31, in which the EL device 3505 in the pixel portion has a reversed structure. For this Example, referred to is FIG. 38. The constitution of the EL display panel of this Example differs from that illustrated in FIG. 36 only in the EL device portion and the current-control TFT portion. Therefore, the description of the other portions except those different portions is omitted herein.

Figure 38:
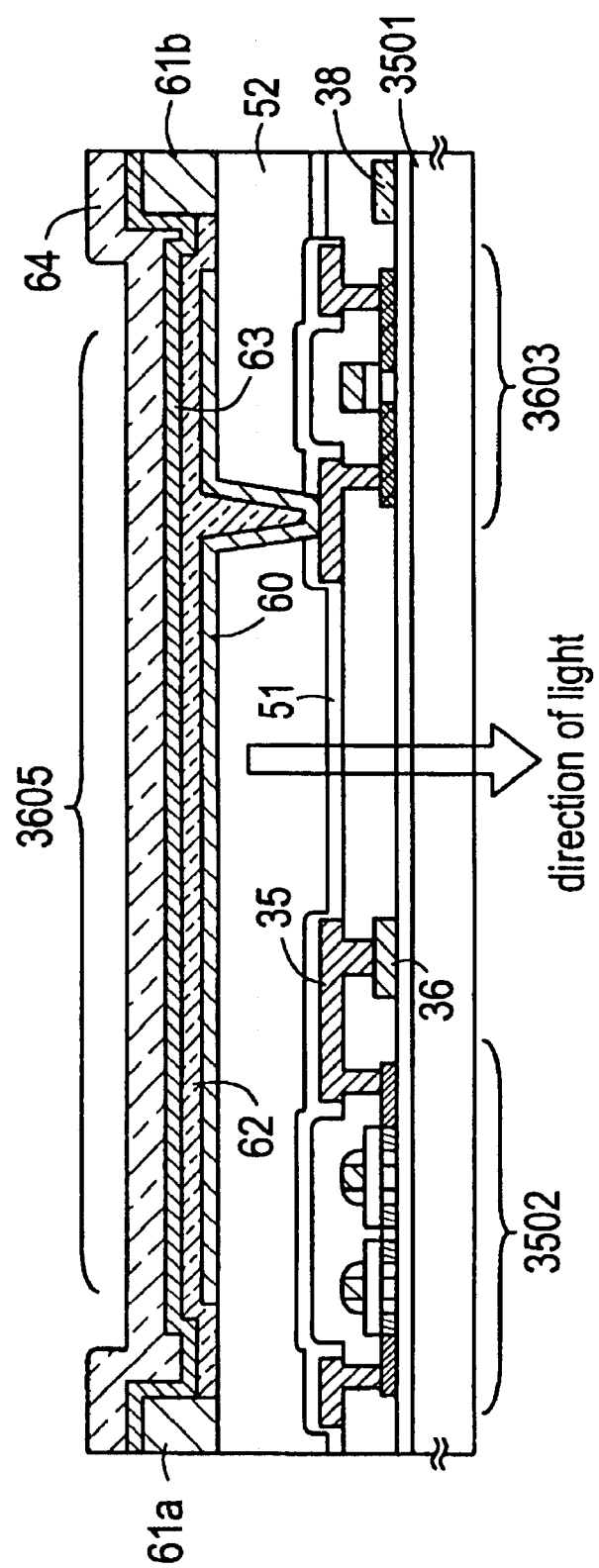
FIG. 38 is a view showing a structure of a pixel portion in an active matrix type EL display device.

In FIG. 38, the current-control TFT 3603 may be PTFT of the present invention.

In this Example, the pixel electrode (anode) 60 is of a transparent conductive film. Concretely, used is an conductive film of a compound of indium oxide and zinc oxide. Needless-to-say, also usable is an conductive film of a compound of indium oxide and tin oxide.

After the banks 61a and 61b of an insulating film have been formed, a light-emitting layer 62 of polyvinylcarbazole is formed between them in a solution coating method. On the light-emitting layer 62, formed are an electron injection layer 63 of acetylacetonatopotassium, and a cathode 64 of an aluminum alloy. In this case, the cathode 64 serves also as a passivation film. Thus is fabricated the EL device 3605.

In this Example, the light having been emitted by the light-emitting layer radiates in the direction toward the substrate with TFT formed thereon, as in the direction of the arrow illustrated.

Incorporating the EL display device of the Example 32 into the electronic equipments of Example 27 as its display portion is advantageous.

EXAMPLE 33

This Example is to demonstrate modifications of the pixel with the circuit structure of FIG. 37B. The modifications are as in FIGS. 39A, 39B and 39C. In this Example illustrated in those FIGS. 39A, 39B and 39C, numeral 3801 indicates the source wiring for the switching TFT 3802; numeral 3803 indicates the gate wiring for the switching TFT 3802; numeral 3804 indicates a current-control TFT; numeral 3805 indicates a capacitor; numerals 3806 and 3808 indicate current supply lines; and numeral 3807 indicates an EL device.

Figure 39A:
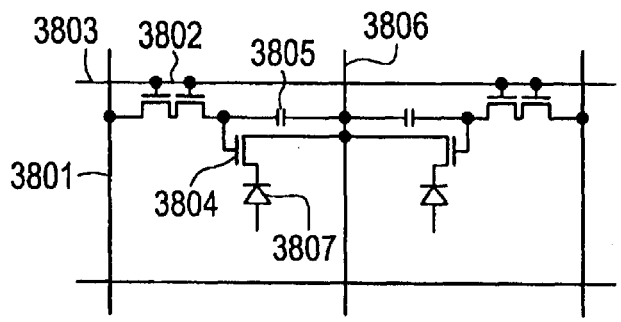
FIGS. 39A to 39C are views showing circuit structures for pixel portions in active matrix type EL display device.

In the example of FIG. 39A, the current supply line 3806 is common to the two pixels. Specifically, this Example is characterized in that two pixels are lineal-symmetrically formed with the current supply line 3806 being the center between them. Since the number of current supply lines can be reduced therein, this Example is advantageous in that the pixel portion can be much finer and thinner.

In the example of FIG. 38B, the current supply line 3808 is formed in parallel to the gate wiring 3803. Specifically, in this, the current supply line 3808 is so constructed that it does not overlap with the gate wiring 3803, but is not limitative. Being different from the illustrated case, the two may overlap with each other via an insulating film therebetween so far as they are of different layers. Since the current supply line 3808 and the gate wiring 3803 may enjoy the common exclusive area therein, this example is advantageous in that the pixel pattern can be much finer and thinner.

Figure 39B:
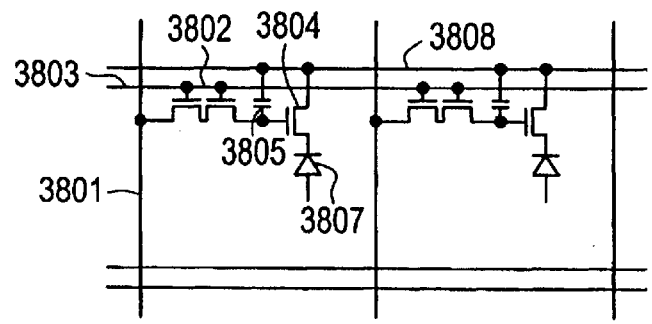
Figure 39C:
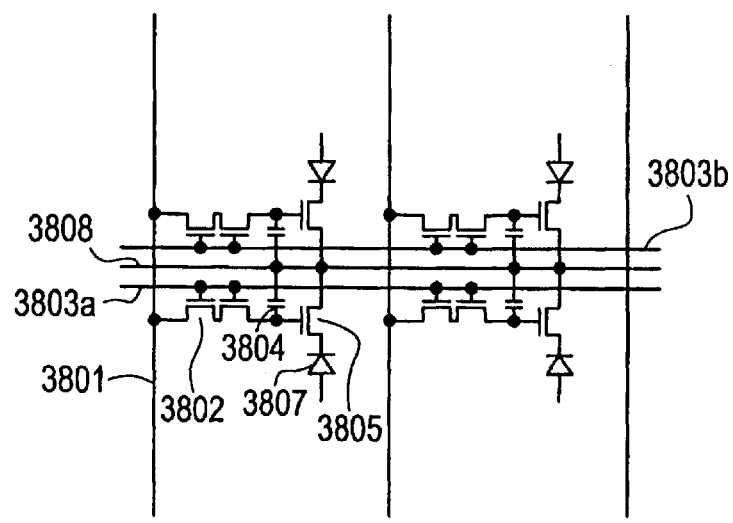

The structure of this example of FIG. 39C is characterized in that the current supply line 3808 is formed in parallel to the gate wirings 3803a, 3803b, like in FIG. 39B, and that two pixels are lineal-symmetrically formed with the current supply line 3808 being the center between them. In this, it is also effective to provide the current supply line 3808 in such a manner that it overlaps with any one of the gate wirings 3803a, 3803b. Since the number of current supply lines can be reduced therein, this example is advantageous in that the pixel pattern can be much finer and thinner.

The constitution of the Example 33 can be combined with any constitution of Examples 29 and 30 in any desired manner. Incorporating the EL display panel having the pixel structure of this Example into the electronic equipments of Example 27 as its display portion is advantageous.

EXAMPLE 34

The Example 31 illustrated in FIGS. 37A and 37B is provided with the capacitor 3504 which acts to retain the voltage applied to the gate in the current-control TFT 3503. In the Example 34, however, the capacitor 3504 may be omitted.

In the Example 31, the current-control TFT 3503 is NTFT of the present invention; therefore, the first impurity region (first LDD region) is so formed that it overlaps with the side wall comprising silicon via the gate insulating film therebetween. In the overlapped region, formed is a parasitic capacitance generally referred to as a gate capacitance. This Example is characterized in that the parasitic capacitance is positively utilized in place of the capacitor 3504.

The parasitic capacitance varies, depending on the area in which the gate electrode overlaps with the first impurity region (first LDD region). Therefore, the parasitic capacitance is determined according to the length of the first impurity region (first LDD region) in the overlapped region.

Also in the Example 33 illustrated in FIGS. 39A, 39B and 39C, the capacitor 3805 can be omitted.

The constitution of the Example 34 can be combined with any constitution of Examples 29–33 in any desired manner. Incorporating the EL display panel having the pixel structure of this Example 34 into the electronic appliance of Example 27 as its display device is advantageous.

By practicing this invention, reliability of NTFT can be improved. Accordingly, it is possible to ensure the reliability of NTFT having high electrical characteristics (particularly, high mobility) to which stringent reliability is required. At the same time, a semiconductor circuit of high reliability and showing excellent electrical characteristics could be formed by forming a CMOS circuit in the combination of NTFT and PTFT of excellent balance of characteristics.

Furthermore, since the catalyst element used for the crystallization of the semiconductor can be reduced in this invention, a semiconductor device with less unstable factors can be realized. In addition, since the step of reducing the catalyst element is conducted simultaneously with the formation and the activation of the source region and the drain region, this does not lower the throughput.

Further, it is also possible to ensure the reliability for all semiconductor devices including the electro-optical devices, semiconductor substrate and, further, electronic equipments by improving the reliability of circuits set-up with TFTs.

What is claimed is:

1. A semiconductor device including a CMOS circuit having an NTFT and a PTFT, each of the NTFT and the PTFT including an active layer, an insulation film in contact with the active layer, and a wiring in contact with the insulation film, wherein
   only the NTFT includes a side wall spacer on a side of the wiring,
   the active layer of the NTFT includes a channel forming region and at least three kinds of impurity regions each containing an element belonging to the group 15 at a different concentration,
   the impurity region in contact with the channel forming region among the three kinds of impurity regions overlaps by way of the insulation film with the side wall,
   the active layer of the PTFT includes a channel forming region and two kinds of impurity regions each containing an element belonging to the group 13 at an identical concentration, and
   an element used for crystallization of the active layer of the NTFT and the active layer of the PTFT is present at a concentration of $1\times10^{17}$ to $1\times10^{20}$ atoms/cm$^3$ in one of the impurity region most remote from the channel forming region of the NTFT and in one of the impurity region most remote from the channel forming region of the PTFT.

2. A semiconductor device having a CMOS circuit having an NTFT and a PTFT, each of the NTFT and the PTFT including an active layer, an insulation film in contact with the active layer and a wiring in contact with the insulation film, wherein
   only the NTFT includes a side wall spacer on a side of the wiring,
   the active layer of the NTFT includes a structure in which a channel forming region, a first impurity region, a second impurity region and a third impurity region are arranged in this order,
   each of the first impurity region, the second impurity region and the third impurity region contains an element belonging to the group 15 at a different concentration, the first impurity region overlaps by way of the insulation film with the side wall,
   the active layer of the PTFT includes a structure in which a channel forming region, a fourth impurity region and a fifth impurity region are arranged in this order,
   each of the fourth impurity region and the fifth impurity region contains an element belonging to the group 13 at an identical concentration and
   an element used for the crystallization of the active layer is present at a concentration of $1\times10^{17}$ to $1\times10^{20}$ atoms/cm$^3$ in the third impurity region and the fifth impurity region,.

3. A semiconductor device having a CMOS circuit having an NTFT and a PTFT each of the NTFT and the PTFT including an active layer, an insulation film in contact with the active layer and a wiring in contact with the insulation film, wherein
   only the NTFT includes a side wall spacer on a side of the wiring,
   the active layer of the NTFT includes a channel forming region and at least three kinds of impurity regions each containing an element belonging to the group 15 at a different concentration,
   the concentration of the element belonging to the group 15 is higher as the distance from the channel forming region is greater in at least three kinds of impurity regions,
   the active layer of PTFT includes a channel forming region and two kinds of impurity regions containing an element belonging to the group 13 at an identical concentration, and
   the active layer of PTFT includes a channel forming region and two kinds of impurity regions containing an element belonging to the group 13 at an identical concentration, and in which
   an element used for the crystallization of the active layer is present at a concentration of $1\times10^{17}$ to $1\times10^{20}$ atoms/cm$^3$ in the impurity region most remote from the channel forming region of the NTFT and in the impurity region most remote from the channel forming region of the PTFT.

4. A semiconductor device including a CMOS circuit having an NTFT and a PTFT each of the NTFT and the PTFT including an active layer, an insulation film in contact with the active layer and a wiring in contact with the insulation film, wherein
   only the NTFT includes a side wall spacer on a side of the wiring, the active layer of the NTFT has a structure in which a channel forming region, a first impurity region, a second impurity region and a third impurity region are arranged in this order, each of the first impurity region, the second impurity region and the third impurity region contains identical impurities at a different concentration, the concentration of the impurities is higher in the order of the first impurity region, the second impurity region and the third impurity region, the active layer of the PTFT has a structure in which a channel forming region, a fourth impurity region and a fifth impurity region are arranged in this order, each of the fourth impurity region and the fifth impurity region contains an element belonging to the group 13 at an identical concentration, and an element used for the crystallization of the active layer of the NTFT and the active layer of the PTFT is present at a concentration of $1 \times 10^{17}$ to $1 \times 10^{20}$ atoms/cm$^3$ in the third impurity region and the fifth impurity region.

5. A semiconductor device as claimed in any one of claims 1 to 4, wherein the active layer includes a single crystal semiconductor thin film.

6. A semiconductor device as claimed in any one of claims 1 to 4, wherein the element used for crystallization is at least one selected from Ni, Ge, Co, Fe, Pd, Sn, Pb, Pt, Cu, Au and Si.

7. A semiconductor device as claimed in any one of claims 1 to 4, wherein at least a portion of the wiring is covered with a silicon nitride film.

8. A semiconductor device as claimed in any one of claims 1 to 4, wherein the side wall includes silicon.

9. A semiconductor device as claimed in claim 1 or 3, wherein the element belonging to the group 15 is present in one of the impurity regions of the NTFT and in one of the impurity regions of the PTFT at a concentration identical with each other, the element used for crystallization being present in said one of the impurity regions of the NTFT and in said one of the impurity regions of the PTFT.

10. A semiconductor device as claimed in claim 2 or 4, wherein the element belonging to the group 15 is present in the third impurity region and in the fifth impurity region at a concentration identical with each other.

11. A semiconductor device as claimed in claim 2 or 4, wherein the element belonging to the group 15 is present in the third impurity region and in the fifth impurity region at a concentration identical with each other, and the concentration of the element belonging to the group 15 is lower than the concentration of the element belonging to the group 13 present in the fifth impurity region.

12. A semiconductor device as claimed in claim 2 or 4, wherein the concentration of the impurity contained in the first impurity region is $1 \times 10^{15}$–$1 \times 10^{17}$ atoms/cm$^3$, and the concentration of the impurity contained in the second impurity region is $1 \times 10^{16}$–$1 \times 10^{19}$ atoms/cm$^3$.

13. A semiconductor device as claimed in any one of claims 1 to 4, wherein the semiconductor device is one selected from a liquid crystal display device, an EL display device and an image sensor.

14. A semiconductor device as claimed in any one of claims 1 to 4, wherein the semiconductor device is one selected from a video camera, a digital camera, a projector, a goggle type display, a car navigation device, a personal computer and a portable information terminal.

15. A semiconductor device according to any one of claims 1 to 4 wherein the concentration of the element is not smaller than $1 \times 10^{17}$ atoms/cm$^3$.

16. A semiconductor device comprising:

a semiconductor film formed on an insulating surface;

a channel forming region in the semiconductor film;

a gate insulating film formed on the semiconductor film;

a gate electrode formed over the channel forming region with the gate insulating film interposed therebetween;

a pair of side walls adjacent to side surfaces of the gate electrode;

an insulating film on the gate electrode and the pair of side walls;

a pair of first impurity regions doped with an N-type impurity at a first concentration and formed in the semiconductor film with the channel forming region extending therebetween wherein the pair of side walls overlap only the pair of first impurity regions; and a pair of second impurity regions doped with an N-type impurity at a second concentration greater than the first concentration and formed in the semiconductor film adjacent to the pair of first impurity region; and a pair of third impurity regions doped with an N-type impurity at a third concentration greater than the second concentration and formed in the semiconductor film with the pair of second regions extending between the channel forming region and the pair of third impurity regions, wherein the pair of side walls do not overlap the pair of second impurity regions and third impurity regions.

17. The semiconductor device according to claim 16 wherein the N-type impurity added in the first, second and third impurity regions comprises an element selected from the group 15 elements.

18. The semiconductor device according to claim 16 wherein the N-type impurity added in the first, second and third impurity regions comprises phosphorous.

19. The semiconductor device according to claim 16 wherein the side walls comprise silicon.

20. The semiconductor device according to claim 16 wherein the semiconductor device is one selected from a liquid crystal display device, an EL display device and an image sensor.

21. The semiconductor device according to claim 16 wherein the semiconductor device is one selected from a video camera, a digital camera, a projector, a goggle type display, a car navigation device, a personal computer and a portable information, terminal.

22. A semiconductor device comprising:

a semiconductor film formed on an insulating surface;

a channel forming region in the semiconductor film;

a gate insulating film formed on the semiconductor film;

a gate electrode formed over the channel forming region with the gate insulating film interposed therebetween;

a pair of conductive side walls adjacent to side surfaces of the gate electrode;

an insulating film on the gate electrode and the pair of conductive side walls;

a pair of first impurity regions doped with an N-type impurity at a first concentration and formed in the semiconductor film with the channel forming region extending therebetween wherein the pair of side walls overlap only the pair of first impurity regions; and a pair of second impurity regions doped with an N-type impurity at a second concetration greater than the first concentration and formed in the semiconductor film adjacent to the pair of first impurity regions; and a pair of third impurity regions doped with an N-type impurity at a third concentration greater than the second concentration and formed in the semiconductor film with the pair of second impurity regions extending between the channel forming region and the pair of third impurity region, wherein the pair of side walls do not overlap the pair of second impurity regions and third impurity regions.

23. The semiconductor device according to claim 22 wherein the N-type impurity added in the first, second and third impurity regions comprises an element selected from the group 15 elements.

24. The semiconductor device according to claim 22 wherein the N-type impurity added in the first, second and third impurity regions comprises phosphorous.

25. The semiconductor device according to claim 22 wherein the side walls comprise silicon.

26. The semiconductor device according to claim 22 wherein the semiconductor device is one selected from a liquid crystal display device, an EL display device and an image sensor.

27. The semiconductor device according to claim 22 wherein the semiconductor device is one selected from the a video camera, a digital camera, a projector, a goggle type display, a car navigation device, a personal computer and a portable information terminal.

28. A semiconductor device comprising:
(a) a thin film transistor over a substrate, said thin film transistor comprising:
   a semiconductor film formed on an insulating surface;
   a channel forming region in the semiconductor film;
   a gate insulating film formed on the semiconductor film;
   a gate electrode formed over the channel forming region with the gate insulating film interposed therebetween;
   a pair of side walls adjacent to side surfaces of the gate electrode;
   an insulating film on the gate electrode and the pair of side walls;
   a pair of first impurity regions doped with an N-type impurity at a first concentration and formed in the semiconductor film with the channel forming region extending therebetween wherein the pair of side walls overlap only the pair of first impurity regions; and
   a pair of second impurity regions doped with an N-type impurity at a second concentration greater than the first concentration and formed in the semiconductor film adjacent to the pair of first impurity regions; and
   a pair of third impurity regions doped with an N-type impurity at a third concentration greater than the second concentration and formed in the semiconductor film with the pair of second impurity regions extending between the channel forming region and the pair of third impurity regions, wherein the pair of side walls do not overlap the pair of second impurity regions and third impurity regions;
(b) an interlayer insulating film formed over the thin film transistor; and
(c) a pixel electrode formed over the interlayer insulating film and electrically connected to one of the third impurity regions.

29. The semiconductor device according to claim 28 wherein the N-type impurity added in the first, second and third impurity regions comprises an element selected from the group 15 elements.

30. The semiconductor device according to claim 28 wherein the N-type impurity added in the first, second and third impurity regions comprises phosphorous.

31. The semiconductor device according to claim 28 wherein the side walls comprise silicon.

32. The semiconductor device according to claim 28 wherein the semiconductor device is one selected from a liquid crystal display device, an EL display device and an image sensor.

33. The semiconductor device according to claim 28 wherein the semiconductor device is one selected from a video camera, a digital camera, a projector, a goggle type display, a car navigation device, a personal computer and a portable information terminal.

34. A semiconductor device comprising:
(a) a thin film transistor formed over a substrate, said thin film transistor comprising:
   a semiconductor film formed on an insulating surface;
   a channel forming region in the semiconductor film;
   a gate insulating film formed on the semiconductor film;
   a gate electrode formed over the channel forming region with the gate insulating film interposed therebetween;
   a pair of side walls adjacent to side surfaces of the gate electrode;
   an insulating film on the gate electrode and the pair of side walls;
   a pair of first impurity regions doped with an N-type impurity at a first concentration and formed in the semiconductor film with the channel forming region extending therebetween wherein the pair of side walls overlap only the pair of first impurity regions; and
   a pair of second impurity regions doped with an N-type impurity at a second concentration greater than the first concentration and formed in the semiconductor film adjacent to the pair of first impurity regions; and
   a pair of third impurity regions doped with an N-type impurity at a third concentration greater than the second concentration and formed in the semiconductor film with the pair of second impurity regions extending between the channel forming region and the pair of third impurity regions, wherein the pair of side walls do not overlap the pair of second impurity regions and third impurity regions;
(b) an interlayer insulating film formed over the thin film transistor; and
(c) a pixel electrode formed over the interlayer insulating film and electrically connected to one of the third impurity regions.

35. The semiconductor device according to claim 34 wherein the N-type impurity added in the first, second and third impurity regions comprises an element selected from the group 15 elements.

36. The semiconductor device according to claim 34 wherein the N-type impurity added in the first, second and thrid impurity regions comprises phosphorous.

37. The semiconductor device according to claim 34 wherein the side walls comprise silicon.

38. The semiconductor device according to claim 34 wherein the semiconductor device is one selected from a liquid crystal display device, and EL display device and an image sensor.

39. The semiconductor device according to claim 34 wherein the semiconductor device is one selected from a video camera, a digital camera, a projector, a goggle type display, a car navigation device, a personal computer and a portable information terminal.

40. A semiconductor device comprising:
a semiconductor film formed on an insulating surface;
a channel forming region in the semiconductor film;
a gate insulating film formed on the semiconductor film;
a gate electrode formed over the channel forming region with the gate insulating film interposed therebetween;
a second insulating film in contact with an upper surface and side surfaces of the gate electrode;
a pair of side walls adjacent to the side surfaces of the gate electrode with the second insulating film interposed therebetween;
a pair of first impurity regions doped with an N-type impurity at a first concentration and formed in the semiconductor film with the channel forming region extending therebetween wherein the pair of side walls overlap only the pair of first impurity regions;
a pair of second impurity regions doped in an N-type impurity at a second concentration greater than the first concentration and formed in the semiconductor film adjacent to the pair of first impurity regions; and
a pair of third impurity regions doped with an N-type impurity at a third concentration greater than the second concentration and formed in the semiconductor film with the pair of second impurity regions extending between the channel forming region and the pair of third impurity regions, wherein the pair of side walls do not overlap the pair of second impurity regions and third impurity regions.

41. The semiconductor device according to claim 40 wherein the N-type impurity added in the first, second and third impurity regions comprises an element selected from the group 15 elements.

42. The semiconductor device according to claim 40 wherein the N-type impurity added in the first, second and third impurity regions comprises phosphorous.

43. The semiconductor device according to claim 40 wherein the side walls comprise silicon.

44. The semiconductor device according to claim 40 wherein the semiconductor device is one selected from a liquid crystal display device, an EL display device and an image sensor.

45. The semiconductor device according to claim 40 wherein the semiconductor device is one selected from a video, a digital camera, a projector, a goggle type display, a car navigation device, a personal computer and a portable information terminal.

46. A semiconductor device comprising:
(a) a thin film transistor over a substrate, said thin film transistor comprising:
a semiconductor film formed on an insulating surface;
a channel forming region in the semiconductor film;
a gate insulating film formed on the semiconductor film;
a gate electrode formed over the channel forming region with the gate insulating film interposed therebetween;
a second insulating film in contact with an upper surface and side surfaces of the gate electrode;
a pair of side walls adjacent to side surfaces of the gate electrode with the second insulating film interposed therebetween;
a pair of first impurity regions doped with an N-type impurity at a first concentration and formed in the semiconductor film with the channel forming region extending therebetween wherein the pair of side walls overlap only the pair of first impurity regions; and
a pair of second impurity regions doped with an N-type impurity at a second concentration greater than the first concentration and formed in the semiconductor film adjacent to the pair of first impurity regions; and
a pair of third impurity regions doped with an N-type impurity at a third concentration greater than the second concentration and formed in the semiconductor film with the pair of second impurity regions extending between the channel forming region and the pair of third impurity regions, wherein the pair of side walls do not overlap the pair of second impurity regions and third impurity regions;
(b) an interlayer insulating film formed over the thin film transistor; and
(c) a pixel electrode formed over the interlayer insulating film and electrically connected to one of the third impurity regions.

47. The semiconductor device according to claim 46 wherein the N-type impurity added in the first, second and third impurity regions comprises an element selected from the group 15 elements.

48. The semiconductor device according to claim 46 wherein the N-type impurity added in the first, second and third impurity regions comprises phosphorous.

49. The semiconductor device according to claim 46 wherein the side walls comprise silicon.

50. The semiconductor device according to claim 46 wherein the semiconductor device is one selected from a liquid crystal display device, an EL display device and an image sensor.

51. The semiconductor device according to claim 46 wherein the semiconductor device is one selected from a video camera, a digital camera, a projector, a goggle type display, a car navigation device, a personal computer and a portable information terminal.

52. A semiconductor device comprising a CMOS circuit comprising:
an NTFT having:
a first semiconductor film formed on an insulating surface;
a first channel forming region in the first semiconductor film;
a first gate insulating film formed on the first semiconductor film;
a first gate electrode formed over the first channel forming region with the first gate insulating film interposed therebetween;
a pair of side walls adjacent to side surfaces of the first gate electrode;
a second insulating film on the first gate electrode and the pair of side walls; and
a PTFT having:
a second semiconductor film formed on an insulating surface;
a second channel forming region in the second semiconductor film;
a third gate insulating formed on the second semiconductor film;
a second gate electrode formed over the second channel forming region with the third gate insulating film interposed therebetween;

wherein a pair of first impurity regions doped with an N-type impurity at a first concentration and formed in the first semiconductor film with the first channel forming region extending therebetween wherein the pair of side walls overlap only the pair of first impurity regions;

wherein a pair of second impurity regions doped with an N-type impurity at a second concentration greater than the first concentration and formed in the first semiconductor film adjacent to the pair of first impurity regions; and wherein a pair of third impurity regions doped with an N-type impurity at a third concentration greater than the second concentration and formed in the first semiconductor film with the pair of second impurity regions extending between the first channel forming region and the pair of third impurity regions, wherein the pair of side walls do not overlap the pair of second impurity regions and third impurity regions.

53. The semiconductor device according to claim 52 wherein the N-type impurity added in the first, second and third impurity regions comprises an element selected from the group 15 elements.

54. The semiconductor device according to claim 52 wherein the N-type impurity added in the first, second and third impurity regions comprises phosphorous.

55. The semiconductor device according to claim 52 wherein the side walls comprise silicon.

56. The semiconductor device according to claim 52 wherein the semiconductor device is one selected from a liquid crystal display device, an EL display device and an image sensor.

57. The semiconductor device according to claim 52 wherein the semiconductor device is one selected from a video camera, a digital camera, a projector, a goggle type display, a car navigation device, a personal computer and a portable information terminal.

58. A semiconductor device comprising a CMOS circuit comprising:
    an NTFT having:
    a first semiconductor film formed on an insulating surface;
    a first channel forming region in the first semiconductor film;
    a first gate insulating film formed on the first semiconductor film;
    a first gate electrode formed over the first channel forming region with the first gate insulating film interposed therebetween;
    a second insulating film in contact with an upper surface and side surfaces of the first gate electrode;
    a pair of side walls adjacent to side surfaces of the first gate electrode with the second insulating film interposed therebetween; and
    a PTFT having:
    a second semiconductor film formed on an insulating surface;
    a second channel forming region in the second semiconductor film;
    a third gate insulating formed on the second semiconductor film;
    a second gate electrode formed over the second channel forming region with the third gate insulating film interposed therebetween;

wherein a pair of first impurity regions doped with an N-type impurity at a first concentration and formed in the first semiconductor film with the first channel forming region extending therebetween wherein the pair of side walls overlap only the pair of first impurity regions;

wherein a pair of second impurity regions doped with an N-type impurity at a second concentration greater than the first concentration and formed in the first semiconductor film adjacent to the pair of first impurity regions; and wherein a pair of third impurity regions doped with an N-type impurity at a third concentration greater than the second concentration and formed in the first semiconductor film with the pair of second impurity regions extending between the first channel forming region and the pair of third impurity regions, wherein the pair of side walls do not overlap the pair of second impurity regions and third impurity regions.

59. The semiconductor device according to claim 58 wherein the N-type impurity added in the first, second and third impurity regions comprises an element selected from the group 15 elements.

60. The semiconductor device according to claim 58 wherein the N-type impurity added in the first, second and third impurity regions comprises phosphorous.

61. The semiconductor device according to claim 58 wherein the side walls comprise silicon.

62. The semiconductor device according to claim 58 wherein the semiconductor device is one selected from a liquid crystal display device, an EL display device and an image sensor.

63. The semiconductor device according to claim 58 wherein the semiconductor device is one selected from a video camera, a digital camera, a projector, a goggle type display, a car navigation device, a personal computer and a portable information terminal.

* * * * *